United States Patent [19]

Ohsawa

[11] Patent Number: 5,970,016
[45] Date of Patent: Oct. 19, 1999

[54] DYNAMIC SEMICONDUCTOR MEMORY DEVICE WITH BANKS CAPABLE OF OPERATING INDEPENDENTLY

[75] Inventor: Takashi Ohsawa, Yokohama, Japan

[73] Assignee: Kabushiki Kaisha Toshiba, Kawasaki, Japan

[21] Appl. No.: 09/122,895

[22] Filed: Jul. 28, 1998

[30] Foreign Application Priority Data

Jul. 29, 1997 [JP] Japan ..................................... 9-203259

[51] Int. Cl.$^6$ ....................................................... G11C 8/00
[52] U.S. Cl. ............................... 365/230.03; 365/230.06; 365/230.08; 365/189.05
[58] Field of Search .................... 365/230.03, 230.06, 365/233, 4, 11, 196, 185.23, 189.01, 189.08, 189.02, 207, 230.08

[56] References Cited

U.S. PATENT DOCUMENTS 5,671,188  9/1997  Patel et al. ............................. 365/205
5,838,603  11/1998  Mori et al. ................................ 365/63

*Primary Examiner*—David Nelms
*Assistant Examiner*—Thong Le
*Attorney, Agent, or Firm*—Banner & Witcoff, Ltd.

[57] ABSTRACT

Memory cell arrays are arranged on a chip. Each memory cell array has banks. Each bank has cell array blocks. A decoder section is concentrated in the middle of the chip. The decoder section has a row decoder, a word line drive circuit decoder for selecting a word line drive circuit, a sense amplifier decoder for selecting a sense amplifier, and an equalize signal decoder for selectively supplying an equalize signal. Each of these decoders outputs a select signal. The individual banks share the decoder section. Each bank has a latch circuit for latching a select signal in pulse form supplied from the decoder section and controls the memory blocks according to each select signal latched in the latch circuit. A shared sense amplifier is provided between memory blocks in each bank. A redundancy cell array is provided for each bank.

26 Claims, 31 Drawing Sheets

DYNAMIC SEMICONDUCTOR MEMORY DEVICE WITH BANKS CAPABLE OF OPERATING INDEPENDENTLY

BACKGROUND OF THE INVENTION

This invention relates to a dynamic semiconductor memory device with banks capable of operating independently which is applied to high-speed data transfer DRAMs (dynamic random access memories), such as synchronous DRAMs, Rambus DRAMs, and SynchLink DRAMs, which have appeared after 64-Mbit DRAMs.

It was the 16-Mbit synchronous DRAM that first used the concept of bank. FIG. 42 shows a conventional synchronous DRAM. In the synchronous DRAM, two large memory cell arrays M0, M1 are provided in a chip CP. These memory cell arrays M0, M1 are used as bank BK0, BK1 respectively. In the middle of each of the memory cell arrays M0, M1, a shared row decoder (SRDC) and a word line drive circuit (WLD) are provided. On both sides of the shared row decoder and word line drive circuit, memory blocks MBLKs are provided. Shared sense amplifiers (SS/A) shared by adjacent memory blocks are provided between the memory blocks MBLKs. Each of the memory cell arrays M0, M1 is provided with a column decoder (CDC). A peripheral circuit is provided between the column decoders. In the case of such a configuration, it is relatively easy to arrange the individual circuits. In the figures that follow, the same parts as those in FIG. 42 are indicated by the same reference symbols.

FIG. 43 shows the bank structure of a 64-Mbit synchronous DRAM. The DRAM has four banks, BK0, BK1, BK2, and BK3. In the structure, an area in which memory cell arrays are arranged in a chip is divided into four pieces. A bank is set for each area. Therefore, banks can be allocated readily to the individual memory cell arrays.

FIG. 44 shows the bank structure of a 256-Mbit synchronous DRAM. In the DRAM, a structure of eight banks, larger than the number of divisions of memory cell array, is considered to be standard. The allocation of pins is standardized as shown in FIG. 45. A set of eight I/O pins for inputting and outputting data is arranged on each side of one longitudinal end of the package and another set of eight I/O pins is arranged on each side of the other longitudinal end of the package; and a set of pins for inputting commands, including a row and address strobe signal /RAS, a column address strobe signal /CAS, and a write enable signal /WE, and address signals Add is arranged on each side of the middle of the package. In the layout, banks of the same structure are allocated symmetrically with respect to the center line of the chip.

Specifically, in FIG. 44, an area in which memory cell arrays are arranged is divided in two equal parts. In the middle of the chip CP, a peripheral circuit 341 is provided longitudinally. In the area above the peripheral circuit 341, bank BK0 to bank BK7 are arranged in that order from left to right. In the area below the peripheral circuit 341, bank BK0 to bank BK7 are arranged in that order from right to left. With this structure, because memory blocks of the same banks are not arranged adjacently along the peripheral circuit 341, shared row decoders cannot be used. To access each bank independently, a row decoder RDC and a word line drive circuit (not shown) are provided on each side of each bank. This causes a problem: two row decoders and two word line drive circuits must be provided for adjacent banks, which requires a large area for their arrangement.

FIG. 46 shows the bank structure of a synchronous DRAM. As shown in FIG. 46, a method of allocating banks in the direction in which sense amplifiers are provided has been considered. With this structure, because memory blocks of the same banks are arranged adjacently along the peripheral circuit 341, shared row decoders SRDC can be used. At the boundaries of banks, however, shared row decoders SRDC cannot be used, two sense amplifiers S/A used for each bank must be provided at the boundaries (represented by bold lines) of the banks. As a result, a large area for providing sense amplifiers at the boundaries of the banks is needed, which makes the chip size larger in the direction in which banks are arranged.

When banks are allocated as shown in FIG. 46, a disadvantage results in that the efficiency of remedying defective rows by a flexible redundancy method decreases. The flexible redundancy method is a method of providing redundancy word lines for cell arrays.

FIG. 47A shows the flexible redundancy method applied to cell arrays to which conventional banks have not been allocated. The memory cell array represents a 16-Mbit memory cell array in which sixteen 1-Mbit cell arrays CAs are arranged. Shared sense amplifiers SS/As are provided between cell arrays CAs. Near a column decoder CDC, a redundancy cell array R/D with redundancy word lines is provided exclusively for redundancy. The redundancy cell array R/D has a capacity of, for example, about 128 Kbits. A sense amplifier S/A is provided on each side of the redundancy cell array R/D.

As described above, because one redundancy cell array R/D is provided for 16 cell arrays CAs, even if any one of the 16 cell arrays has a defective word line, the defective word line can be replaced with a redundancy word line in the redundancy cell array R/D. When such a flexible redundancy method is compared with a method of providing a redundancy word line for every 1 Mbits, the flexible redundancy method has an improved efficiency of remedying defective word lines as compared with the latter method, provided that the total number of redundancy word lines in the former method is the same as that of the latter method. For example, the total number of redundancy word lines in a case where a single redundancy word line is provided for every 1 Mbits is equal to that in a case where 16 word lines are provided for a total of 16 Mbits. When a single redundancy word line is provided for every 1 Mbits, however, if more than one failure occurs in a set of 1 Mbits, they cannot be remedied, whereas when 16 word lines are provided for a total of 16 Mbits, they can be remedied.

When banks are arranged as shown in FIG. 46, a redundancy cell array R/D must be provided for each bank to enable each bank to operate independently. Specifically, when the flexible redundancy method is applied to the structure of FIG. 46, four redundancy cell arrays R/Ds corresponding to the individual banks must be provided for the 16 cell arrays that are selected by a single column decoder, as shown in FIG. 47B. With this structure, because a sense amplifier is provided on each side of each redundancy cell array R/D, even when the total number of redundancy word lines is the same as that in FIG. 47A, the area for sense amplifiers can increase, resulting in an increase in the chip size.

As described above, when the number of banks provided in a chip is larger than the number of divisions of memory cell arrays, it is expected that it will be difficult to use shared row decoders, shared sense amplifiers, and flexible redundancy method effectively and therefore the chip size will increase.

BRIEF SUMMARY OF THE INVENTION

The object of the present invention is to provide a dynamic semiconductor memory device capable of suppressing an increase in the chip size even when the number of banks provided in a chip is larger than the number of divisions of memory cell arrays.

The foregoing object is accomplished by providing a dynamic semiconductor memory device comprising: cell arrays which have banks and are arranged in a semiconductor chip in the direction in which banks are arranged; decoder sections which are provided between the cell arrays, are shared by the banks, and output pulse-like select signals for selecting a word line in each of the banks according to a row address; latch circuits which are provided between the banks and latch the select signals from the decoder sections according to a bank activate signal for activating each bank; and word line drive circuits which are provided between the banks and drive word lines in each bank according to the select signals latched in the latch circuits.

Further, the present invention provides a dynamic semiconductor memory device comprising: cell arrays which have banks and are arranged in a semiconductor chip in the direction in which the banks are arranged; memory blocks which are provided in each of the banks and arranged in the direction perpendicular to the direction in which banks are arranged; sense amplifiers which are provided between adjacent memory blocks and are shared by the adjacent memory blocks that sense the signals read from the memory blocks; transistor pairs for connecting the sense amplifiers to the bit line pairs of the memory blocks; equalize circuits for equalizing the potential of the bit line pairs; decoder sections which are provided between the cell arrays and shared by the banks that output pulse-like select signals for activating the transistor pairs and equalize circuits according to a row address; latch circuits which are provided between the banks and latch the select signals outputted from the row decoders according to a bank activate signal for activating each bank; and drive circuits which are provided between the banks and drive the transistor pairs and equalize circuits according to the select signals latched in the latch circuits.

According to the present invention, it is possible to provide a dynamic semiconductor memory device capable of suppressing an increase in the chip size even when the number of banks provided in a chip is larger than the number of divisions of memory cell arrays.

The row decoder, word line drive circuit decoder, sense amplifier decoder, and equalize signal decoder, which were all provided for each bank in the prior art, are concentrated in the decoder section in the middle of the chip and the decoder section is shared by the individual banks. This eliminates the necessity of arranging decoders between the banks, reducing the area occupied by the decoders, which makes the chip size smaller.

Because a shared sense amplifier system can be used in a multi-bank DRAM, the chip size can be made smaller.

Furthermore, because the select signal outputted from the decoder section and supplied to each bank is a pulse signal of the power supply level, not only a reduction in the power consumption but also a high-speed operation can be achieved.

Since in each bank, a latch circuit for latching the pulse signal is provided and the operation of each circuit is controlled by the output signal of the latch circuit, reliable operation can be obtained.

Moreover, because a redundancy cell array R/D is provided bank by bank, flexible redundancy can be achieved in the multi-bank structure.

When the address comparison circuit has compared the defective address stored in the defective address storage section with the inputted row address and they have coincided with each other, a redundancy array is selected and the bank is made inactive to inhibit the memory cell blocks from being selected. Therefore, even with a structure where the row decoder section is provided away from each bank, the defective row can be replaced reliably with a redundancy row without increasing the chip size.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

Hereinafter, referring to the accompanying drawings, embodiments of the present invention will be explained.

Figure 1:
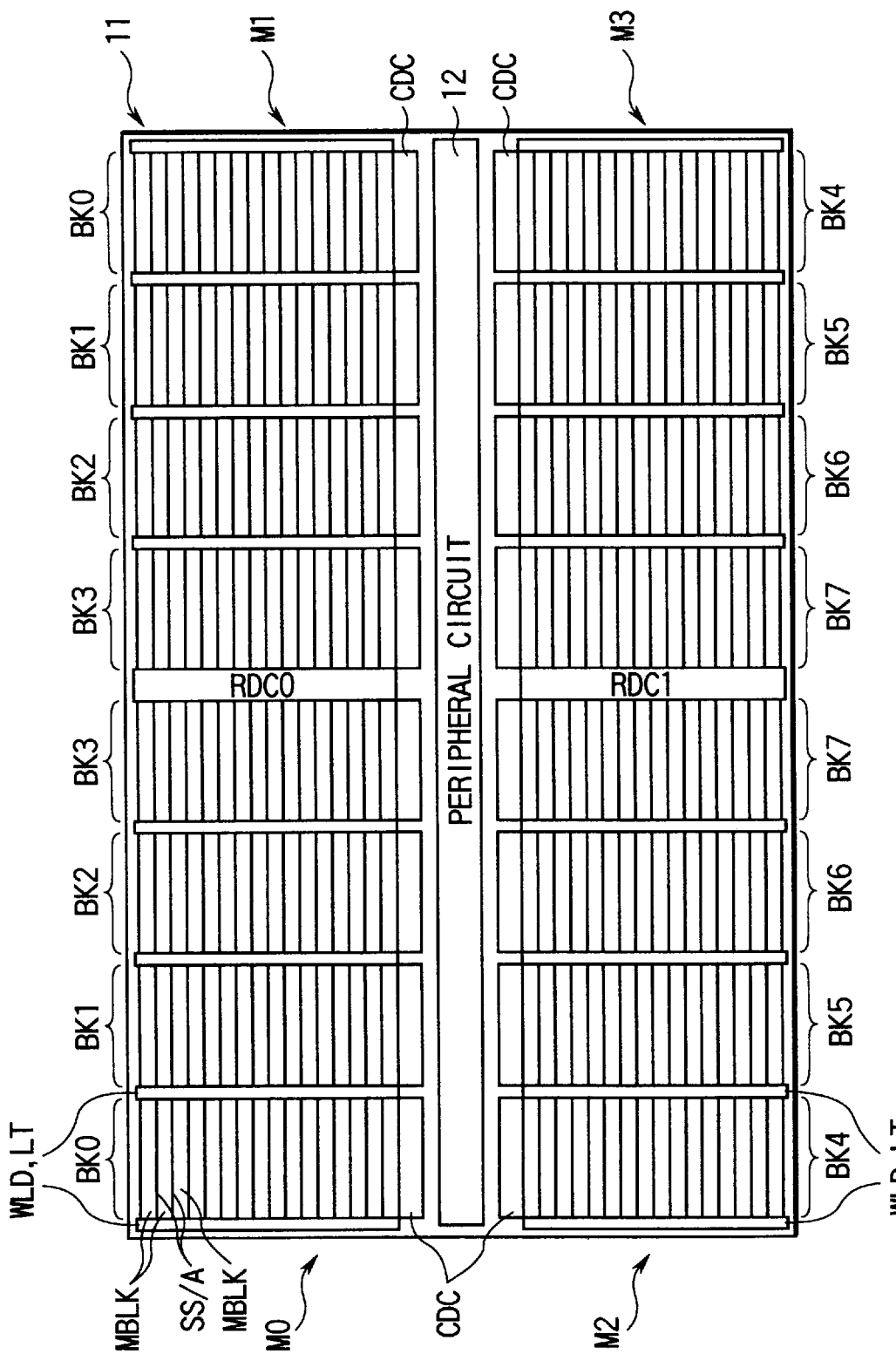
FIG. 1 is a plan view of the layout of a semiconductor chip according to a first embodiment of the present invention.
Figure 44:
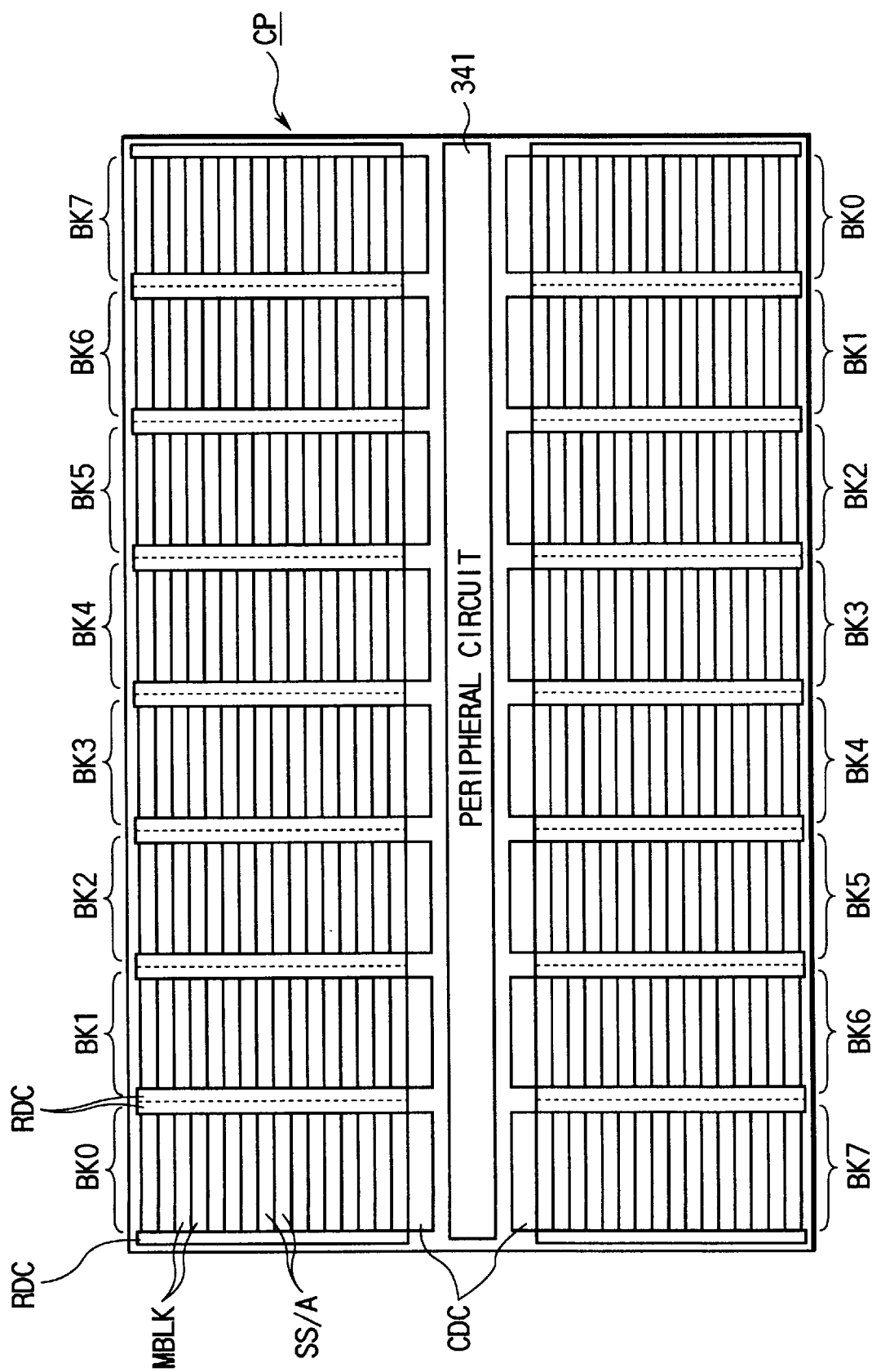
FIG. 44 is a schematic plan view of the bank structure of a synchronous DRAM related to the present invention.
Figure 46:
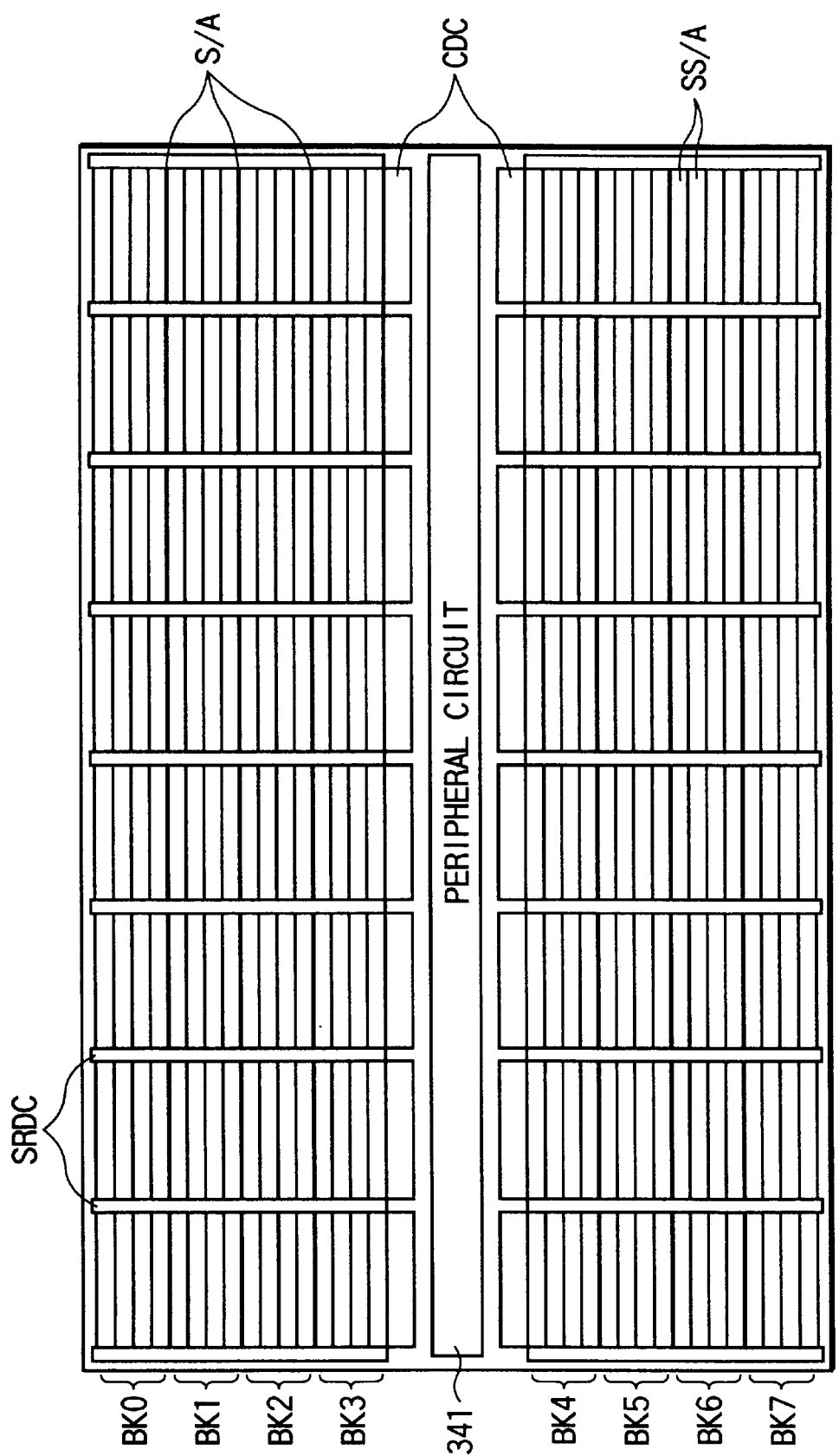
FIG. 46 is a schematic plan view of the bank structure of a synchronous DRAM related to the present invention.
Figure 47B:
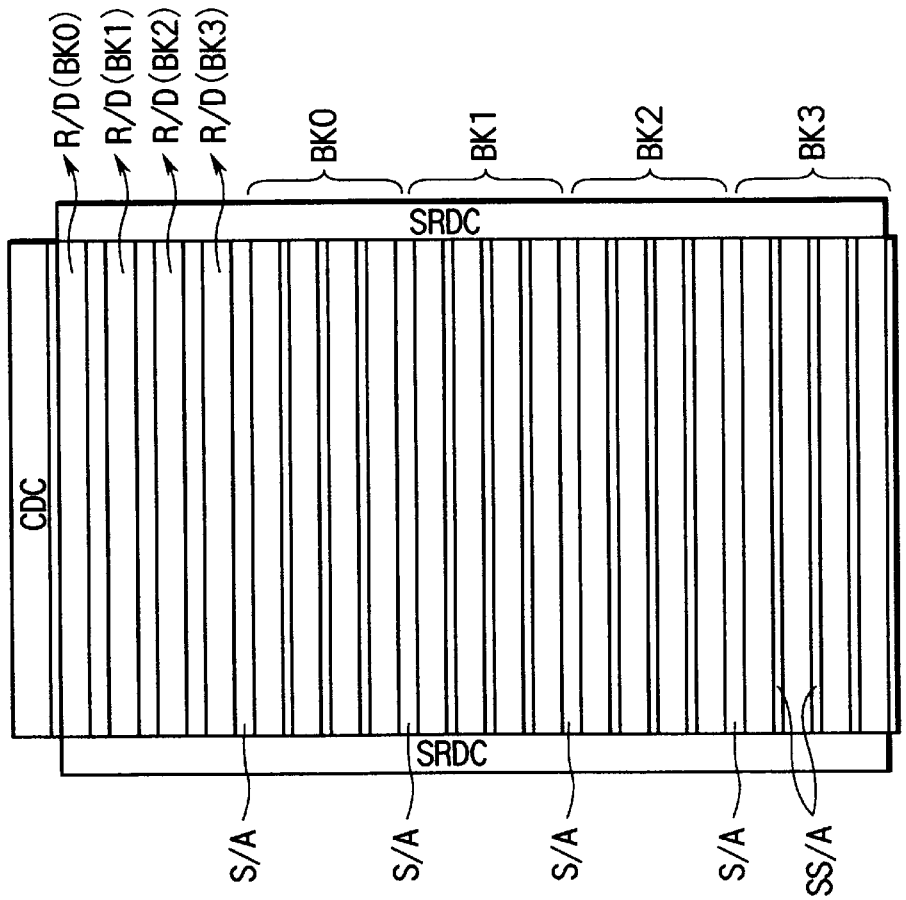
FIGS. 47A and 47B are diagrams to help explain a flexible redundancy method.
Figure 47A:
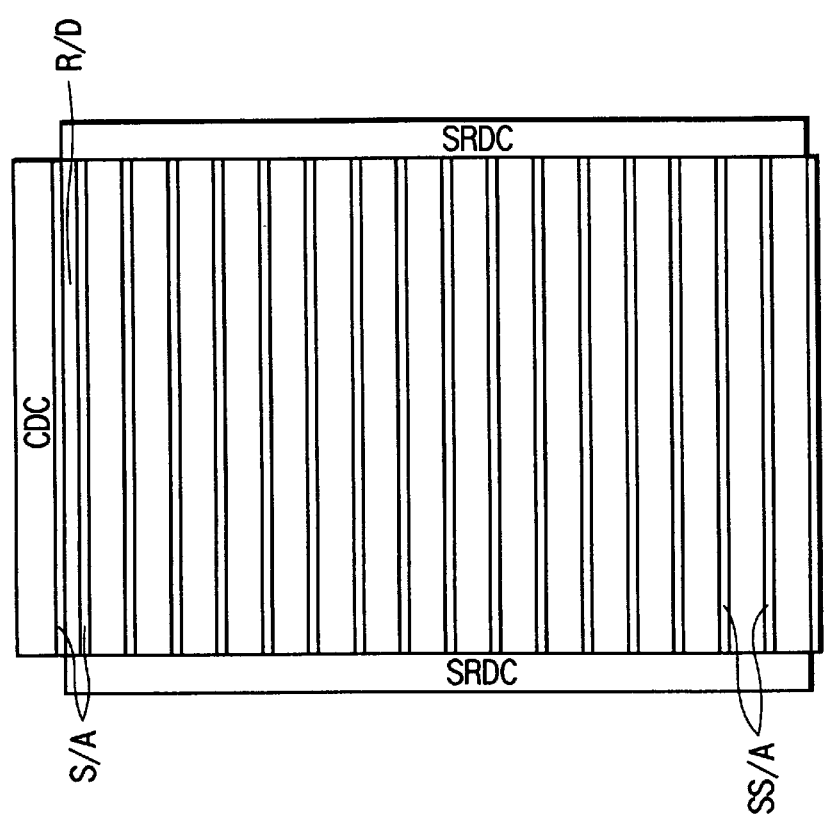

FIG. 1 schematically shows the layout of a semiconductor chip according to a first embodiment of the present invention. In the first embodiment, banks are allocated in the row direction in the memory cell array, as in the structure of FIG. 44. In this case, if banks are simply allocated, a row decoder cannot be shared by more than one bank and a row decoder has to be provided at each end of each bank, leading to an increase in the chip size. In the present invention, to overcome this problem, a decode section including a row decoder is separated from a word line drive circuit. The row decoder is provided in the middle of the chip and the word line drive circuit is provided on each side of each bank.

Specifically, in FIG. 1, four cell arrays M0, M1, M2, M3 are provided in a chip 11. Four banks are allocated to each of the cell arrays M0 to M3. For example, cell array M0 is allocated bank BK0 to bank BK3 from left to right in the figure and cell array M1 is allocated bank BK0 to bank BK3 from right to left. Cell array M2 is allocated bank BK4 to bank BK7 from left to right and cell array M3 is allocated bank BK4 to bank BK7 from right to left. A column decoder CDC is provided at the chip-middle-side end of each bank. A peripheral circuit 12 is provided between the column decoders CDC for the banks BK0 to BK3 and those for the banks BK4 to BK7.

Row decoder sections RDC0, RDC1 are provided between cell array M0 and cell array M1 and between cell array M2 and cell array M3, respectively. The row decoder section RDC0 is shared by the banks BK0 to BK3 in the cell arrays M0, M1 and the row decoder section RDC1 is shared by the banks BK4 to BK7 in the cell arrays M2, M3. Each of the row decoder sections RDC0, RDC1 has only a decode section. A word line drive circuit WLD is provided on each side of each bank. The word line drive circuits WLD have latch circuits LT for holding the signals outputted from the row decoder sections RDC0, RDC1 as described later.

Each bank includes, for example, 16 memory blocks MBLK and a redundancy cell array (not shown in FIG. 1). Shared sense amplifiers SS/As are provided between the memory blocks MBLK in such a manner that one shared sense amplifier is shared by adjacent memory blocks.

The peripheral circuit 12 includes an address buffer circuit, a bank activate signal generator circuit for generating a bank activate signal, a bank precharge signal generator circuit for generating a bank precharge signal, and a controller for controlling the operation of the DRAM.

Figure 2:
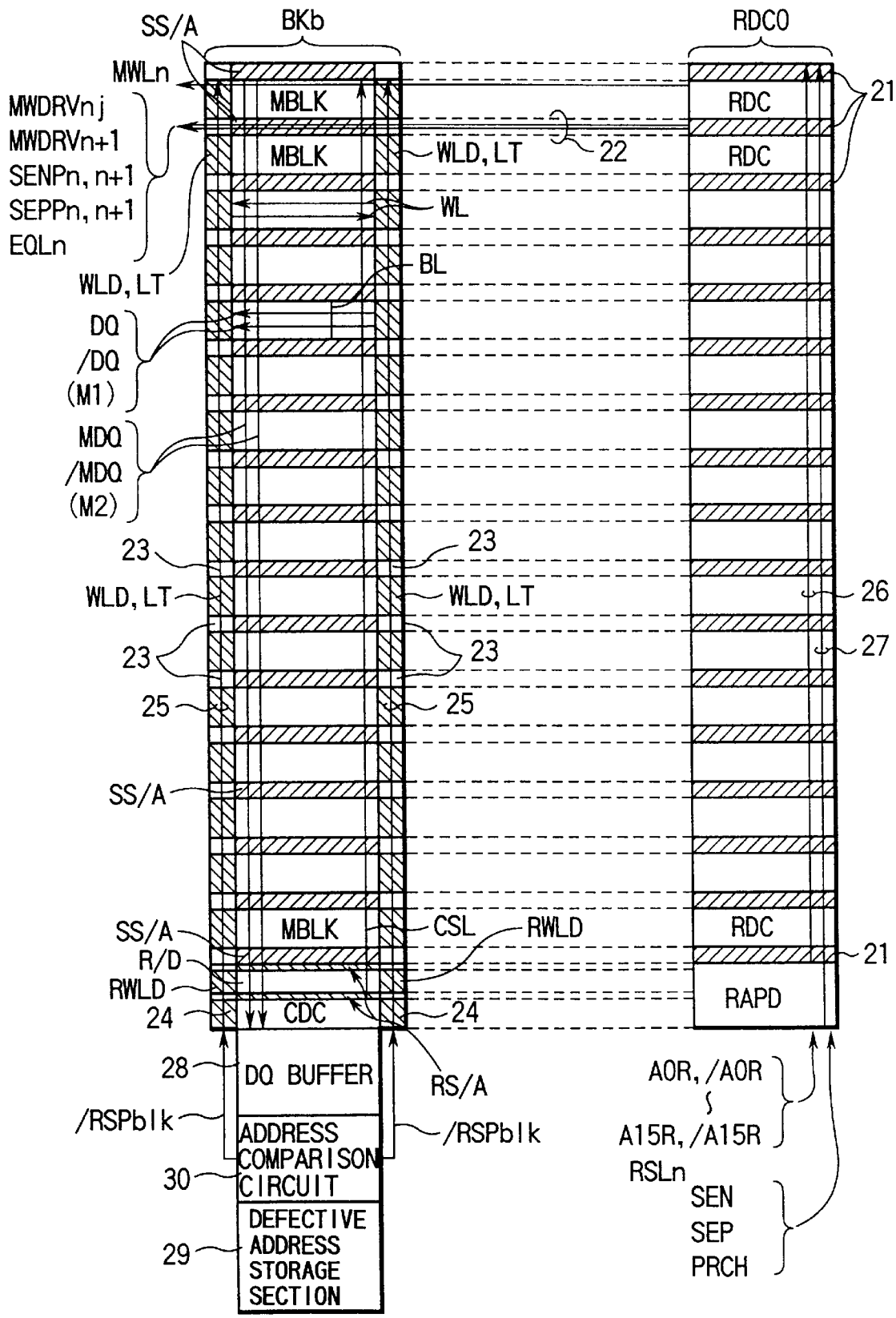
FIG. 2 shows the principal portion of FIG. 1, particularly the structure of the bank and row decoder sections.
Figure 3:
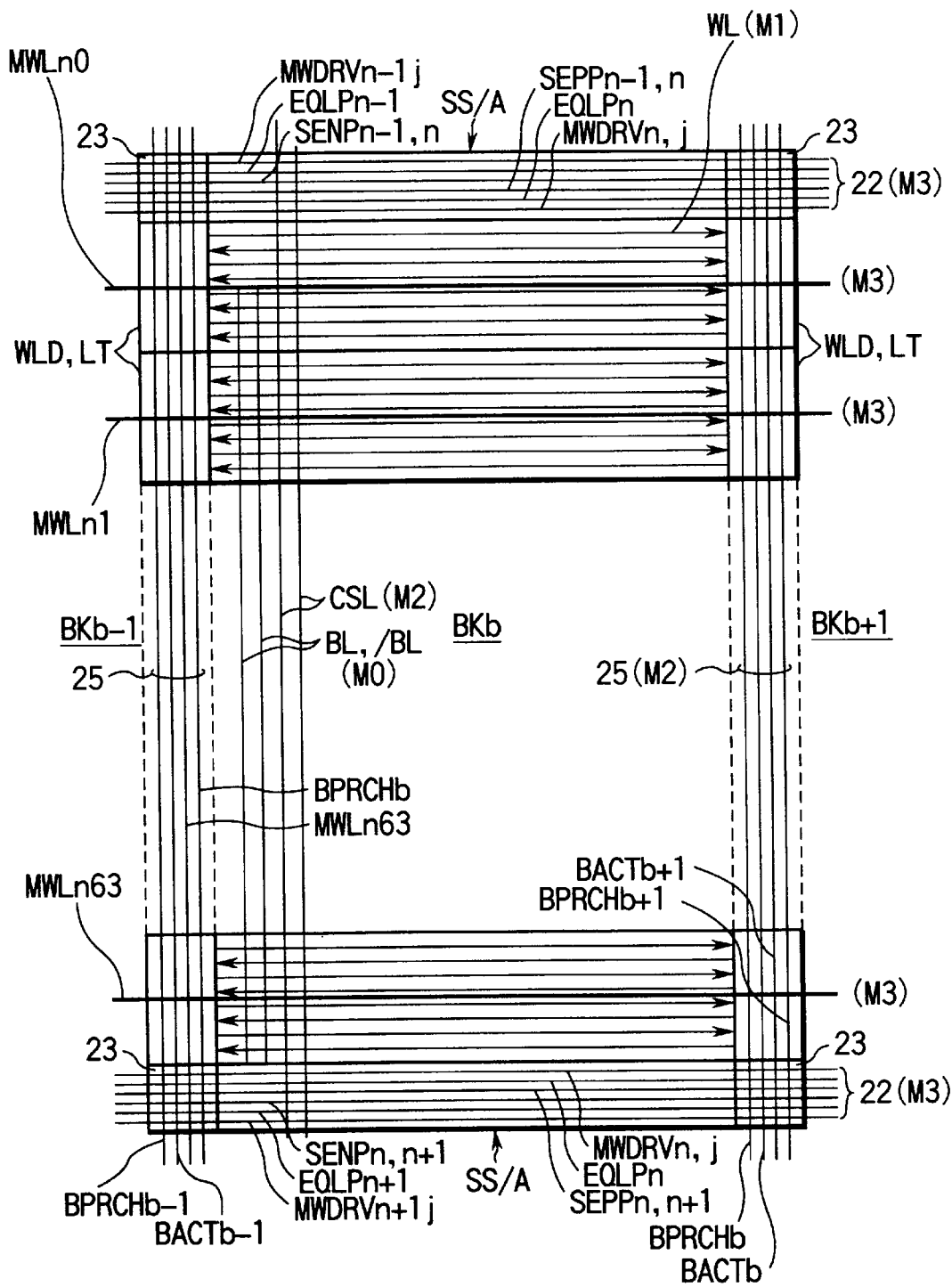
FIG. 3 shows the structure of the principal section of FIG. 2.

FIG. 2 shows the structure of bank BKb (for example, b=1) and row decoder section RDC0, which are part of FIG. 1. The structure of another bank is almost the same as that of bank BKb. The structure of row decoder section RDC1 is the same as row decoder section RDC0 of FIG. 2. FIG. 3 shows the structure of a single memory block in bank BKb and its vicinity.

In the row decoder section RDC0, row decoders RDCs are provided in such a manner that they correspond to the memory blocks MBLKs in each bank. According to the address signal, each row decoder RDC selects one of main word lines MWLn. The main word lines MWLn are provided on each memory block in the banks BK0 to BK3. In each memory block MBLK, 64 main word lines and 512 word lines are provided.

On each side of each of the row decoders RDCs, a decoder area 21 is provided so as to correspond to a shared sense amplifier SS/A in each bank. In each decoder area 21, a word line drive circuit decoder, a sense amplifier decoder, and an equalize signal decoder, which will be explained later, are provided. The word line drive circuit decoder generates a main word line drive pulse signal MWDRVnj used to generate word line drive voltages WDRVnbj. The sense amplifier decoder generates sense amplifier enable pulse signals SENPn,n+1, SEPPn,n+1 used to enable sense amplifiers. The equalize signal decoder generates an equalize pulse signal EQLPn used to equalize bit line pairs.

A wiring group 22 is connected to each decoder area 21. Each wiring group 22 is provided on each shared sense amplifier SS/A and signal generator area 23 in the banks BK0 to BK3. The main word line drive pulse signals MWDRVnj, MWDRVn+1j, sense amplifier enable pulse signals SENPn,n+1, SEPPn,n+1, and equalize pulse signal EQLPn outputted from the respective decoders are supplied to the shared sense amplifiers SS/As and word line voltage generator circuits via the wiring groups 22.

A timing signal φT is generated from the equalize pulse signal EQLPn, as described later. The timing signal φT is used to control an isolation transistor that is connected between a bit line and a sense amplifier and connects or disconnects the bit line to or from the sense amplifier.

A row address predecoder RAPD is provided at the peripheral circuit 12 (of FIG. 1) side end of the row decoder RDC0. On the row address predecoder RAPD, each decoder area 21, each row decoder RDC, and wiring groups 26, 27 are provided.

The row address predecoder RAPD predecodes address signals A3R, /A3R to A15R, /A15R supplied from the peripheral circuit 12. The decode output signals, address signals A0R, /A0R to A2R, /A2R, and row block select signals RSLn for selecting memory blocks are supplied via the wiring group 26 to the row decoder R0C and the various decoders provided in the decoder area 21. The precharge signal PRCH and sense amplifier enable signals SEN, SEP supplied from the peripheral circuit 12 are supplied via the wiring group 27 to the various decoders provided in the decoder area 21.

The peripheral circuit 12 supplies to the wiring group 26 a precharge signal PRCH, a sense amplifier enable signal SEN for enabling a sense amplifier composed of n-channel transistors, and a sense amplifier enable signal SEP for enabling a sense amplifier including p-channel transistors. These signals are supplied to the row decoder RDC and the various decoders in the decoder area 21.

As shown in FIGS. 2 and 3, in bank BKb, the word line drive circuit WLD and latch circuit LT are provided on each side of each memory block MBLK in the direction in which the main word lines MWLn (n=0 to 63) run. The latch circuits LT hold the main word line select signals supplied via the main word lines MWLn from the row decoder section RDC0. The word line drive circuit WLD selects the corresponding word lines WL according to the main word line select signals stored in the latch circuits LT. What is called a double end word line system is applied to each memory block. The word lines WLs are connected alternately to the word line drive circuits WLDs at both ends of the memory block MBLK.

A signal generator area 23 is provided on each side of each word line drive circuit WLD and latch circuit LT in the direction perpendicular to the main word line MWLn. In each signal generator area 23, a word line drive voltage generator circuit, a sense amplifier drive circuit, and an EQL, φT signal generator circuit for generating an equalize signal EQL and a timing signal φT, which will be described later, are provided. In response to the main word line drive pulse signal MWDRVnj, sense amplifier enable pulse signal SENPn,n+1, SEPPn,n+1, and equalize pulse signal EQLn outputted from the wiring group 22 from the decoder area 21, the word line drive voltage generator circuit, sense amplifier drive circuit, and EQL, φT signal generator circuit generate a word line drive voltage WDRVnbj, a sense amplifier enable signal, an equalize signal EQLn, and a timing signal φTn, which will be explained later. The word line drive voltage WDRVnbj is supplied to the adjacent word line drive circuit WLD and the sense amplifier enable signal, equalize signal EQLn, and timing signal φT are supplied to the adjacent shared sense amplifier SS/A.

On each memory block MBLK and shared sense amplifier SS/A in bank BKb, column select lines CSLs are provided. These column select lines CSLs are selected by the column decoder CDC. The peripheral circuit 12 supplies an address signal to the column decoder CDC. In each memory block MBLK, a pair of bit lines BL, /BL is provided along the column select line CSL. Memory cells are provided at the intersections of the bit lines and the word lines WLs.

As shown in FIG. 2, in each memory block MBLK, data lines DQ, /DQ are provided in the direction perpendicular to the bit line pair BL, /BL. The data lines DQ, /DQ are selectively connected to the bit line pair BL, /BL and transfer the data read on the bit line pair BL, /BL. In bank BKb, main data lines MDQ, /MDQ are provided in the direction perpendicular to the data lines DQ, /DQ. The main data lines MDQ, /MDQ are selectively connected to the data DQ, /DQ and transfer the data on the data lines DQ, /DQ to a DQ buffer 28.

A decoder area 24 is provided at each end of the column decoder CDC in the word line direction of word line. In the decoder area 24, a column address predecoder and a bank select signal generator circuit, which will be described later, are provided. In the vicinity of the column decoder CDC, a redundancy cell array R/D for remedying a defective word line in bank BKb is provided. At each end of the redundancy cell array R/D in the word line direction, a redundancy word line drive circuit RWLD for driving a redundancy word line is provided. A sense amplifier RS/A for redundancy array only is provided at each end of the redundancy cell array R/D in the direction of the column select line.

A defective address storage section 29 includes memory elements, for example, fuses and stores defective row addresses. An address comparison circuit 30 is connected to the defective address storage section 29. The address comparison circuit 30 compares the row address supplied from the peripheral circuit with the defective row address stored in the defective address storage section 29. If they coincide, the address comparison circuit 30 will enable the word line of the redundancy cell array R/D via the redundancy word line drive circuit RWLD. At the same time, the address comparison circuit 30 deselects the memory block MBLK.

A wiring group 25 is provided on the decoder area 24, redundancy word line drive circuit RWLD, signal generator area 23, word line drive circuit WLD, and latch circuit LT. The peripheral circuit 12 supplies a bank activate signal BACT and a bank precharge signal BPRCH to the wiring group 25.

In FIGS. 2 and 3, the bit line pair BL, /BL is formed out of a first-layer metal wire (M0) made of, for example, tungsten. The word line connected to a memory cell is composed of polysilicon and a second-layer metal wire (M1) shunted to the polysilicon. The data lines DQ, /DQ include the second-layer metal wire (M1). The column select line CSL, main data lines MDQ, /MDQ, and wiring groups 26, 27 include a third-layer metal wire (M2). The main word line MWLn and wiring group 22 include a fourth-layer metal wire (M3). The second- to fourth-layer metal wires (M1, M2, M3) are, for example made of aluminum. The first- to fourth-layer metal wires (M0, M1, M2, M3) are formed on the surface of the substrate in that order upward. The layout of wires is not restricted to the above example. For instance, the wires (M2, M2) may be replaced with each other.

Figure 4:
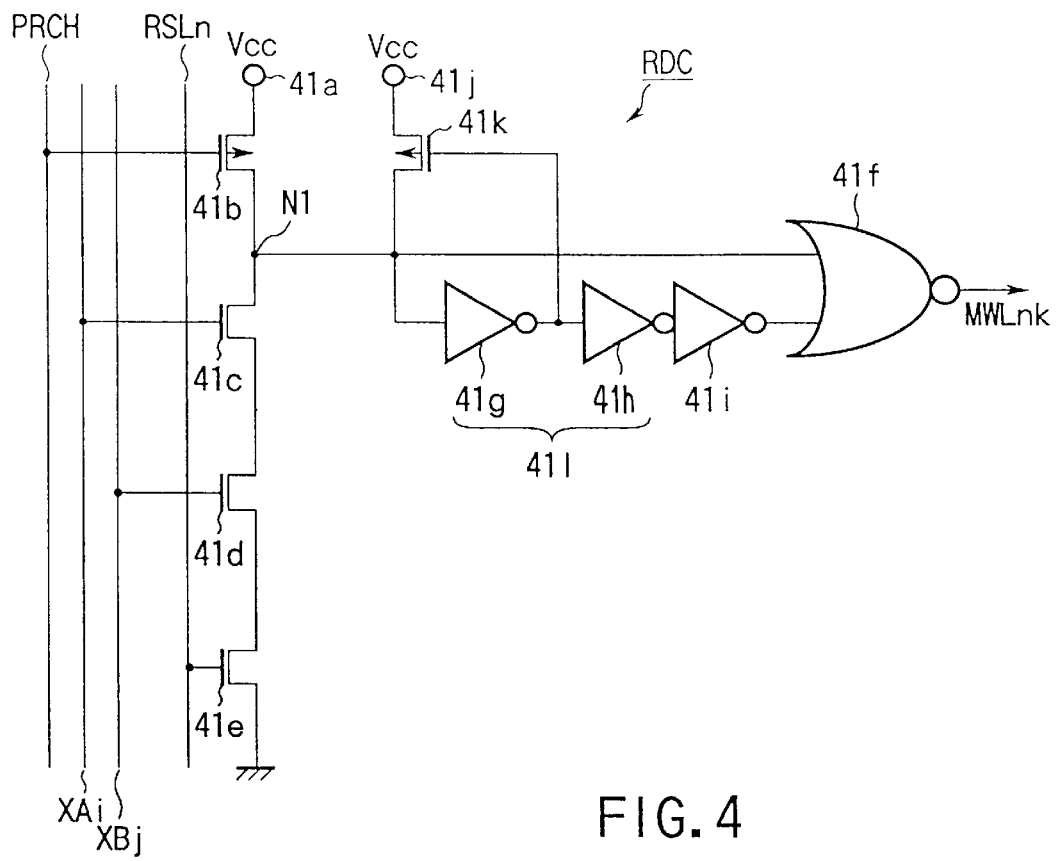
FIG. 4 is a circuit diagram of a row decoder.

FIG. 4 shows the structure of a row decoder RDC included in the row decoder section. In FIG. 4, a p-channel MOS transistor (hereinafter, referred to as a PMOS transistor) 41b and n-channel MOS transistors (hereinafter, referred to as NMOS transistors) 41c, 41d, 41e are connected in series between a terminal 41a to which a power supply Vcc is supplied and the ground. The precharge signal PRCH is supplied to the gate of the PMOS transistor 41b and the signals XAi, XBj outputted from the row address predecoder RAPD are supplied to the gates of NMOS transistors 41c, 41d, respectively. The row block select signal RSLn is supplied to the gate of the n-channel transistor 41e.

The connection node N1 of the PMOS transistor 41b and NMOS transistor 41c is connected to one input terminal of a NOR circuit 41f. Between the connection node N1 and the other input terminal of the NOR circuit 41f, inverter circuits 41g, 41h, 41i are connected in series. The current path of a PMOS transistor 41k is connected between a terminal 41j to which the power supply Vcc is supplied and the connection node N1. The gate of the transistor 41k is connected to the connection node of the inverter circuits 41g and 41h. The inverter circuits 41g, 41h comprising a delay circuit 41l. The PMOS transistor 41k, together with the inverter circuit 41g, comprise a latch circuit.

Figure 5:
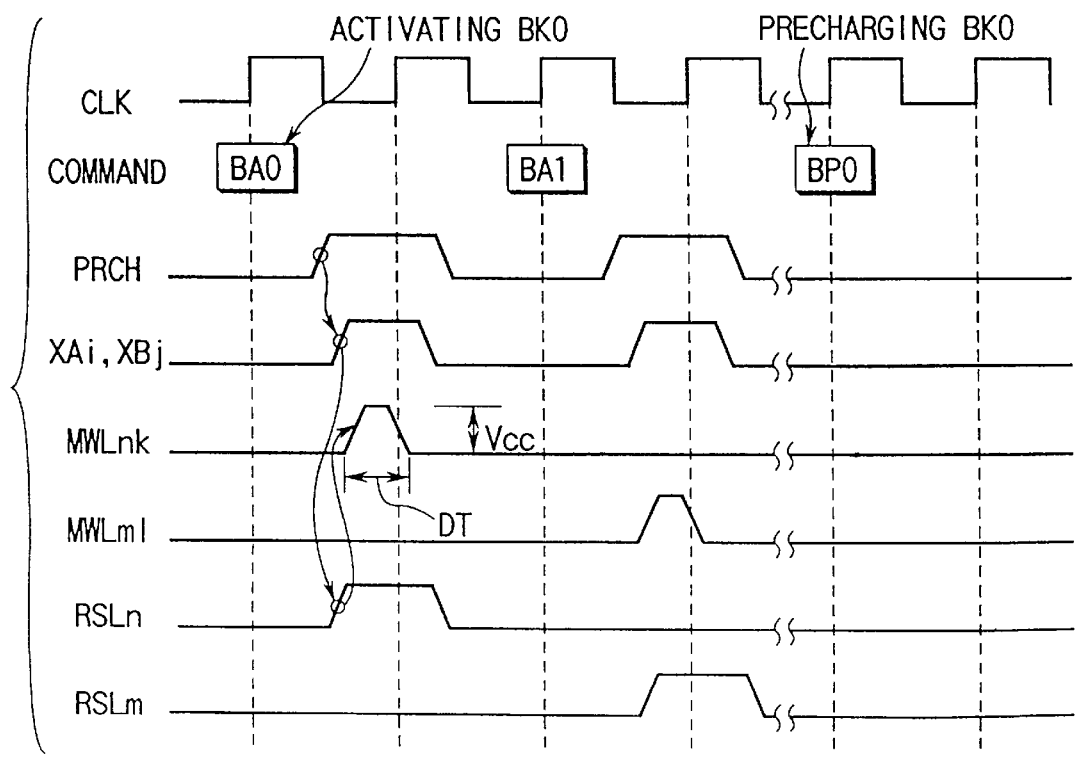
FIG. 5 is a timing chart for the operation of FIG. 4.

With this configuration, the operation will be explained by reference to FIG. 5. FIG. 5 shows a case where banks in a synchronous DRAM of the present embodiment are activated consecutively.

Commands corresponding to each of banks are supplied sequentially to the controller in synchronism with a clock signal CLK. The commands are set on the basis of the levels of /RAS and /CAS supplied from the outside of the chip in synchronism with, for example, the clock signal CLK. In a state where command BA0 has not been supplied to bank BK0 yet, the precharge signal PRCH is at the low level and PMOS transistor 41b is on. As a result, one input terminal of the NOR circuit 41f is at the high level and the other input terminal is at the low level, so that the output signal MWLnk is at the low level.

In this state, when command BA0 for activating bank BK0 is supplied, the precharge signal PRCH goes high and PMOS transistor 41b turns off. In the row decoder section, when the row block select signal RSLn to bank BK0 goes high in each row decoder RDC and both of the signals XAi, XBj outputted from the row address predecoder RAPD go high, then all of the NMOS transistors 41c, 41d, 41e turn on, which makes one input terminal of the NOR circuit 41f low. At this time, the delay circuit 41l keeps the other input terminal of NOR circuit 41f at the low level, which makes the signal MWLnk outputted from the output terminal of the NOR circuit 41f high. Thereafter, the output signal MWLnk of the NOR circuit 41f goes low when a delay time DT set in the delay circuit 41l has elapsed.

In this way, the row decoder RDC selected by the row address predecoder RAPD outputs a pulse-like select signal MWLnk to a main word line MWLn. Specifically, the main word line MWLn is not constantly in the selected state while the bank is being activated but is selected only for a short time. The level of the select signal MWLnk is at the power supply voltage Vcc.

Thereafter, for example, when command BA1 for activating bank BK1 has been supplied, the main word line of bank BK1 is selected according to select signal MWLm1. The operation of reading data from bank BK0 is executed after the activation of, for example, bank BK1 and before the precharging of bank BK0.

Figure 6:
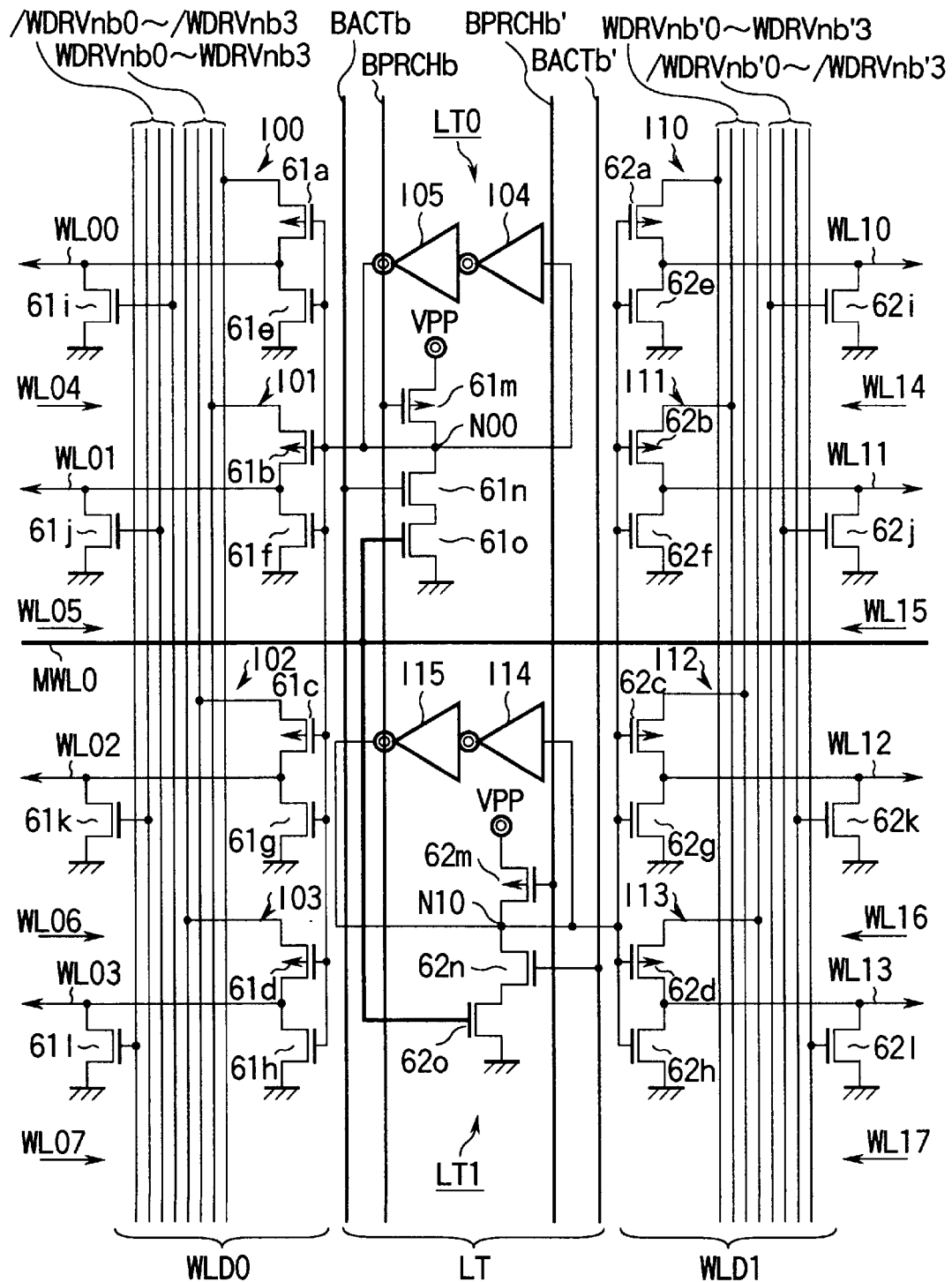
FIG. 6 is a circuit diagram of a word line drive circuit and part of a latch circuit.

FIG. 6 shows the configuration of part of the word line drive circuit WLD and latch circuit LT provided at the boundary between, for example, bank BK0 and bank BK1. In the word line drive circuit WLD0 of bank BK0, the word line drive voltages WDRWnb0 to WDRVnb3 generated by the word line drive voltage generator circuit are supplied respectively to the sources of PMOS transistors 61a, 61b, 61c, 61d constituting inverter circuits I00, I01, I02, I03. The drains of the PMOS transistors 61a, 61b, 61c, 61d are connected to not only the word lines WL00 to WL03 but also to the drains of NMOS transistors 61e, 61f, 61g, 61h, respectively. The sources of the NMOS transistors 61e, 61f, 61g, 61h are connected to the ground. The drains of NMOS transistors 61i, 61j, 61k, 61l are connected to the word lines WL00 to WL03. The sources of the NMOS transistors 61i, 61j, 61k, 61l are connected to the ground. The word line drive voltages /WDRVnb0 to /WDRVnb3 complementary to the word line drive voltages WDRVnb0 to WDRVnb3 are supplied respectively to the gates of the NMOS transistors 61i, 61j, 61k, 61l. The word lines WL00 to WL03 alternate with the word lines WL04 to WL07. The word lines WL04 to WL07 are driven by a word line drive circuit (not shown) provided in bank BK0.

In a latch circuit LT0 of bank BK0, inverter circuits I04 and I05 are connected in series. The input terminal of the inverter circuit I04 and the output terminal of the inverter circuit I05 are connected to the gates of the PMOS transistors 61a to 61d and those of the NMOS transistors 61e to 61h constituting the inverter circuits I00 to I03. A power supply voltage VPP is supplied to the source of a PMOS transistor 61m. The power supply voltage VPP is a voltage obtained by raising the power supply voltage Vcc. A bank precharge signal BPRCHb is supplied to the gate of the PMOS transistor 61m. The drain of the PMOS transistor 61m is connected to the input terminal of the inverter circuit I04. Between the ground and the connection node N00 to which the drain of the PMOS transistor 61m and the input terminal of the inverter circuit I04 are connected, NMOS transistors 61n, 61o are connected in series. A bank activate signal BACTb is supplied to the gate of the NMOS transistor 61n. The main word line MWL0 is connected to the gate of the NMOS transistor 61o. In the drawings that follow, the power supply VPP is supplied to a logic circuit with a double circle at the output terminal, like the inverter circuits I04, I05.

In the word line drive circuit WLD1 of bank BK1, the word line drive voltages WDRVnb'0 to WDRVnb'3 generated by the word line voltage generator circuit are supplied respectively to the source of PMOS transistors 62a, 62b, 62c, 62d constituting inverter circuits I10, I11, I12, I13. The drains of the PMOS transistors 62a, 62b, 62c, 62d are connected to not only the word lines WL10 to WL13 but also to the drains of NMOS transistors 62e, 62f, 62g, 62h, respectively. The sources of the NMOS transistors 62e, 62f, 62g, 62h are connected to the ground. The drains of NMOS transistors 62i, 62j, 62k, 62l are connected to the word lines WL10 to WL13. The sources of the NMOS transistors 62i, 62j, 62k, 62l are connected to the ground. The word line drive voltages /WDRVnb'0 to /WDRVnb'3 complementary to the word line drive voltages WDRVnb'0 to WDRVnb'3 are supplied respectively to the gates of the NMOS transistors 62i, 62j, 62k, 62l. The word lines WL10 to WL13 alternate with the word lines WL14 to WL17. The word lines WL14 to WL17 are driven by a word line drive circuit (not shown) provided in bank BK1.

In a latch circuit LT1 of bank BK1, inverter circuits I14 and I15 are connected in series. The input terminal of the inverter circuit I14 and the output terminal of the inverter circuit I15 are connected to the gates of the PMOS transistors 62a to 62d and those of the NMOS transistors 62e to 62h constituting the inverter circuits I10 to I13. The power supply voltage VPP is supplied to the source of a PMOS transistor 62m. A bank precharge signal BPRCHb' is supplied to the gate of the PMOS transistor 62m. The drain of the PMOS transistor 62m is connected to the input terminal of the inverter circuit I14. Between the ground and the connection node N10 to which the drain of the PMOS transistor 62m and the input terminal of the inverter circuit I14 are connected, NMOS transistors 62n, 62o are connected in series. A bank activate signal BACTb' is supplied to the gate of the NMOS transistor 62n. The main word line MWL0 is connected to the gate of the NMOS transistor 62o.

Figure 7:
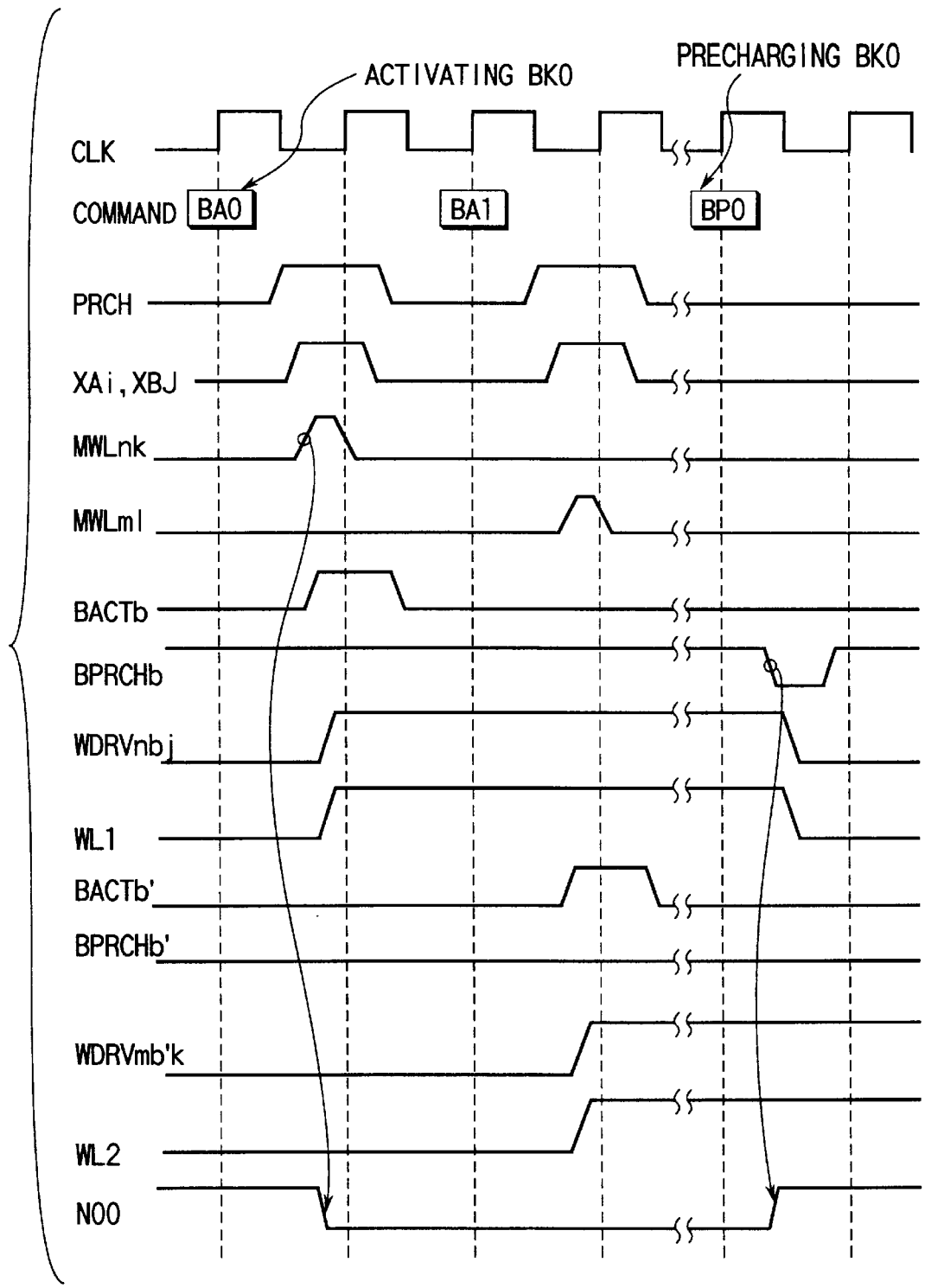
FIG. 7 is a timing chart for the operation of FIG. 6.

The operation of the word line drive circuit and latch circuit in the above configuration will be explained by reference to FIG. 7. For example, when command BA0 for activating bank BK0 is supplied in synchronism with the clock signal CLK, the row decoder RDC selects a main word line MWLnk (in the case, MWL0) according to the precharge signal PRCH and address signal XAi, XBj.

At this time, because the bank precharge signal BPRCHb is at the high level and BPRCHb' is at the low level, this makes PMOS transistor 61m off and PMOS transistor 62m on. Moreover, the bank activate signal BACTb is at the high level and BACTb' is at the low level, which makes NMOS transistor 61n on. When the main word line MWL0 goes high, the NMOS transistor 61o turns on, placing the connection node N00 at the low level. This inverts the latch circuit LT0, which places the output terminal of the inverter circuit I05 at the low level. Furthermore, because the NMOS transistor 62n remains off, the connection node N10 is kept high.

When the output terminal of the inverter circuit I05 goes to the low level, the PMOS transistors 61a to 61d constituting the inverter circuits I00 to I03 turn on. At this time, the word line drive voltage generator circuit makes one of the word line drive voltages WDRVnbj (j=0 to 3) high. The high word line drive voltage WDRVnbj is supplied to a word line via the PMOS transistors 61a to 61d that are on. As a result, one word line is selected in one memory block.

In this state, a bit line is selected, as explained later. Then, the data is read from the memory cell selected by the word line and bit line. Then, after a similar operation has been performed on bank BK1, when precharge command BP0 for bank BK0 is supplied to the control section, the bank precharge signal BPRCHb goes low. Then, the PMOS transistor 61m turns on, causing the latch circuit LT0 to be reversed, which places the inverter circuit I05 at the high level. This makes the PMOS transistors 61a to 61d turn off, bringing the word lines into the unselected state. Then, the word line drive voltages WDRVnbj (j=0 to 3) generated by the word line drive voltage generator circuit are placed at the low level and /WDRVnbj (j=0 to 3) are placed at the high level. As a result, the NMOS transistors 61i to 61l are turned on, causing the potential of the word lines to be discharged.

Figure 8:
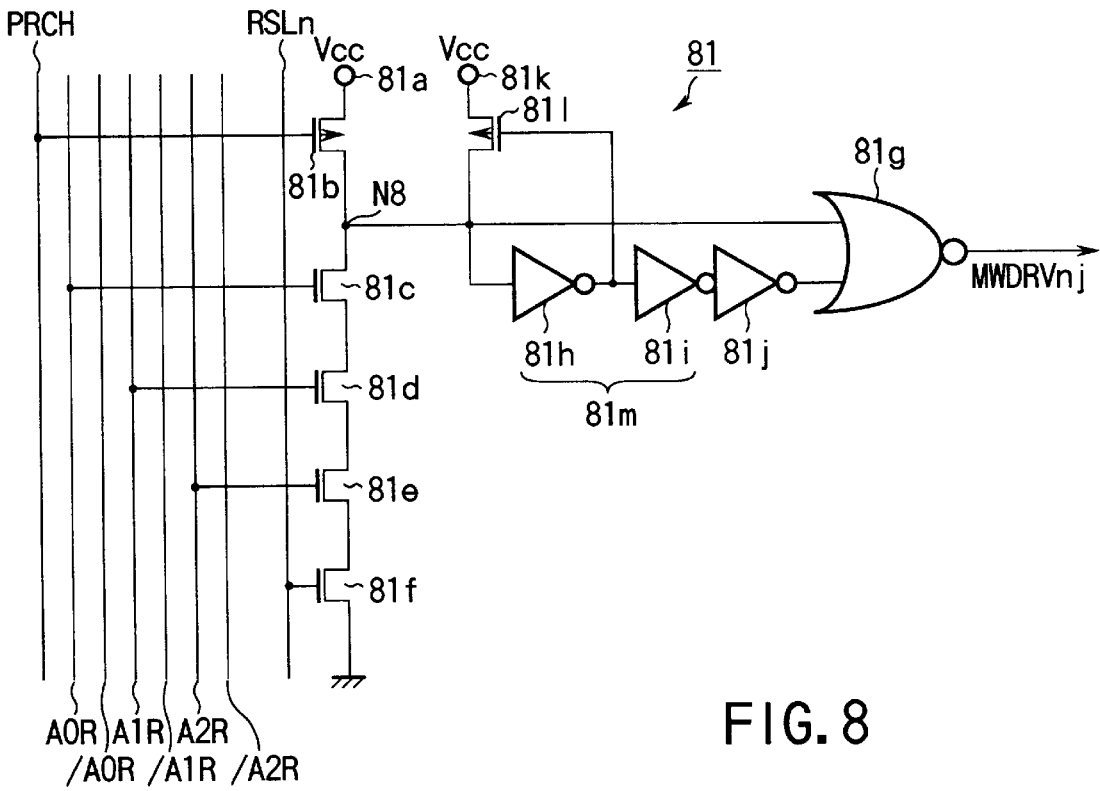
FIG. 8 is a circuit diagram of a word line drive circuit decoder.

FIG. 8 shows the word line drive circuit decoder 81 that is provided in the row decoder section and generates a main word line drive pulse signal MWDRVnj. In FIG. 8, a PMOS transistor 81b and NMOS transistors 81c, 81d, 81e, 81f are connected in series between the ground and a terminal 81a to which the power supply Vcc is supplied. The precharge signal PRCH is supplied to the gate of the PMOS transistor 81b and address signals A0R, A1R, A2R are supplied to the gates of NMOS transistors 81c to 81e, respectively. The row block select signal RSLn is supplied to the gate of the NMOS transistor 81f.

The connection node N8 of the PMOS transistor 81b and NMOS transistor 81C is connected to one input terminal of a NOR circuit 81g. Between the connection node N8 and the other input terminal of the NOR circuit 81g, inverter circuits 81h, 81i, 81j are connected in series. The current path of a PMOS transistor 81l is connected between the connection node N8 and a terminal 81k to which the power supply Vcc is supplied. The gate of the transistor 81l is connected to the connection node of the inverter circuits 81h and 81i. The inverter circuits 81h, 81i constitute a delay circuit 81m. The PMOS transistor 81l, together with the inverter circuit 81h, constitutes a latch circuit.

Figure 9:
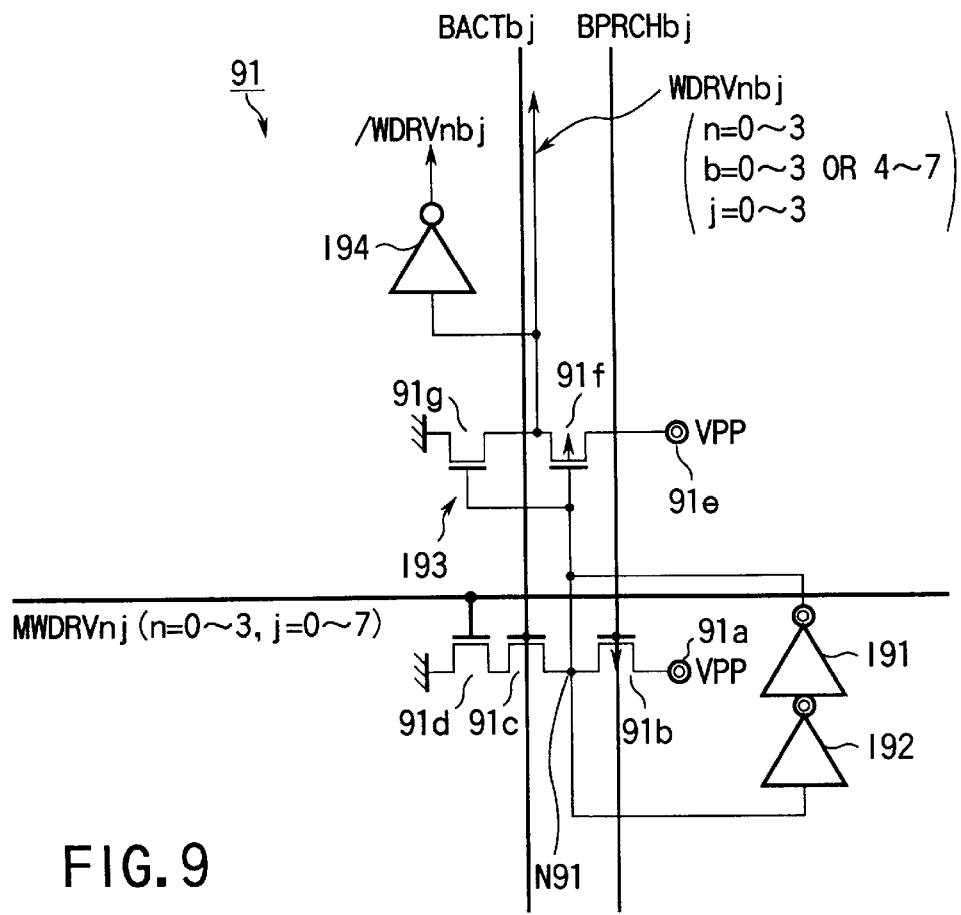
FIG. 9 is a circuit diagram of a word line drive voltage generator circuit.

FIG. 9 shows the structure of the word line drive voltage generator circuit 91 provided in the signal generator area 23.

Inverter circuits I91 and I92 constituting a latch circuit LTWD are connected in series. These inverter circuits I91, I92 output signals of the power supply VPP level. The power supply voltage VPP is supplied to a terminal 91a. A PMOS transistor 91b is connected between the terminal 91a and a connection node N91 connected to the output terminal of the inverter circuit I91. A bank precharge signal BPRCHbj is supplied to the gate of the PMOS transistor 91b. Between the connection node N91 and the ground, NMOS transistors 91c, 91d are connected in series. A bank activate signal BACTbj is supplied to the gate of the NMOS transistor 91c. The main word line drive pulse signal MWDRVnj is supplied to the gate of the NMOS transistor 91d.

Between the ground and a terminal 91e to which the power supply voltage VPP is supplied, a PMOS transistor 91f and a NMOS transistor 91g are connected in series. The gates of the transistors 91f, 91g are connected to the connection node N91. The connection node of the transistors 91f, 91g not only outputs a word line drive voltage WDRVnbj but also outputs a word line drive voltage /WDRVnbj via an inverter circuit I94.

Figure 10:
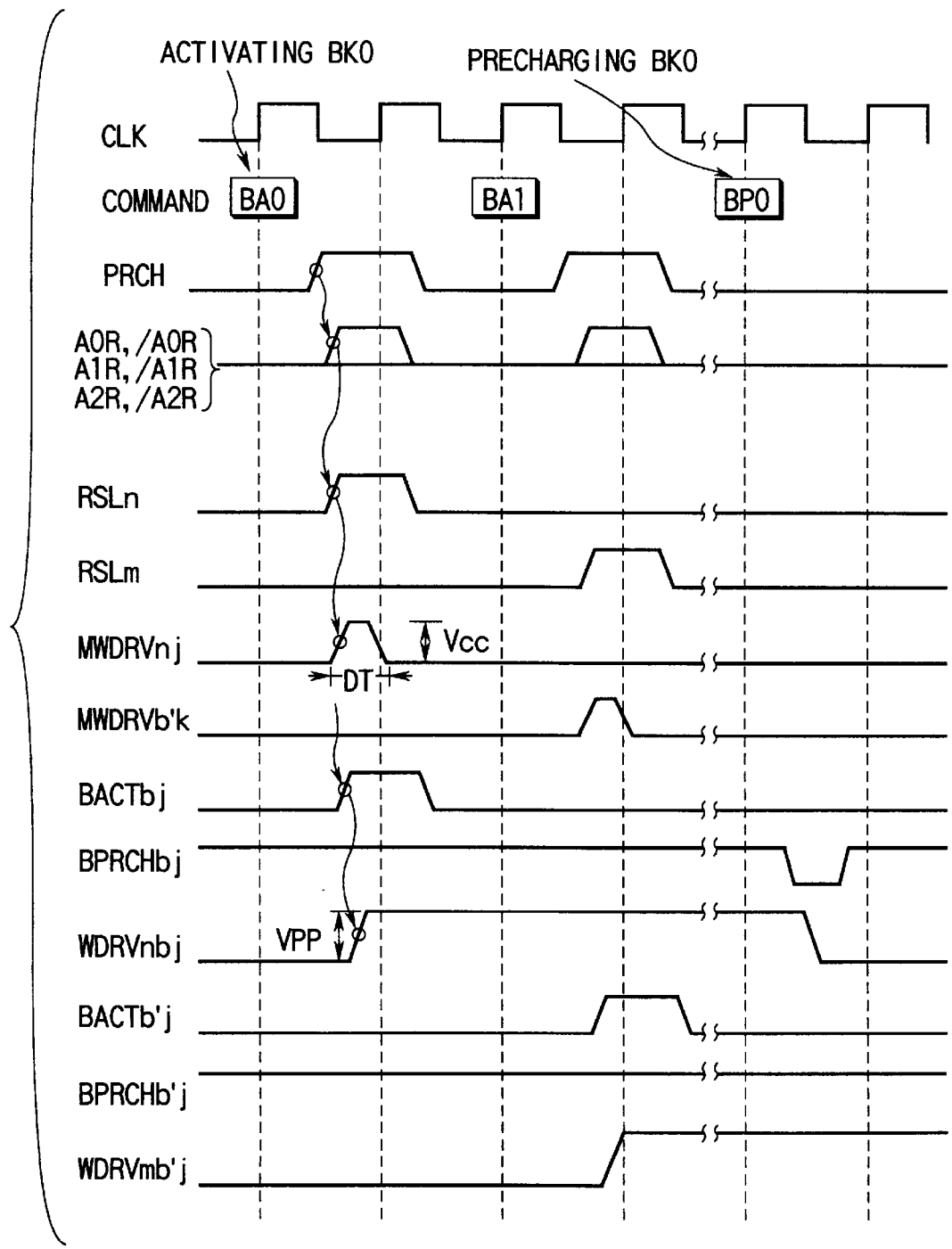
FIG. 10 is a timing chart for the operation of FIG. 9.

Next, the operation of the word line drive circuit decoder 81 of FIG. 8 and that of the word line drive voltage generator circuit 91 of FIG. 9 will be described by reference to FIG. 10. The operation of the word line drive circuit decoder 81 is almost the same as that of the row decoder. Specifically, commands corresponding to each of banks are supplied sequentially to the controller in synchronism with the clock signal CLK. For example, in a state where command BA0 for activating bank BK0 has not been supplied yet, the precharge signal PRCH is at the low level and PMOS transistor 81b is on. As a result, one input terminal of the NOR circuit 81g is at the high level and the other input terminal is at the low level, so that the output signal MWDRVnj is at the low level.

In this state, when command BA0 for activating bank BK0 is supplied, precharge signal PRCH goes high and PMOS transistor 81b turns off. When the row block select signal RSLn goes high and all the address signals A0R, A1R, A2R go high, then all of the NMOS transistors 81c, 81d, 81e, 81f turn on, which makes one input terminal of the NOR circuit 81g low. At this time, the delay circuit 81m keeps the other input terminal of NOR circuit 81g at the low level, which makes the main word line drive pulse signal MWDRvnj outputted from the output terminal of the NOR circuit 81g high. Thereafter, the main word line drive pulse signal MWDRVnj outputted from the NOR circuit 81g goes low when a delay time DT set in the delay circuit 81m has elapsed.

In this way, the main word line drive pulse signal MWDRVnj is outputted according to the address signal. The main word line drive pulse signal MWDRVnj is supplied via the wiring group 22 to the word line drive voltage generator circuit. The main word line drive pulse signal MWDRVnj is not constantly being generated while the bank is being activated. It is generated only for a short time as with the main word line MWL. The level of the main word line drive pulse signal MWDRVnj is at the power supply voltage Vcc.

In the word line drive voltage generator circuit 91, both of the bank activate signal BACTbj and main word line drive pulse signal MWDRVnj are at the low level and the bank precharge signal BPRCHbj is at the high level before command BA0 for activating a bank is supplied. As a result, the NMOS transistors 91c, 91d are off, the PMOS transistor 91b is on, and the output signal of the inverter circuit I91 constituting a latch circuit is at the high level. Consequently, the PMOS transistor 91f constituting an inverter circuit I93 is off, the NMOS transistor 91g is on, the word line drive voltage WDRVnbj is at the low level, and /WDRVnbj is at the high level.

In the above state, when command BA0 is supplied, both of the bank activate signal BACTbj and main word line drive pulse signal MWDRVnj go high and the bank precharge signal BPRCHbj goes low. As a result, the NMOS transistors 91c, 91d turn on and the PMOS transistor 91b turns off, which causes the output signal of the inverter circuit I91 to go low. Consequently, the PMOS transistor 91f turns on, the NMOS transistor 91g turns off, the word line drive voltage WDRVnbj goes high and /WDRVnbj goes low. The word line drive voltage WDRVnbj is the level of at the power supply voltage VPP. This state is kept until command BP0 for precharging the bank is supplied.

Figure 11:
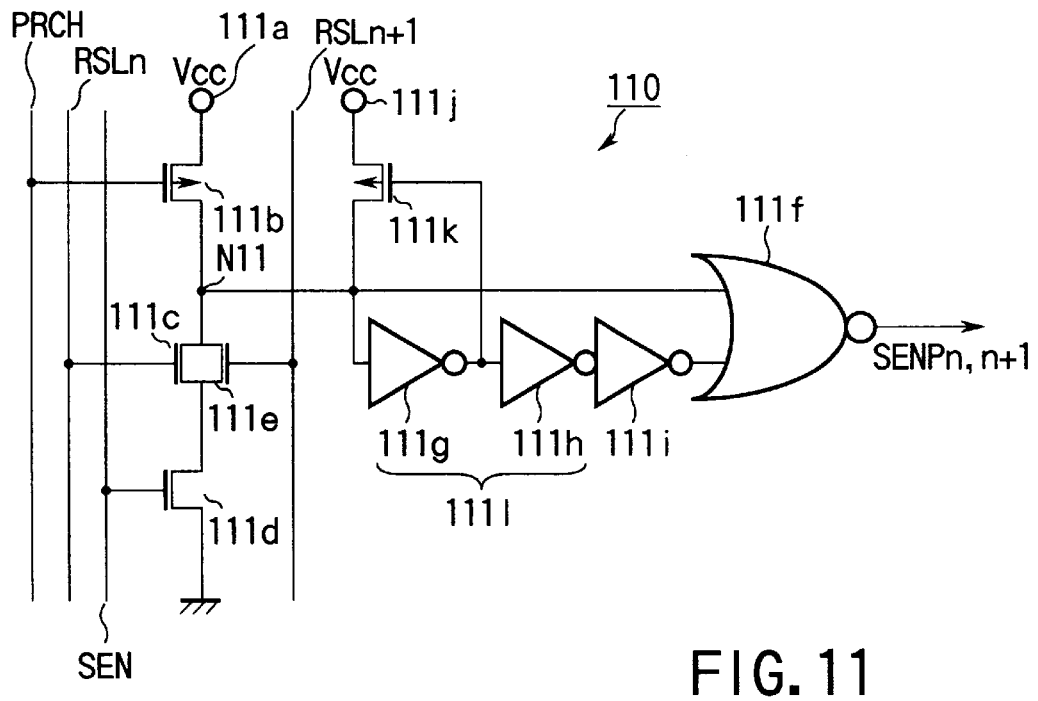
FIG. 11 is a circuit diagram of a sense amplifier decoder.
Figure 12:
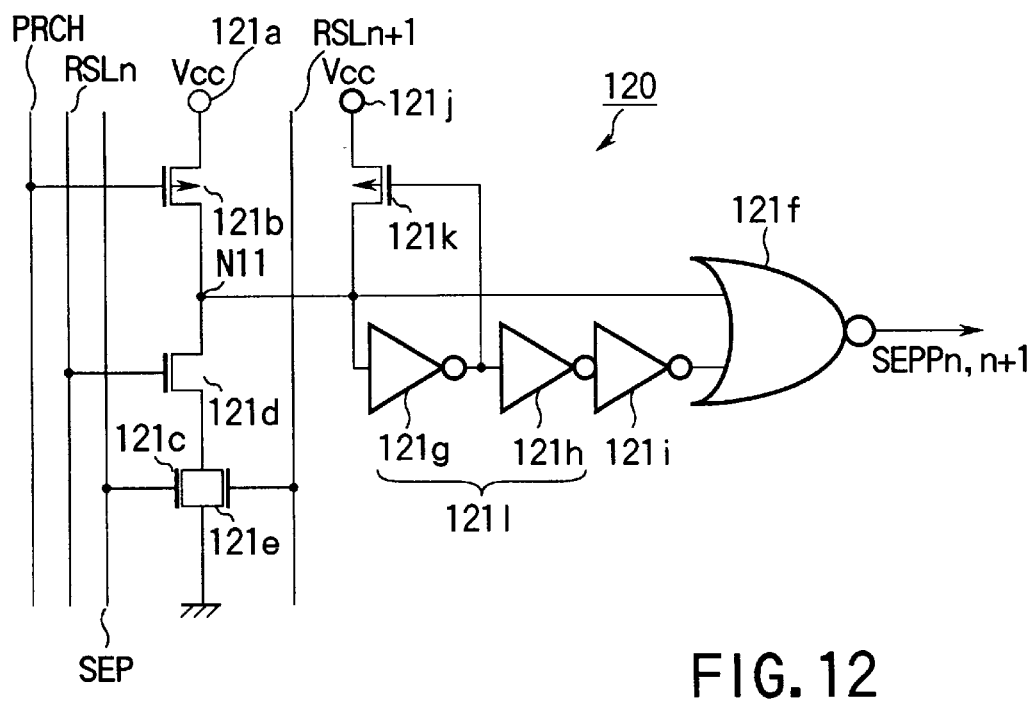
FIG. 12 is a circuit diagram of a sense amplifier decoder.

FIG. 11 shows the structure of the sense amplifier decoder 110 for selecting a sense amplifier including an NMOS transistor. FIG. 12 shows the structure of the sense amplifier decoder 120 for selecting a sense amplifier including a MOS transistor.

In FIG. 11, a PMOS transistor 111b and NMOS transistors 111c, 111d are connected in series between the ground and a terminal 111a to which the power supply voltage Vcc is supplied. An NMOS transistor 111e is connected in parallel with the NMOS transistor 111c. The precharge signal PRCH is supplied to the gate of the PMOS transistor 111b and a sense enable signal SEN is supplied to the gate of the NMOS transistor 111d. The row block select signal RSLn is supplied to the gate of the NMOS transistor 111c and the row block select signal RSLn+1 is supplied to the gate of the NMOS transistor 111e.

The connection node N11 of the PMOS transistor 111b and NMOS transistor 111c is connected to one input terminal of a NOR circuit 111f. Between the connection node N11 and the other input terminal of the NOR circuit 111f, inverter circuits 111g, 111h, 111i are connected in series. The current path of a PMOS transistor 111k is connected between the connection node N11 and a terminal 111j to which the power supply voltage Vcc is supplied. The gate of the transistor 111k is connected to the connection node of the inverter circuits 111g and 111h. The inverter circuits 111g, 111h constitute a delay circuit 111l. The PMOS transistor 111k, together with the inverter circuit 111g, constitutes a latch circuit. The NOR circuit 111f outputs sense amplifier enable pulse signals SENPn,n+1 at its output terminal. The sense amplifier enable pulse signals SENPn,n+1 are transmitted via the wiring group 22 to each bank.

FIG. 12 is almost the same structure as that of FIG. 11. The structure of FIG. 12 differs from that of FIG. 11 in that a sense enable signal SEP is supplied to the gate of the NMOS transistor 121c and a row block select signal RSLn is supplied to the gate of the NMOS transistor 121d. A NOR circuit 121f outputs sense amplifier enable pulse signals SEPPn,n+1 at its output terminal. These sense amplifier enable pulse signals SENPn,n+1, SEPPn,n+1 are transmitted via the wiring group 22 to each bank. The sense amplifier enable pulse signals SENPn,n+1, SEPPn,n+1 are to be supplied to the sense amplifier located between the n-th memory block and the (n+1)-th memory block.

Figure 15:
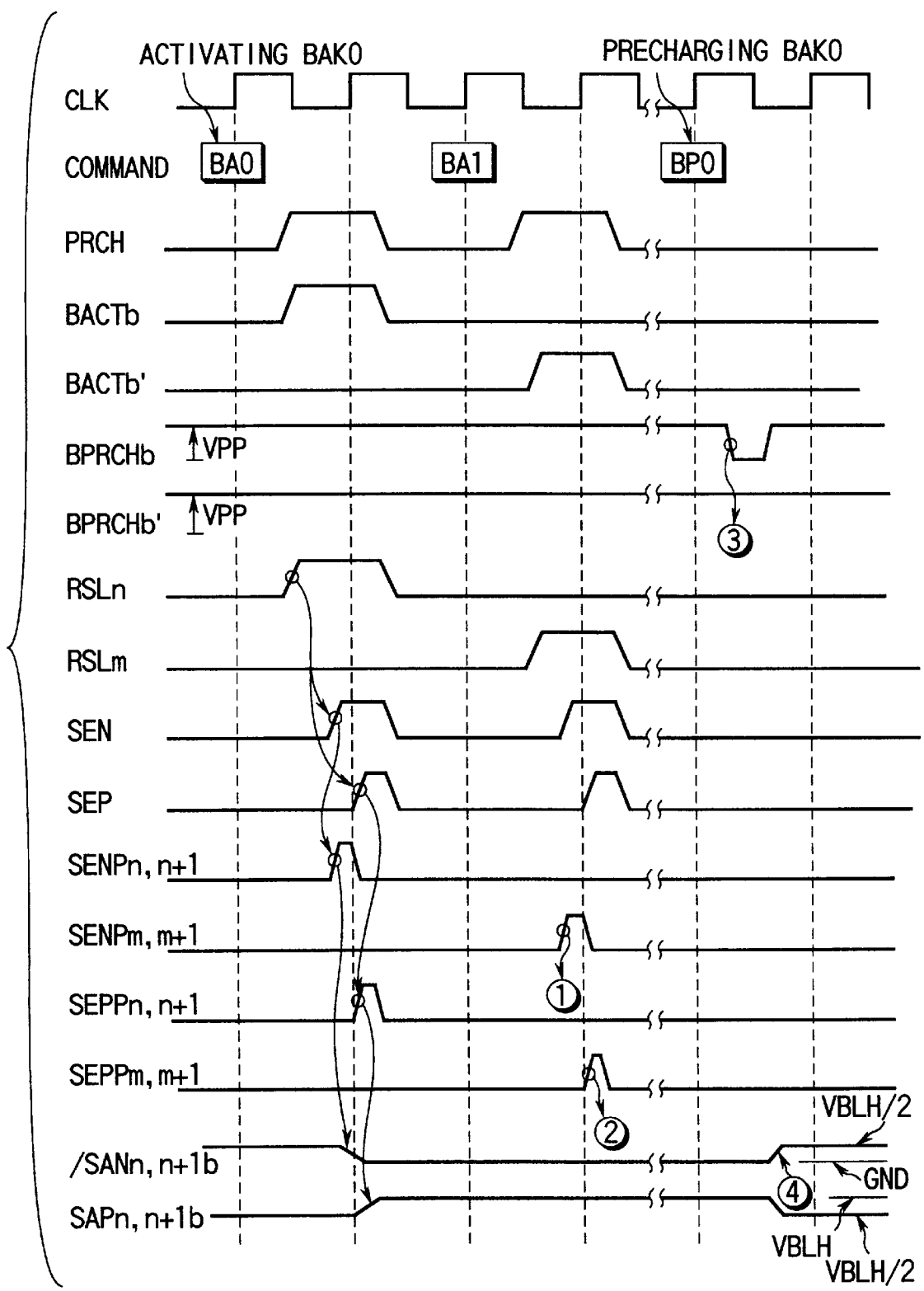
FIG. 15 is a timing chart for the operation of the sense amplifier enable signal generator circuit.

With the above structure, the operation of the sense amplifier decoders 110, 120 will be described by reference to FIG. 15. Since the operation of the sense amplifier decoder 120 is almost the same as that of the sense amplifier decoder 110, explanation will be given centering on the sense amplifier decoder 110. Commands corresponding to each of banks are supplied sequentially to the controller in synchronism with the clock signal CLK. In a state where command BA0 for activating bank BK0 has not been supplied yet, the precharge signal PRCH is at the low level and PMOS transistor 111b is on. As a result, one input terminal of the NOR circuit 111f is at the high level and the other input terminal is at the low level, so that the sense amplifier enable pulse signal SENPn,n+1 outputted from the NOR circuit 111f is at the low level.

In this state, when command BA0 for activating bank BK0 is supplied, precharge signal PRCH goes high and PMOS transistor 111b turns off. Then, when the row block select signal RSLn or RSLn+1 goes high and the sense amplifier enable signal SEN goes high, the NMOS transistor 111c or 111d and the NMOS transistor 111e turn on, which makes one input terminal of the NOR circuit 111f low. At this time, the delay circuit 111l keeps the other input terminal of NOR circuit 111f at the low level, which places the signals SENPn,n+1 outputted from the output terminal of the NOR circuit 111f at the high level. Thereafter, the output signals SENPn,n+1 from the NOR circuit 111f goes low when a delay time DT set in the delay circuit 111l has elapsed.

In this way, the sense amplifier decoder 110 outputs the sense amplifier enable pulse signals SENPn,n+1. The sense amplifier enable pulse signals SEPPn,n+1 outputted from the sense amplifier decoder 120 are outputted a little later than the pulse signals SENPn,n+1 according to the sense amplifier enable signal SEP. The sense amplifier enable pulse signals SENPn,n+1, SEPPn,n+1 are not constantly being outputted while the bank is being activated. They are outputted only for a short time. The signal is at the level of the power supply voltage Vcc. Thereafter, for example, when command BA1 for activating bank BK1 is supplied, the main word line for bank BK1 is selected according to the select signal MWLm1. The operation of reading the data from the bank BK0 is carried out, for example, after the activation of bank BK1 and before the precharging of bank BK0.

Figure 13:
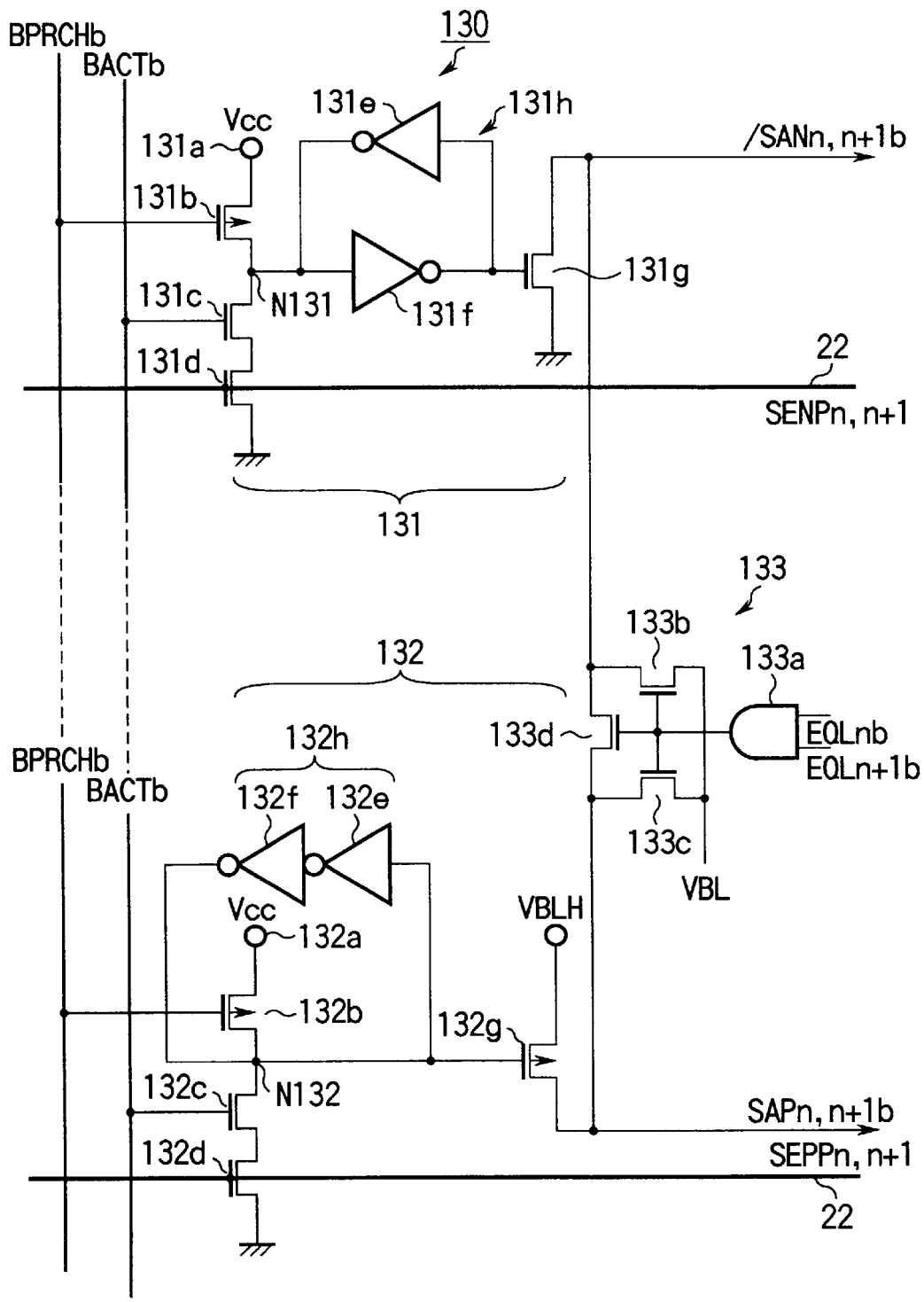
FIG. 13 is a circuit diagram of a sense amplifier enable signal generator circuit.

FIG. 13 shows a sense amplifier activate signal generator circuit 130 provided in the signal generator area 23 in each bank. The sense amplifier activate signal generator circuit 130 includes a sense amplifier activate signal generator circuit 131 on the NMOS sense amplifier side, a sense amplifier activate signal generator circuit 132 on the PMOS sense amplifier side, and an equalizer circuit 133 for equalizing the output voltages of these signal generator circuits 131, 132. In the sense amplifier activate signal generator circuit 131, the power supply voltage Vcc is supplied to a terminal 131a. Between the terminal 131a and the ground, a PMOS transistor 131b and NMOS transistors 131c, 131d are connected in series. A bank precharge signal BPRCHb is supplied to the gate of the PMOS transistor 131b, a bank activate signal BACTb is supplied to the gate of the NMOS transistor 131c, and sense amplifier enable pulse signals SENPn,n+1 are supplied via the wiring group 22 to the gate of the NMOS transistor 131d. The output terminal of an inverter circuit 131e and the input terminal of an inverter circuit 131f are connected to the connection node N131 of the PMOS transistor 131b and NMOS transistor 131c. The input terminal of the inverter circuit 131e and the output terminal of the inverter 131f are connected to the gate of the NMOS transistor 131g. The source of the NMOS transistor 131g is connected to the ground. The NMOS transistor 131g outputs sense amplifier activate signals /SANn,n+1b at its drain. The inverter circuits 131e, 131f constitute a latch circuit 131h.

In the sense amplifier activate signal generator circuit 132, the power supply voltage Vcc is supplied to a terminal 132a. Between the terminal 132a and the ground, a PMOS transistor 132b and NMOS transistors 132c, 132d are connected in series. The bank precharge signal BPRCHb is supplied to the gate of the PMOS transistor 132b, a bank activate signal BACTb is supplied to the gate of the NMOS transistor 132c, and sense amplifier enable pulse signals SEPPn,n+1 are supplied via the wiring group 22 to the gate of the NMOS transistor 132d. The input terminal of an inverter circuit 132e is connected to the connection node N132 of the PMOS transistor 132b and NMOS transistor 132c. The output terminal of the inverter circuit 132e is connected to the input terminal of an inverter 132f. The output terminal of the inverter circuit 132f is connected to the connection node N132. The connection node N132 is connected to the gate of the PMOS transistor 132g. A voltage VBLH is supplied to the source of the PMOS transistor 132g. The PMOS transistor 132g outputs sense amplifier activate signals SAPn, n+1b at its drain. The inverter circuits 132e, 132f constitute a latch circuit 132h.

In the equalize circuit 133, equalize signals EQLnb, EQLn+1b are supplied to the input terminal of an AND circuit 133a. The output terminal of the AND circuit 133a is connected to the gates of NMOS transistors 133b, 133c, 133d. The current path of the NMOS transistor 133d is connected between the drain of the NMOS transistor 131g and the drain of the PMOS transistor 132g. One end of the current path of the NMOS transistor 133b is connected to the drain of the NMOS transistor 131g. The voltage VBL is supplied to the other end of the current path of the transistor 133b. One end of the current path of the NMOS transistor 133c is connected to the drain of the PMOS transistor 132g. The voltage VBL is supplied to the other end of the current path of the transistor 133c.

Figure 14:
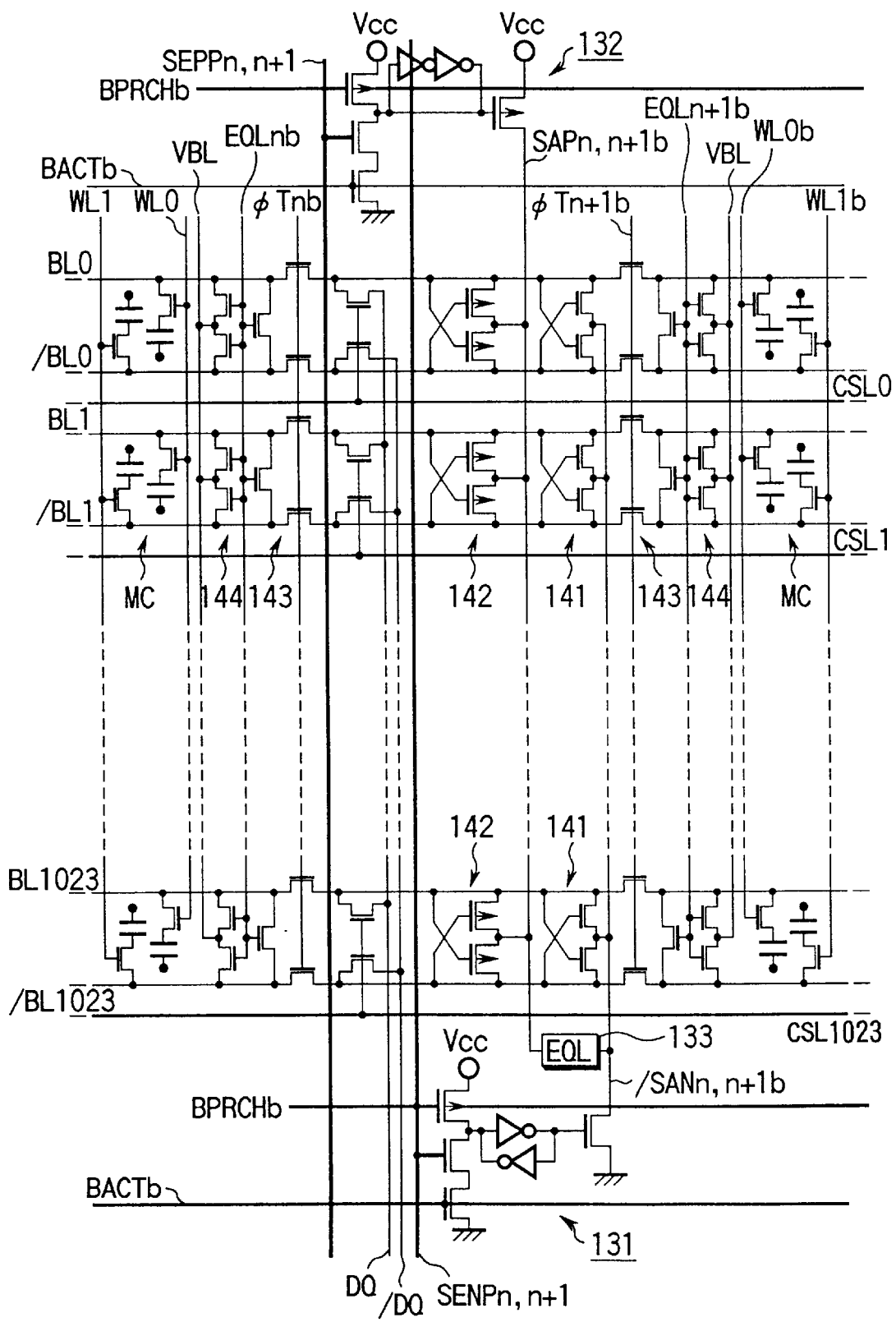
FIG. 14 is a circuit diagram of a shared sense amplifier circuit.

FIG. 14 shows the shared sense amplifier (SS/A). In FIG. 14, the same parts as those in FIG. 13 are indicated by the same reference symbols. The sense amplifier activate signal /SANn,n+1b outputted from the sense amplifier activate signal generator circuit 131 are supplied to sense amplifiers 141 including NMOS transistors. The sense amplifier activate signal /SAPn,n+1b outputted from the sense amplifier activate signal generator circuit 132 are supplied to sense amplifiers 142 including PMOS transistors. An isolation transistor 143 for connecting and disconnecting the bit line pair to and from the sense amplifier and an equalize circuit 144 for equalizing the bit line pair are connected to each of the bit line pair BL0, /BL0, bit line pair BL1, /BL1 to bit line pair BL1023, /BL1023. A memory cell MC is connected to the intersection of a bit line and a word line. The generation of signals φTnb, φTn+1b for activating the isolation transistor 143 and equalize signals EQLnb, EQLn+1b for activating the equalize circuit 144 will be described later.

Figure 16:
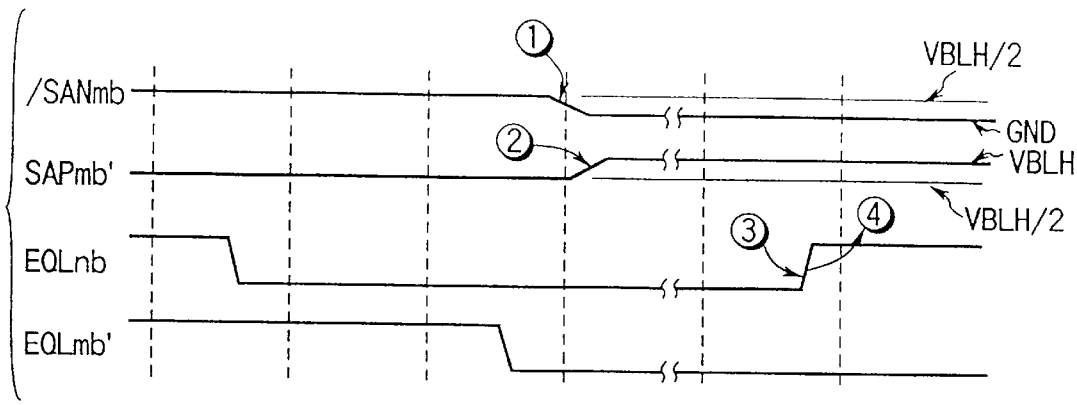
FIG. 16 is a timing chart for the operation of the sense amplifier enable signal generator circuit.

Next, the operation of the sense amplifier activate signal generator circuit 130 of FIG. 13 will be described by reference to FIGS. 15 and 16. Before the activation of a bank, the bank is precharged and both a node N131 to which a latch circuit 131h is connected and a node N132 to which a latch circuit 132h is connected are at the high level. As a result, both an NMOS transistor 131g connected to the output terminal of the latch circuit 131h and a PMOS transistor 132g connected to the output terminal of the latch circuit 132h are off. At this time, both of the equalize signals EQLnb, EQLn+1b are at the high level, which enables an equalize circuit 133. This places the sense amplifier activate signal /SANn,n+1b, SAPn,n+1b at VBLH/2 (e.g., Vcc/2).

In this state, when the bank activate signal BACTb goes high according to a command, the sense amplifier decoders 110, 120 of FIGS. 11 and 12 supply the sense amplifier enable pulse signals SENPn,n+1, SENPn,n+1. This makes the equalize signal EQLnb low, turning on the NMOS transistors 131c, 131d, 132c, 132d, which makes both of the nodes N131, N132 low. This reverses the data held in the latch circuits 131h, 132h, which turns on both the NMOS transistor 131g and the PMOS transistor 132g. As a result, the sense amplifier activate signals /SANn,n+1b outputted from the sense amplifier activate signal generator circuit 131 go low (the ground potential: GND) and the sense amplifier activate signals SAPn,n+1b outputted from the sense amplifier activate signal generator circuit 132 go high (VBLH: e.g., Vcc). These sense amplifier activate signals /SANn,n+1b, SAPn,n+1b are supplied to a sense amplifier 141 including NMOS transistors and a sense amplifier 142 including PMOS transistors.

Figure 17:
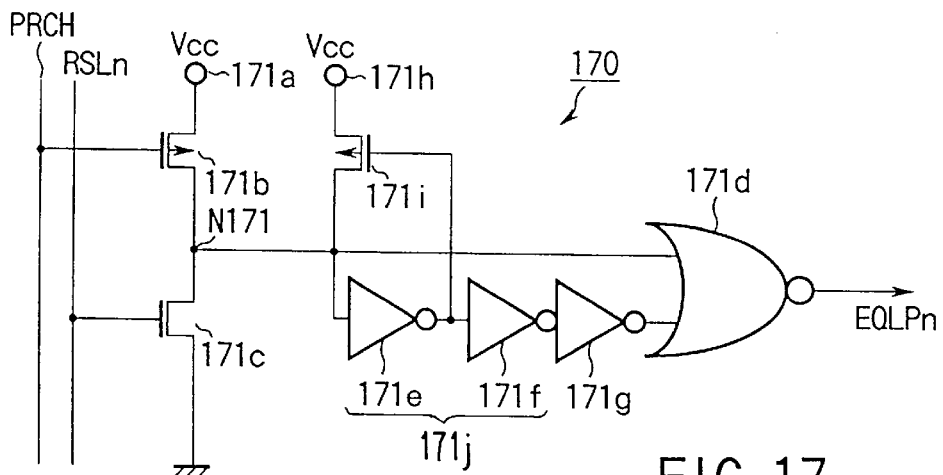
FIG. 17 is a circuit diagram of an equalize signal decoder.

FIG. 17 shows an equalize signal decoder 170 provided in the row decoder section RDC0. Between the ground and a terminal 171a to which the power supply Vcc is supplied, a PMOS transistor 171b and an NMOS transistor 171c are connected in series. The precharge signal PRCH is supplied to the gate of the PMOS transistor 171b and the row block select signal RSLn is supplied to the gate of the NMOS transistor 171c.

The connection node N171 of the PMOS transistor 171b and the NMOS transistor 171c is connected to one input terminal of a NOR circuit 171d. Between the connection node N171 and the other input terminal of the NOR circuit 171d, inverter circuits 171e, 171f, 171g are connected in series. The current path of a PMOS transistor 171i is connected between the connection node N171 and a terminal 171h to which the power supply Vcc is supplied. The gate of the transistor 171i is connected to the connection node of the inverter circuits 171e and 171f. The inverter circuits 171e, 171f constitute a delay circuit 171j. The PMOS transistor 171i, together with the inverter circuit 171e, constitutes a latch circuit. The NOR circuit 171d outputs an equalize pulse signal EQLPn at its output terminal. The equalize pulse signal EQLPn is transmitted via the wiring group 22 to each bank.

Figure 18:
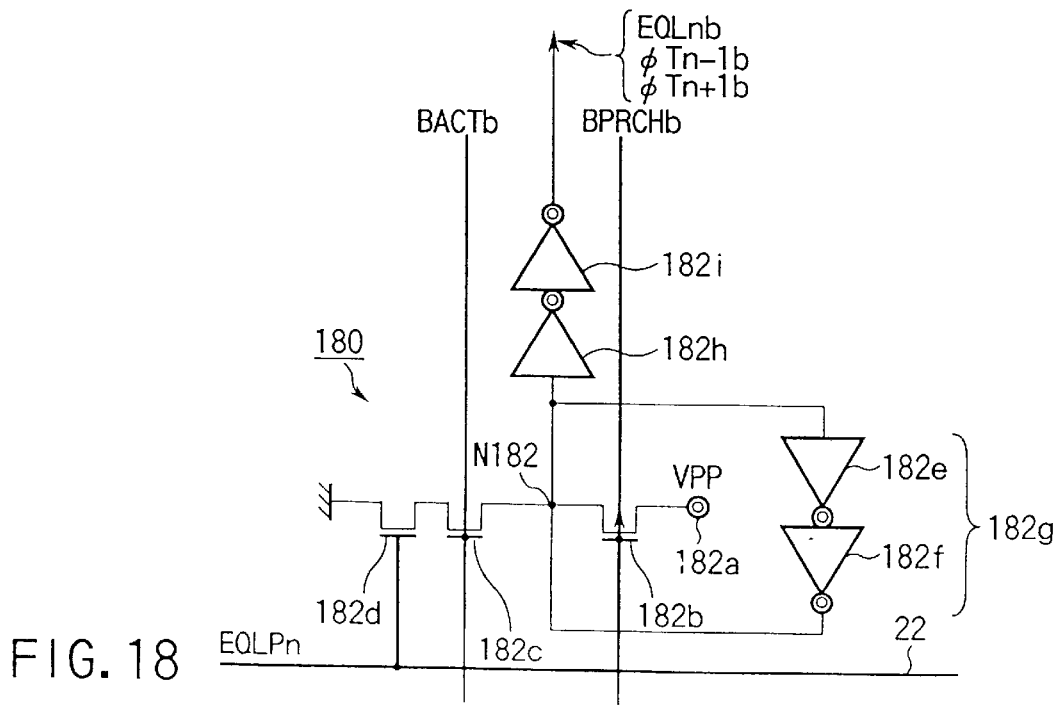
FIG. 18 is a circuit diagram of an EQL, φT signal generator circuit.

FIG. 18 shows an EQL and φT signal generator circuit 180 for generating an equalize signal EQLnb and a timing signal φT provided in each bank. The equalize signal EQLnb and timing signal φT are generated on the basis of the equalize pulse signal EQLPn. In the EQL and φT signal generator circuit 180, a voltage VPP obtained by raising the power supply voltage Vcc is supplied to a terminal 182a. Between the terminal 182a and the ground, a PMOS transistor 182b and NMOS transistors 182c, 182d are connected in series. A bank precharge signal BPRCHb is supplied to the gate of the PMOS transistor 182b. A bank activate signal BACTb is supplied to the gate of the NMOS transistor 182c. An equalize pulse signal EQLPn is supplied via the wiring group 22 to the gate of the NMOS transistor 182d.

The connection node N182 of the PMOS transistor 182b and the NMOS transistor 182c is connected to the input terminal of an inverter circuit 182e. The output terminal of the inverter circuit 182e is connected to the input terminal of an inverter circuit 182f. The output terminal of the inverter circuit 182f is connected to the connection node N182. These inverter circuits 182e, 182f constitute a latch circuit 182g. Inverter circuits 182h and 182i connected in series are connected to the connection node N182. The inverter circuit 182i outputs equalize signals EQLn, φTn−1, and φTn+1 at its output terminal. The inverter circuits 182e, 182f, 182h, 182i are driven by the raised voltage VPP.

Figure 19:
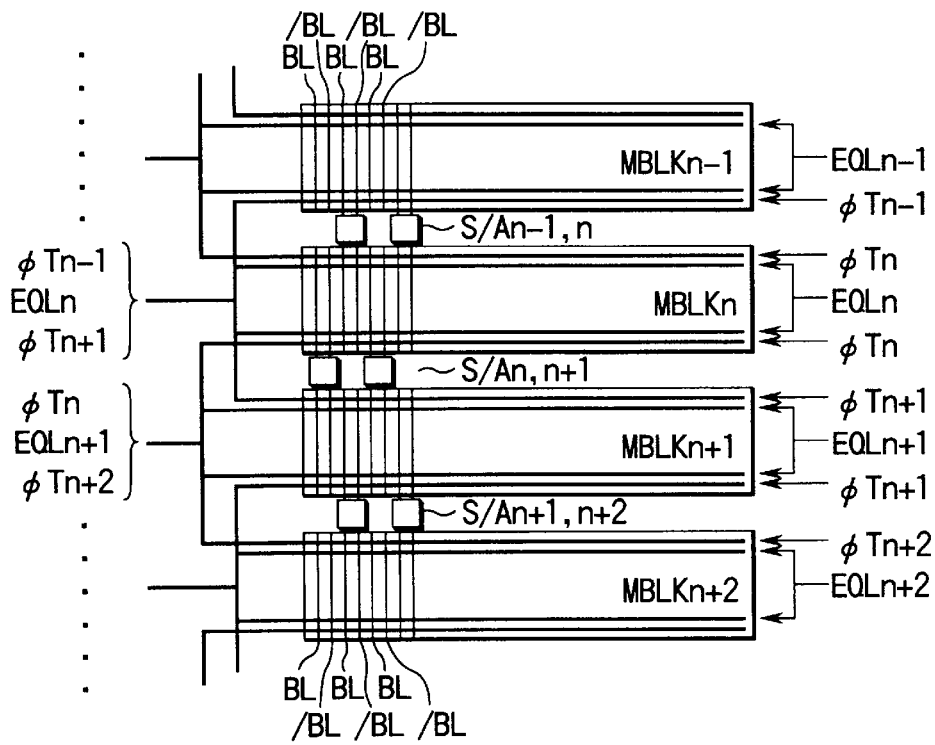
FIG. 19 shows the locations of wires supplying equalize signals and timing signals to the individual sense amplifiers.

FIG. 19 shows the location of the wires supplying the equalize signal EQLn and timing signal φT to the sense amplifiers between the memory blocks. Because the wiring is the same for each memory block, the wiring for three memory blocks MBLKn, MBLKn+1, MBLKn+2 will be explained. Sense amplifiers S/An−1,n, S/An,n+1, S/An+1, n+2 constitute shared sense amplifiers SS/A. As described earlier, the sense amplifier S/An−1,n is provided between memory block MBLKn−1 and memory block MBLKn, the sense amplifier S/An,n+1 is provided between memory block MBLKn and memory block MBLKn+1, and the sense amplifier S/An+1,n+2 is provided between memory block MBLKn+1 and memory block MBLKn+2. A bit line pair BL, /BL in an adjacent memory block is connected to each sense amplifier. An equalize signal EQLn is supplied to an equalize circuit connected to each bit line pair in the memory block MBLKn. Timing signals φTn−1, φTn+1 made up of the same signal as the equalize signal EQLn are supplied to the isolation transistors connected to the bit line pair in the memory block MBLKn−1 and the memory block MBLKn+1. An equalize signal EQLn+1 is supplied to an equalize circuit connected to each bit line pair in the memory block MBLKn+1. Timing signals φTn, φTn+2 made up of the same signal as the equalize signal EQLn+1 are supplied to the isolation transistors connected to the bit line pair in the memory block MBLKn and the memory block MBLKn+2.

Figure 20:
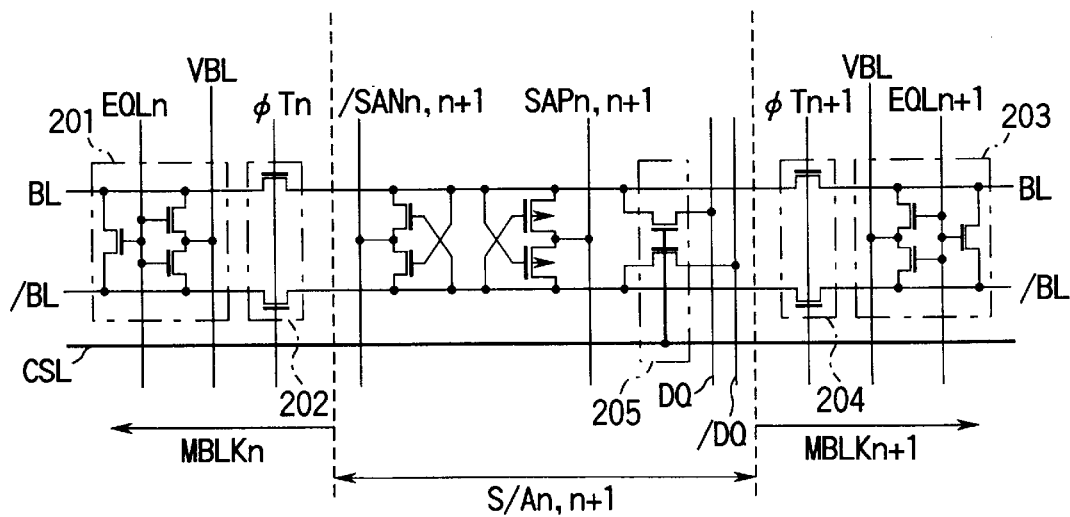
FIG. 20 is a circuit diagram of a shared sense amplifier.

FIG. 20 shows one sense amplifier S/An,n+1 and memory blocks MBLkn, MBLKn+1. An equalize signal EQLn is supplied to an equalize circuit 201 in the memory block MBLKn. A timing signal φTn is supplied to a pair of isolation transistors 202. An equalize signal EQLn+1 is supplied to an equalize circuit 203 in the memory block MBLKn+1. A timing signal φTn+1 is supplied to a pair of isolation transistors 204. Numeral 205 indicates a pair of transistors acting as a transfer gate for connecting the sense amplifier to data lines DQ, /DQ. The transistors are driven by a column select signal CSL.

Figure 21:
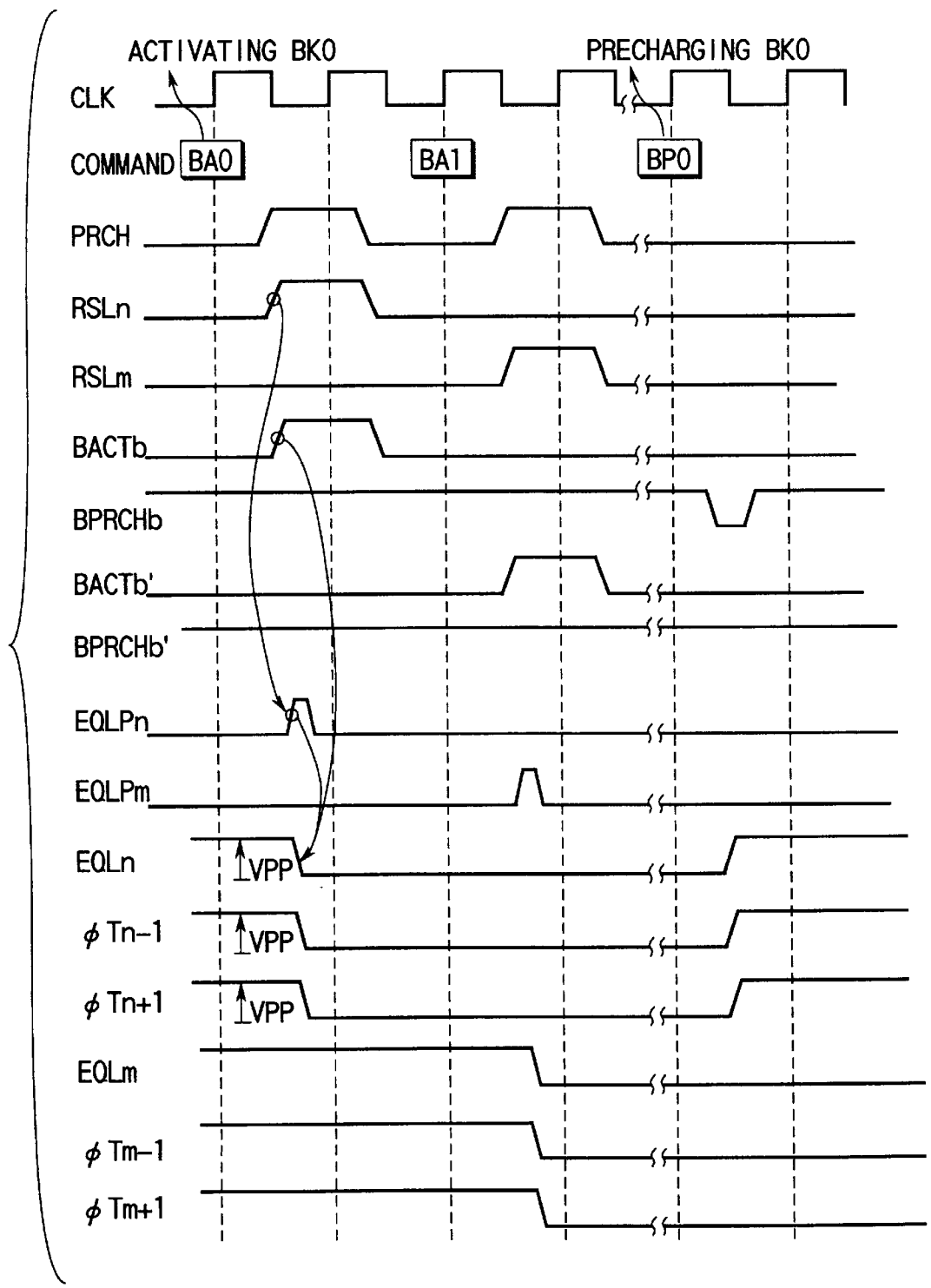
FIG. 21 is a timing chart to explain the operations of the circuits shown in FIGS. 17, 18, and 20.

FIG. 21 shows the operation of the equalize signal decoder 170 in FIG. 17 and that of the EQL and φT signal generator circuit 180 in FIG. 18. When the precharge signal PRCH and block select signal RSLn go high in response to the command for activating bank BK0, the equalize signal decoder 170 of FIG. 17 generates an equalize pulse signal EQLPn. The pulse signal EQLPn is supplied via the wiring group 22 to the EQL and φT signal generator circuit 180 of FIG. 18. In the EQL and φT signal generator circuit 180, when being unselected, the latch circuit 182g latches the high level and the equalize signal EQLn and timing signals φTn−1, φTn+1 outputted from the inverter 182i are at the high level. As a result, the equalize circuit in the memory block to which the equalize signal EQLn is supplied equalizes the bit lines, turning on the isolation transistors on both sides of the memory block, which connects the sense amplifier to the bit lines.

In this state, when the bank precharge signal BPRCHb goes high, the bank activate signal BACTb goes high, and the equalize signal decoder 170 supplies an equalize pulse signal EQLPn, the PMOS transistor 182b turns off and the NMOS transistors 182c, 182d turn on in the EQL and φT signal generator circuit 180 of FIG. 18. This causes the output of the latch circuit 182g to be reversed to the low level and the equalize signal EQLn and timing signals φTn−1, φTn+1 to go to the low level. As a result, the equalize circuit in the memory block to which the equalize signal EQLn is supplied stops equalizing the bit lines. At the same time, the isolation transistors in the memory blocks on both sides of the memory block turn off, disconnecting the sense amplifier from the bit lines.

As described above, the same timing signal as the equalize signal is supplied to the isolation transistors in the memory blocks on both sides of the memory block having the equalize circuit to which the equalize signal is supplied. Accordingly, the operation of the equalize circuit is interlocked with the operation of the isolation transistors, which makes it possible to control the equalize circuit and isolation transistors easily and reliably in the structure using shared sense amplifiers.

Figure 22:
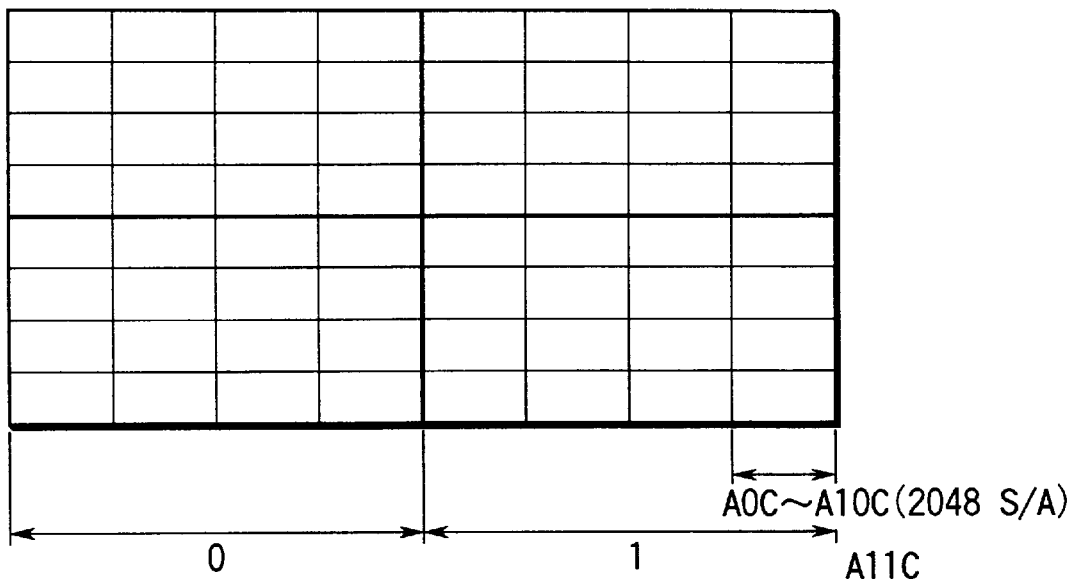
FIG. 22 is a diagram to explain the allocation of column addresses.
Figure 23:
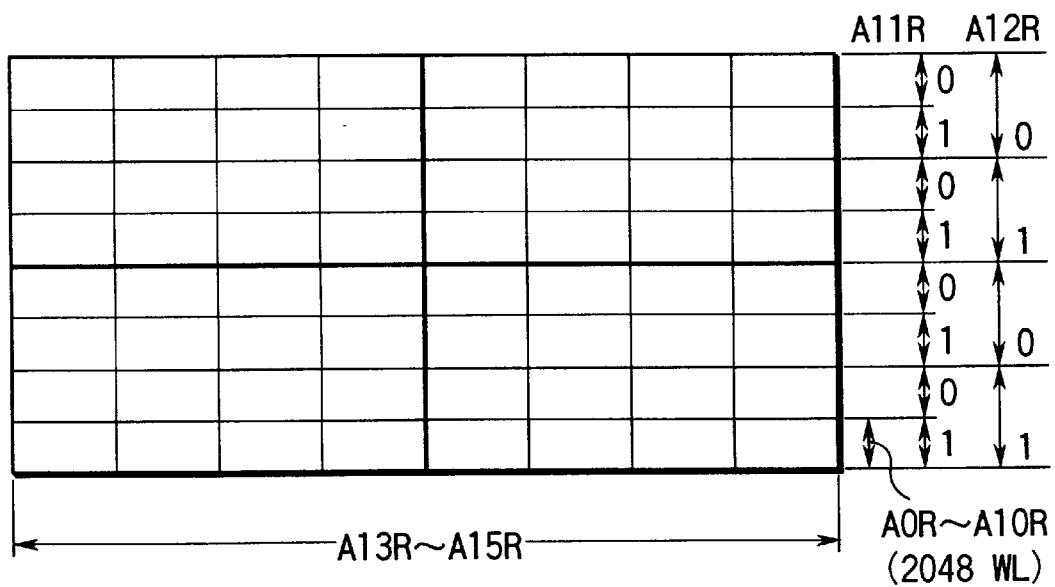
FIG. 23 is a diagram to explain the allocation of row addresses.
Figure 24:
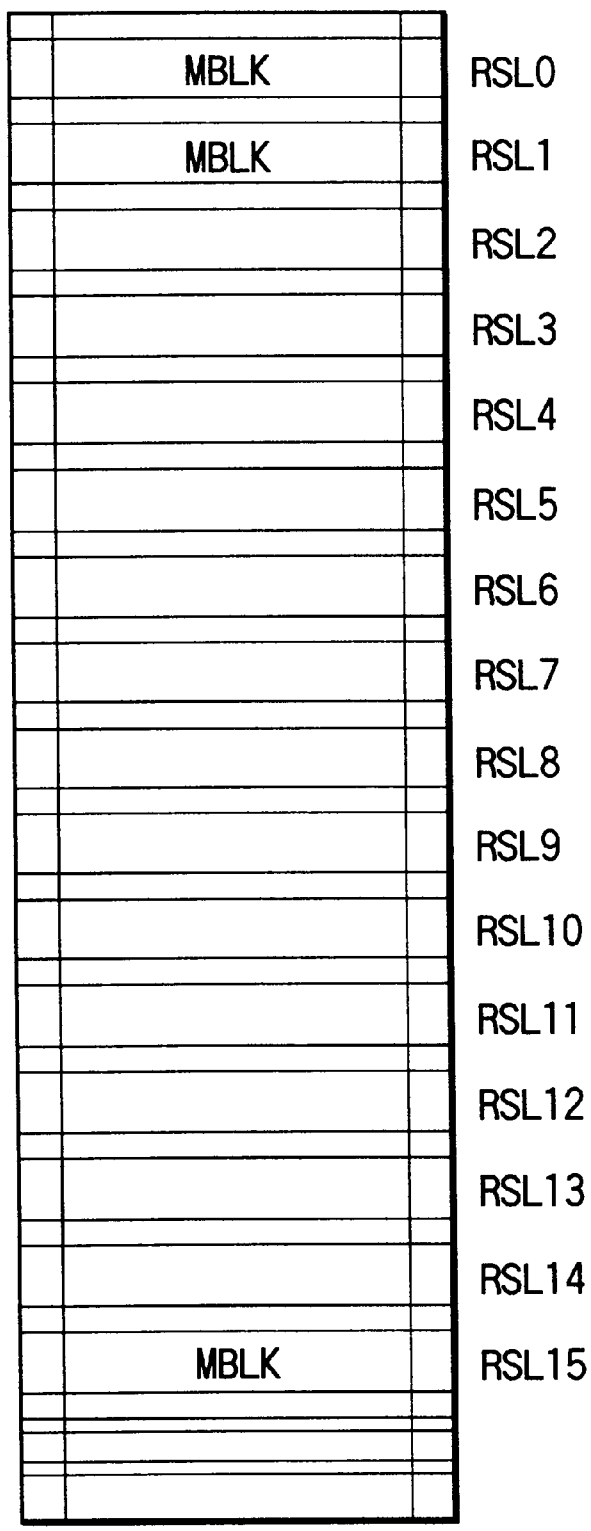
FIG. 24 is a diagram to explain a method of decoding row addresses.

FIGS. 22, 23, and 24 show the operation of the row address predecoder provided in the row decoder section. They indicates the allocation of row addresses and column addresses in a 256-Mbit DRAM. The allocation enables effective use of flexible redundancy. A column address contains 12 bits, A0C to A11C. As shown in FIG. 22, of the blocks bisected in the direction of column, one is selected using column address A11C. Then, column addresses A0C to A10C are used to select one of 2048 bit lines in each bank.

A row address contains 16 bits, A0R to A15R. As shown in FIG. 23, row addresses A13R to A15R are used to select one of eight banks. Row address A12R is used to select ⅔ of the area in the direction of row. Row address A11R is used to select ½ of the area selected using row address A12R. One word line is selected from 2048 word lines in the ⅛ area selected using row addresses A0R to A10R.

FIG. 24 shows a method of decoding row addresses. In a redundancy unit, one memory block MBLK is selected by the row block select signals RSL0 to RSL15. The row block select signals RSL0 to RSL15 are generated from row addresses A9R to A12R.

Figure 25:
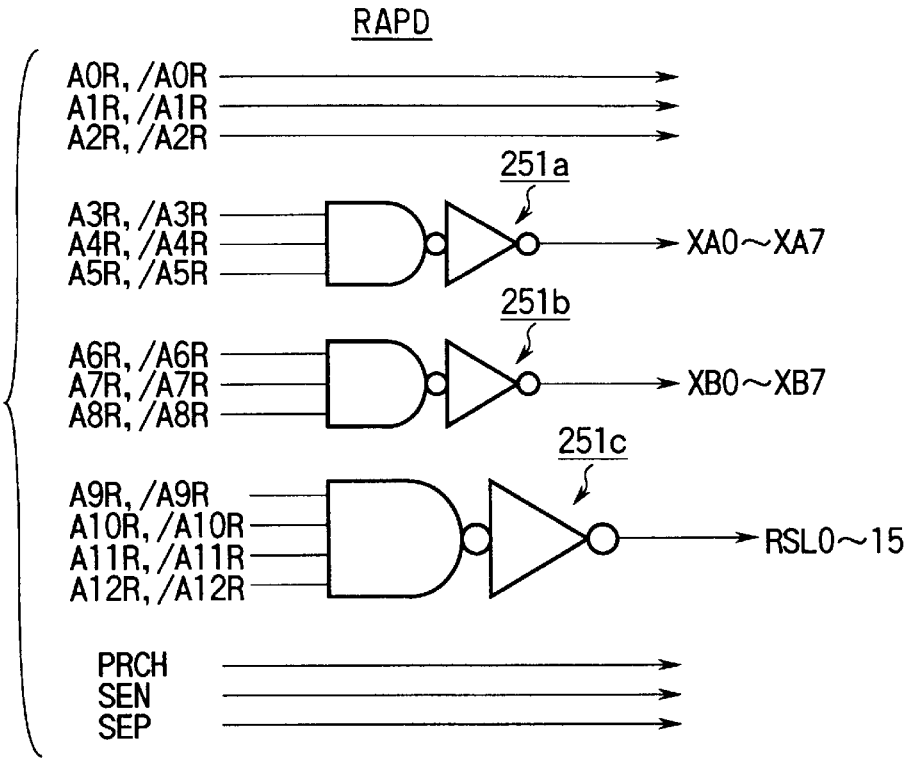
FIG. 25 is a circuit diagram of a row address predecoder.

Next, a method of decoding 512 word lines in a single memory block MBLK will be explained. FIG. 25 shows a row address predecoder RAPD. The row addresses A0R to A12R, their inverted signals /A0R to /A12R, precharge signal PRCH, sense amplifier enable signals SEN, SEP, and bank precharge signal BPRCH are supplied to the row address predecoder RAPD. The row addresses A0R to A2R, /A0R to /A2R, precharge signal PRCH, and sense amplifier enable signals SEN, SEP pass through the row address predecoder RAPD and are supplied to the row decoder RDC. A decode circuit 251a generates address signals XA0 to XA7 from row addresses A3R to A5R, /A3R to /A5R. A decode circuit 251b generates address signals XB0 to XB7 from row addresses A6R to A8R, /A6R to /A8R. A decode circuit 251c generates the row block select signals RSL0 to RSL15 from row addresses A9R to A12R.

Figure 26A:
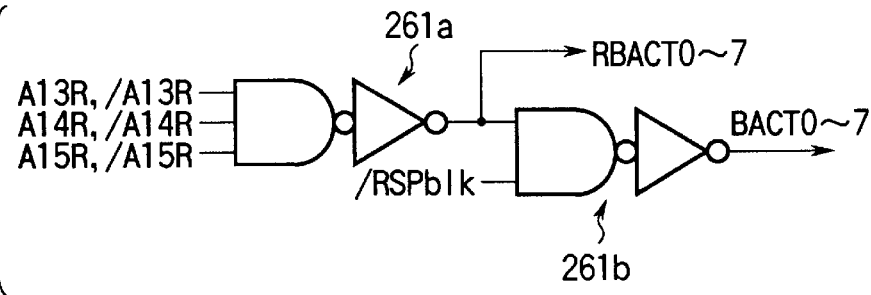
FIG. 26A is a circuit diagram of a bank activate signal generator circuit.
Figure 26B:
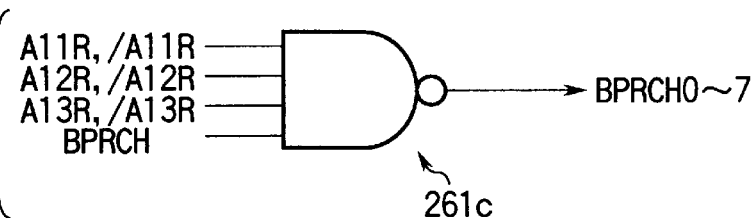
FIG. 26B is a circuit diagram of a bank precharge signal generator circuit.

FIG. 26A shows a bank activate signal generator circuit and FIG. 26B shows a bank precharge signal generator circuit. These circuits are provided, for example, in the peripheral circuit. The bank activate signal generator circuit of FIG. 26A includes a decode circuit for generating the bank activate signals BACT0 to BACT7 and redundancy bank activate signals RBACT0 to RBACT7. A decode circuit 261a generates redundancy bank activate signals RBACT0 to RBACT7 from the row addresses A13R to A15R, /A13R to /A15R. A decode circuit 261b generates bank activate signals BACT0 to BACT7 from the redundancy bank activate signals RBACT0 to RBACT7 and a coincidence sense signal /RSPblk. The coincidence sense signal /RSPblk is generated when the inputted row address coincides with the defective row address stored in the defective address storage section 29 of FIG. 2.

The coincidence sense signal /RSPblk is at the high level in the precharge state and goes low when the inputted row address coincides with the defective row address. When the coincidence sense signal /RSPblk is at the low level, the bank activate signals BACT0 to BACT7 are at the low level. As a result, when the redundancy word line is selected, the normal word lines, sense amplifiers, and equalize circuits are not activated. In this way, the circuit configuration can be simplified by controlling the bank activate signals BACT0 to BACT7 using the coincidence sense signal /RSPblk.

In the bank precharge signal generator circuit of FIG. 26B, a decode circuit 261c generates bank precharge signals BPRCH0 to BPRCH7 from the row addresses A11R to A13R, /A11R to /A13R and a bank precharge signal BPRCH explained later. Specifically, precharging is effected in a state where the row addresses A11R to A13R, /A11R to /A13R have specified a bank.

Figure 27:
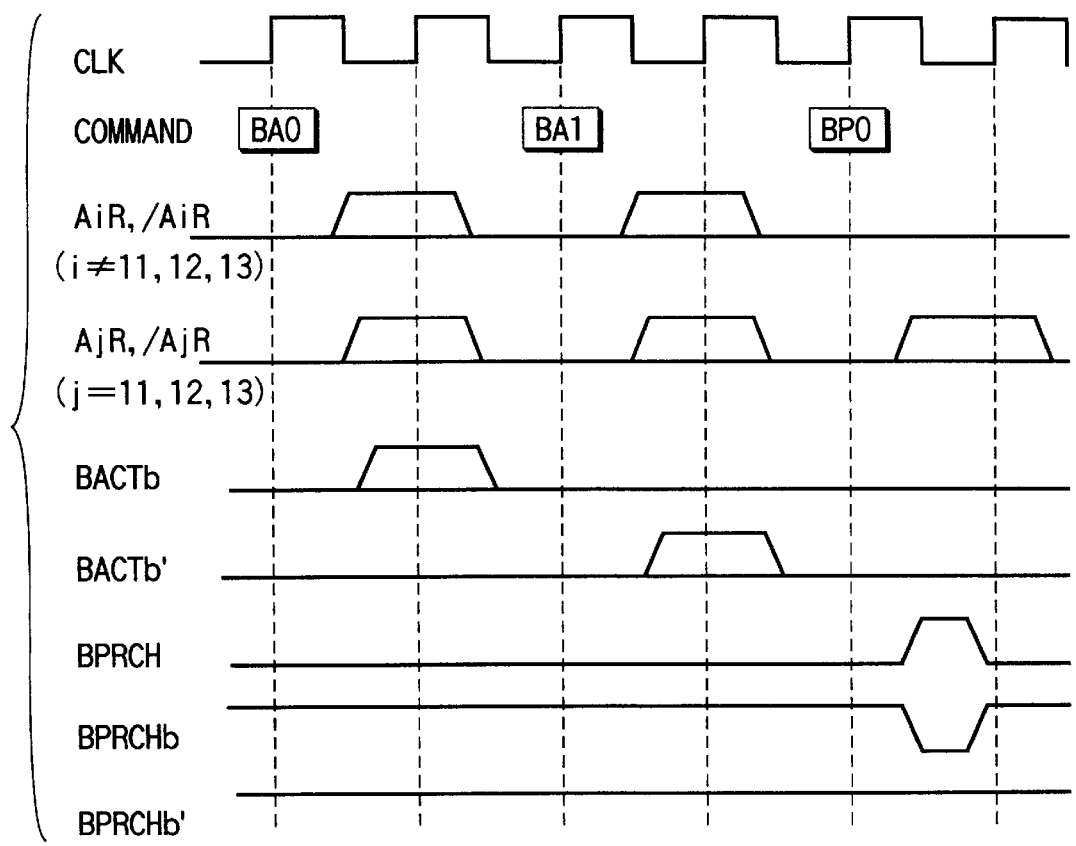
FIG. 27 is a timing chart to roughly explain the operation of the row address predecoder.

FIG. 27 schematically shows the operation of the row address predecoder RAPD of FIG. 25. In FIG. 27, when command BA0 for activating bank BK0 is inputted in synchronism with the clock signal CLK, the row address buffer drives row addresses AiR, /AiR (i≠13, 14, 15) and AjR, /AjR (j=13, 14, 15) using pulses. As a result, the bank activate signals BACTb (b=0 to 7) goes high. The bank precharge signal BPRCH is generated according to the precharge command.

As described above, in the embodiment, the row addresses have a ×1 structure and an asymmetric row-to-column ratio as shown by A0R to A15R and A0C to A11C. The structure has an address allocation for achieving efficient flexible redundancy in an 8-bank 256-Mbit DRAM and reducing the power consumption. The specifications of the device are not necessarily determined this way. Since they depend on the specifications of the memory control section, they may be determined differently. For instance, the row addresses A0R to A14R may be provided for the column addresses A0C to A12C (in this case, the row-to-column ratio is still asymmetric) or the row addresses A0R to A13R may be provided for the column addresses A0C to A13C (in this case, the row-to-column ratio is symmetric). In such a case, the unit of flexible redundancy is 8 Mbits or 4 Mbits, not 16 Mbits. Therefore, even if as many redundancy word lines as there are in the embodiment are provided, the efficiency of remedying defective word lines will decrease. Accordingly, to maintain the same yield as that of the embodiment, more redundancy word lines have to be provided, resulting in an increase in the chip size.

All the three types of address allocation are related to the ×1 bit structure. For instance, in the case of a ×16 bit structure, modification should be made by reducing the addresses as follows: A0R to A15R, A0C to A7C, A0R to A14R, A0C to A8C, A0R to A13R, A0C to A9C.

Figure 28:
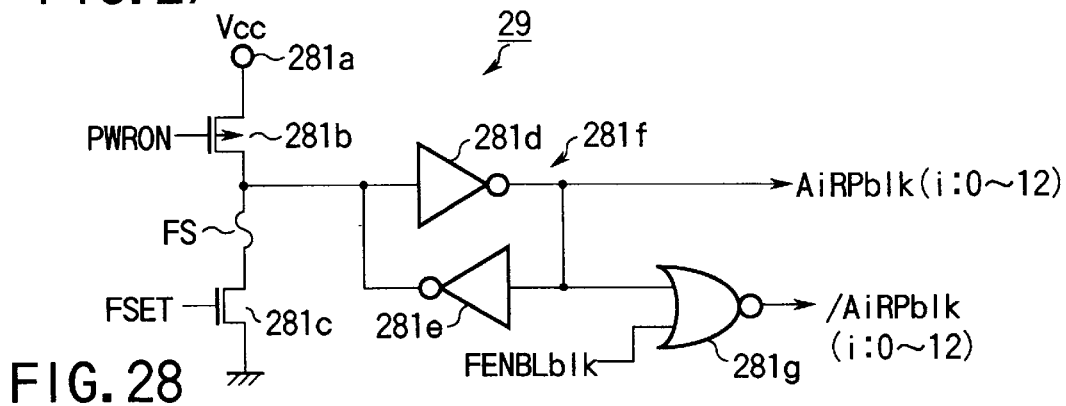
FIG. 28 is a circuit diagram of part of a defective address storage section.

FIG. 28 shows part of the defective address storage section 29 of FIG. 2. Between the ground and a terminal 281a to which the Vcc is supplied, for example, a PMOS transistor 281b, a fuse FS acting as a memory element, and an NMOS transistor 281c are connected in series. The power-on signal PWRON generated when the power supply was supplied to the DRAM is supplied to the gate of the PMOS transistor 281b. A signal FSET for setting the state of the fuse FS is supplied to the gate of the NMOS transistor 281c. The input terminal of a latch circuit 281f including inverters 281d, 281e is connected to the connection node of the PMOS transistor 281b and the fuse FS. The output terminal of the latch circuit 281f outputs the defective address signals AiRPblk (i=0 to 12) for the row programmed in the fuse FS. The defective row signal addresses AiRPblk and fuse enable signal FEBLblk are supplied to the input terminal of a NOR circuit 281g. The NOR circuit 281g outputs defective address signals /AiRPblk (i=0 to 12) at its output terminal.

There are 13 units of the circuit shown in FIG. 28 for a single redundancy word line. The fuse enable signal FENBLblk is a signal that goes low or high, depending on whether or not the fuse is programmed. The fuse enable signal FENBLblk is generated by the following circuit.

Figure 29:
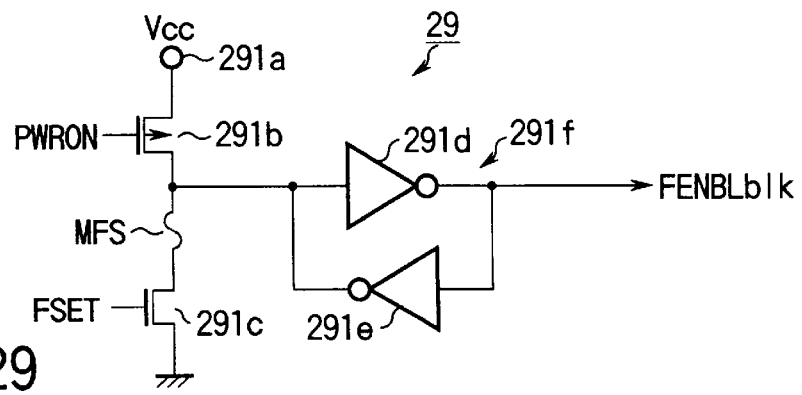
FIG. 29 is a circuit diagram of part of a defective address storage section.

FIG. 29 shows a circuit for generating the fuse enable signal FENBLblk. Between the ground and a terminal 291a to which the power supply voltage Vcc is supplied, a PMOS transistor 291b, a master fuse MFS acting as a memory element, and an NMOS transistor 291c are connected in series. The power on signal PWRON is supplied to the gate of the PMOS transistor 291b. A signal FSET for setting the state of the master fuse MFS is supplied to the gate of the NMOS transistor 291c. The input terminal of a latch circuit 291f including inverters 291d, 291e is connected to the connection node of the PMOS transistor 291b and the master fuse MFS. The output of the latch circuit 291f outputs a fuse enable signal FENBLblk.

There are 14 circuits with fuses for a single redundancy word line, including the circuit for generating the fuse enable signal FENBLblk. Whether or not the redundancy circuit is used is determined, depending on whether the master fuse MFS is flown.

Figure 30:
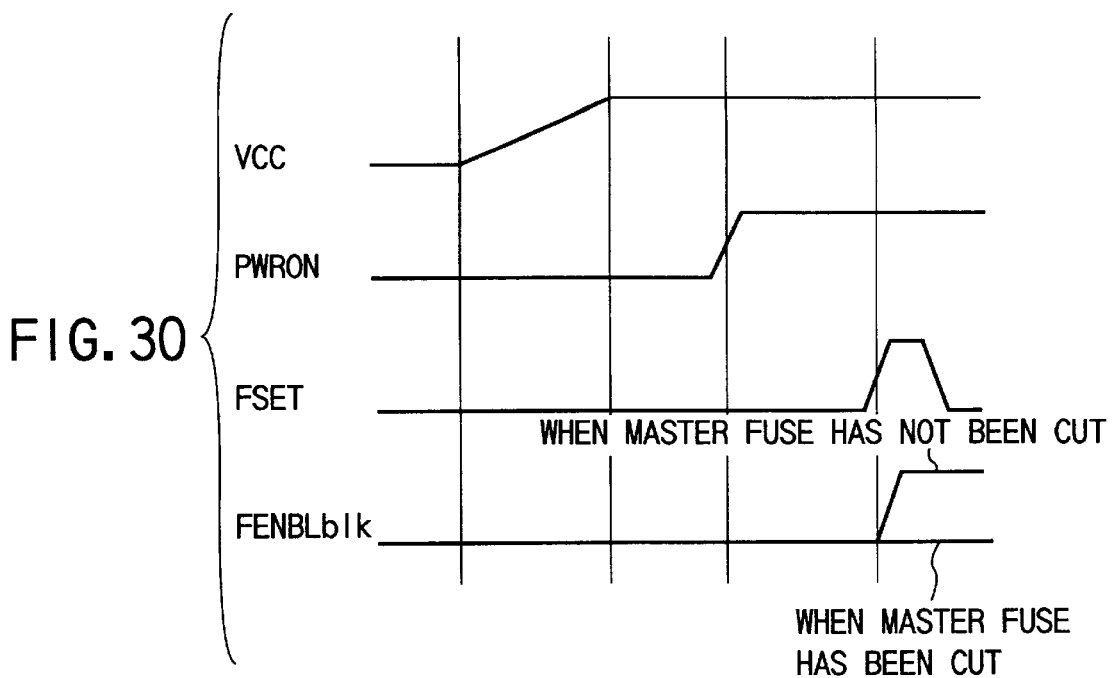
FIG. 30 is a timing chart for the operation of FIG. 29.

FIG. 30 shows the operation of the defective address storage section 29. When the power supply of the DRAM is turned on and the power supply voltage Vcc has become stable, the power-on signal PWRON goes high. In FIG. 29, when the power supply voltage Vcc becomes constant and the power-on signal PWRON is at the low level, the latch circuit 291f latches the high level. In this state, when the signal FSET is supplied, the NMOS transistor 291c turns on. At this time, when the master fuse has been cut, the output signal of the latch circuit 291f is inverted and the fuse enable signal FENBLblk goes low. When the master fuse has not been cut, the fuse enable signal FENBLblk outputted from the latch circuit 291f remains high.

The circuit shown in FIG. 28 operates in the same manner as the circuit in FIG. 29. Specifically, when the fuse FS has been cut according to the signal FSET, the address signal AiRPblk outputted from the latch circuit 281f goes low. When the fuse FS has not been cut, the address signal AiRPblk remains high. When the master fuse MFS has been cut, the fuse enable signal FENBLblk is at the low level, which allows the address signal /AiRPblk outputted from the NOR circuit 281g to be at the high or low level according to the output signal from the latch circuit 281f. When the master fuse MFS has not been cut, the fuse enable signal FENBLblk is at the high level, so that the address signal /AiRPblk outputted from the NOR circuit 281g is always at the low level. Specifically, when neither the master fuse MFS nor the fuse FS has not been cut, all of the address signals A0RPblk to A12RPblk, /A0RPblk to /A12RPblk are at the low level. Consequently, the signal /RSPblk remains high.

Figure 31:
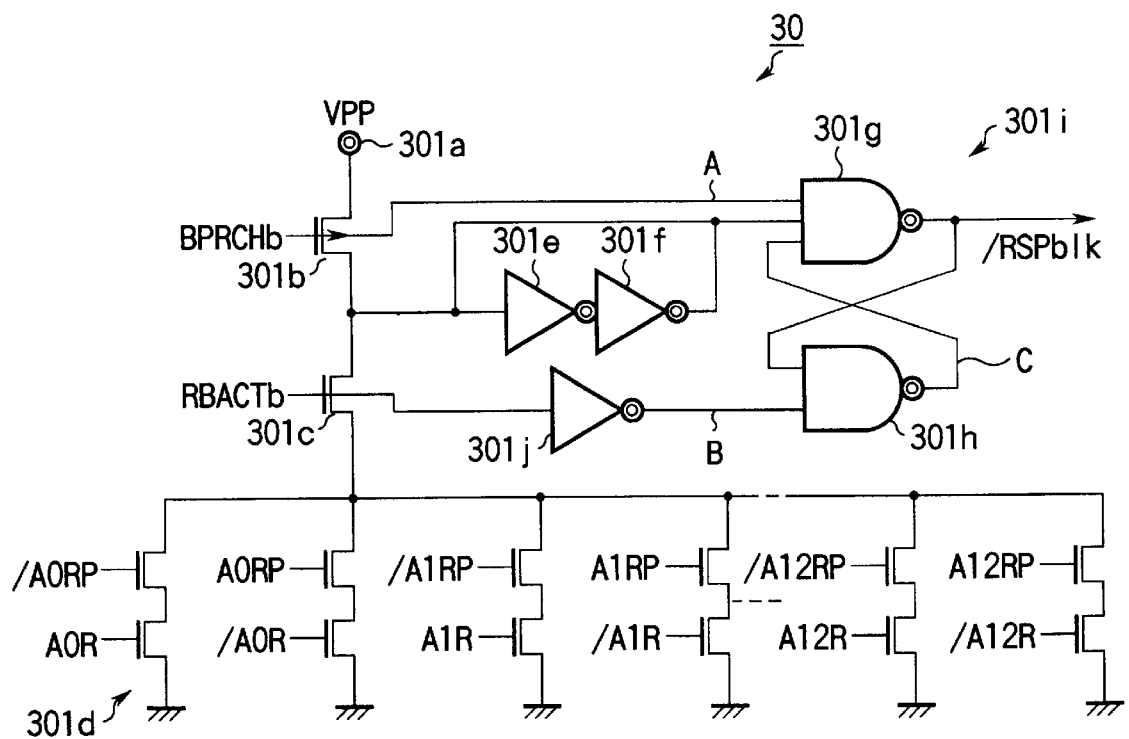
FIG. 31 is a circuit diagram of part of an address comparison circuit.

FIG. 31 shows part of the address comparison circuit 30 of FIG. 2. The circuit shown in FIG. 31 is provided for each redundancy word line in each bank. One end of the current path of a PMOS transistor 301b is connected to a terminal 301a to which the stepped-up power supply VPP is supplied. A bank precharge signal BPRCHb is supplied to the gate of the PMOS transistor 301b. One end of the current path of an NMOS transistor 301c is connected to the other end of the current path of the PMOS transistor 301b. The redundancy bank activate signal RBACTb supplied from the row address predecoder RAPD is supplied to the gate of the NMOS transistor 301c. Between ground and the other end of the current path of the NMOS transistor 301c, more than one address input circuit 301d including two NMOS transistors connected in series is connected. The row addresses A0R to A12R, /A0R to /A12R and A0RP to A12RP, /A0RP to /A12RP are supplied to the gates of the transistors comprising the address input circuits 301d. The A0RP to A12RP, /A0RP to /A12RP are the defective row address signals A0RPblk to /A12RPblk outputted from the defective address storage section 29. The connection node of the PMOS transistor 301b and NMOS transistor 301c is connected to a first input terminal of a NAND circuit 301g comprising a flip flop circuit 301i, and connected via inverter circuits 301e, 301f connected in series. The bank precharge signal BPRCHb is supplied to a second input terminal of the NAND circuit 301g. A third inut terminal of the NAND circuit 301g is connected to the output terminal of a NAND circuit 301h. The redundancy bank activate signal RBACTb is supplied via an inverter circuit 301j to a first input terminal of the NAND circuit 301h. A second input terminal of the NAND circuit 301h is connected to the output terminal of the NAND circuit 301g. The NAND circuit 301g outputs a coincidence sense signal /RSPblk at its output terminal. Here, the number of banks is 0 to 7 (b=0 to 7), the number of blocks is 0 or 1 (l=0 or 1), and the number of redundancy word lines is 0 to 32 (k=0 to 32).

Figure 32:
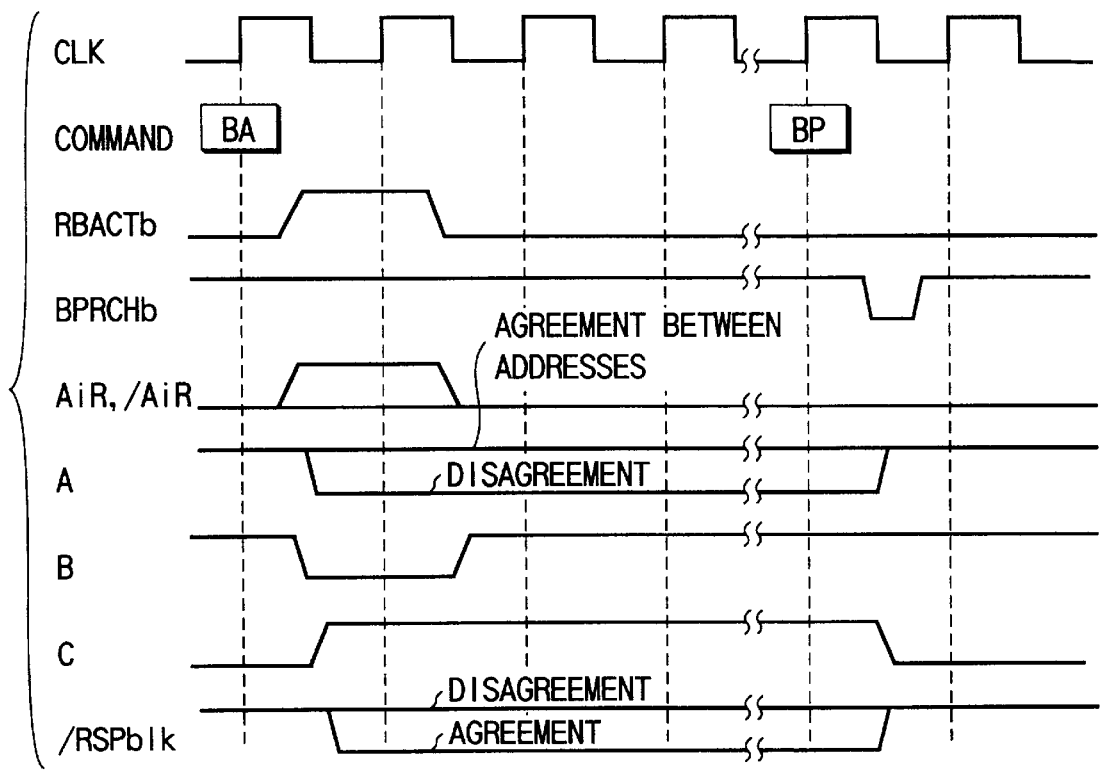
FIG. 32 is a timing chart for the operation of FIG. 31.

FIG. 32 shows the operation of the address comparison circuit 30. In the address comparison circuit 30, the coincidence sense signal /RSPblk outputted from the flip flop circuit 301i is at the high level in the precharge state before the supply of command BA for activating a bank. In this state, when the command BA is supplied, the redundancy bank activate signal RBACTb goes high and the NMOS transistor 301c turns on. As a result, the row address signals A0R, /A0R to A12R, /A12R, and the defective row address signals /A0RP, A0RP to /A12RP, A12RP are supplied to more than one address input circuit 301d.

When the row address coincides with the defective address, both of the NMOS transistors of the address input circuit 301d turn off. As a result, the input condition for the NAND circuit 301d of the flip flop circuit 301i is fulfilled, reversing the flip flop circuit 301i, which makes the coincidence sense signal /RSPblk low.

When the row address does not coincide with the defective address, both of the NMOS transistors of the address input circuit 301d turn on. As a result, the flip flop circuit 301i is not reversed, allowing the coincidence sense signal /RSPblk to remain high. The coincidence sense signal /RSPblk is supplied to the redundancy word line drive circuit RWLD.

Figure 33:
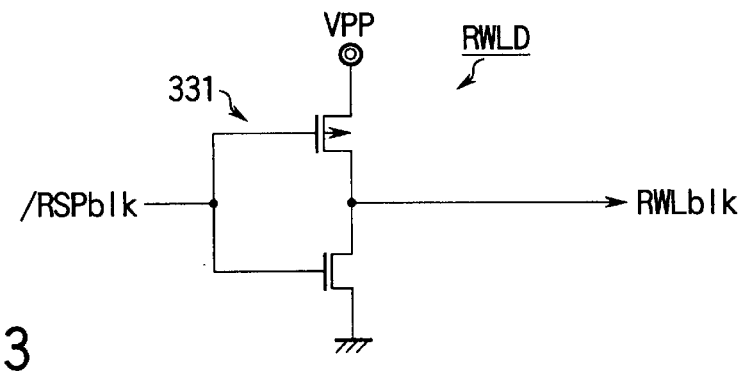
FIG. 33 is a circuit diagram of a redundancy word line drive circuit.

FIG. 33 shows the structure of the redundancy word line drive circuit RWLD. The redundancy word line drive circuit RWLD includes an inverter circuit 331 driven by the stepped-up voltage VPP. The coincidence sense signal /RSPblk is supplied to the input terminal of the inverter circuit 331. The output terminal of the inverter circuit 331 is connected to the redundancy word line RWLblk. As a result, when the coincidence sense signal /RSPblk goes low, the redundancy word line drive circuit RWLD drives the redundancy word line RWLblk using the voltage VPP.

Figure 34:
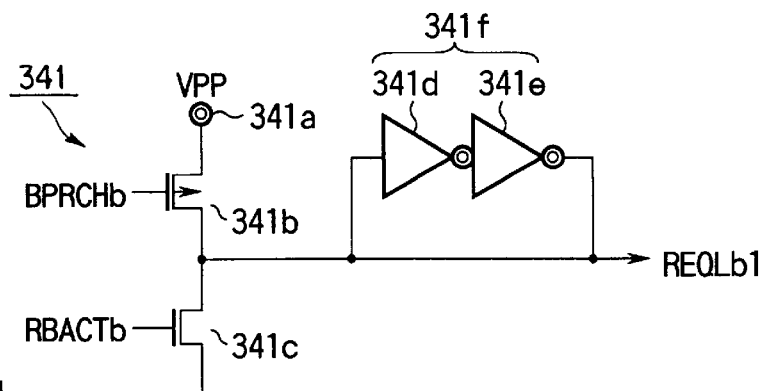
FIG. 34 is a circuit diagram of an equalize signal generator circuit for redundancy cell array.

FIG. 34 shows a redundancy cell array equalize signal generator circuit 341 provided in a sense amplifier RS/A for redundancy array only. In the equalize signal generator circuit 341, a PMOS transistor 341b and an NMOS transistor 341c are connected in series between ground and a terminal 341a to which the voltage VPP is supplied. The bank precharge signal BPRCHb is supplied to the gate of the PMOS transistor 341b. The redundancy bank activate signal RBACTb is supplied to the gate of NMOS transistor 341c. The input and output terminals of a latch circuit 341f including inverter circuits 341d, 341e connected in series are connected to the connection node of the PMOS transistor 341b and NMOS transistor 341c. A redundancy equalize signal REQLb1 is outputted at the connection node.

In the redundancy equalize signal generator circuit 341, when the bank precharge signal BPRCHb goes low momentarily, the PMOS transistor 341b turns on and the latch circuit 341f remains high. As a result, the redundancy equalize signal REQLb1 goes high at the time of precharging. In this state, when the redundancy bank activate signal RBACTb goes high, the NMOS transistor 341c turns on, causing the latch circuit 341f to latch the low level. Consequently, when the bank is activated, the redundancy equalize signal REQLb1 is always at the high level, which stops equalizing the bit lines.

The equalization may be stopped when one of the 32 redundancy word lines is selected according to the result of comparison at the address comparison circuit. In this case, however, a long time is required to calculate the logical add of the results of comparing 32 addresses, resulting in a decrease in the operation speed. Therefore, this method is not desirable. In the embodiment, the operation speed is given priority.

Figure 35:
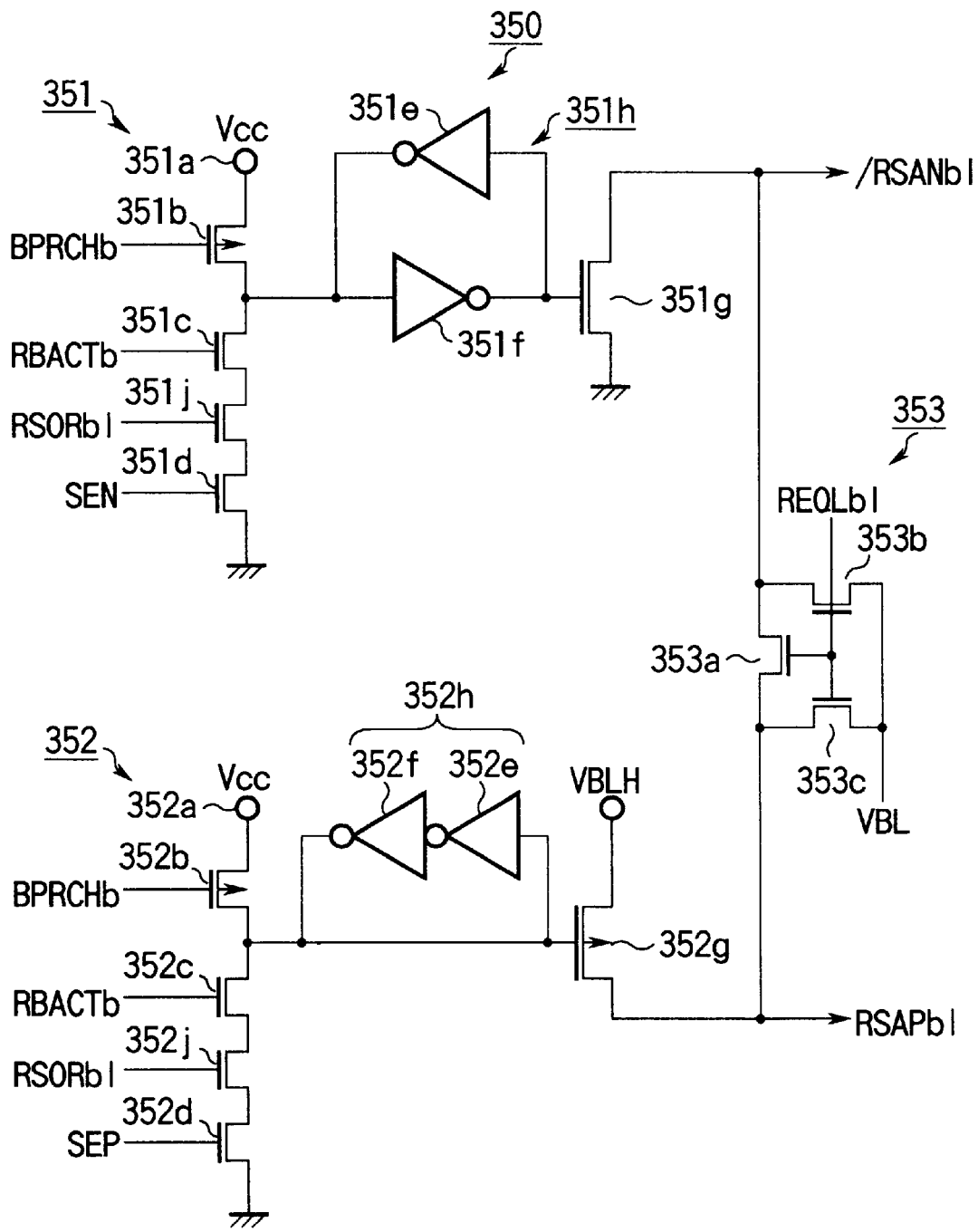
FIG. 35 is a circuit diagram of a redundancy sense amplifier drive circuit.

FIG. 35 shows a redundancy sense amplifier drive circuit 350. The circuit 350 comprises a sense amplifier activate signal generator circuit 351 on the NMOS sense amplifier side, a sense amplifier activate signal generator circuit 352 on the PMOS sense amplifier side, and an equalize circuit 353 for equalizing the output voltages of the signal generator circuits 351, 352.

In the sense amplifier activate signal generator circuit 351, the power supply Vcc is supplied to a terminal 351a. Between the terminal 351a and ground, a PMOS transistor 351b and NMOS transistors 351c, 351j, 351d are connected in series. The bank precharge signal BPRCHb is supplied to the gate of the PMOS transistor 351b. The redundancy bank activate signal RBACTb is supplied to the gate of the NMOS transistor 351c. A signal RSORb1 is supplied to the gate of the NMOS transistor 351j. The sense amplifier enable signal SEN is supplied to the gate of the NMOS transistor 351d. The signal RSORb1 is the calculation output of a logical add of the results of comparing 32 addresses. Since there is time until the sense amplifier is activated, it is possible to calculate the logical add of the results of comparing 32 addresses.

The output terminal of an inverter circuit 351e and the input terminal of an inverter circuit 351f are connected to the connection node of the PMOS transistor 351b and NMOS transistor 351c. The input terminal of the inverter circuit 351e and the output terminal of the inverter circuit 351f are connected to the gate of the NMOS transistor 351g. The source of the NMOS transistor 351g is connected to ground. The drain of the NMOS transistor 351g outputs a redundancy sense amplifier activate signal /RSANb1. The inverter circuits 351e, 351f comprise a latch circuit 351h.

In the sense amplifier activate signal generator circuit 352, the power supply voltage Vcc is supplied to a terminal 352a. Between the terminal 352a and ground, a PMOS transistor 352b and NMOS transistors 352c, 352j, 352d are connected in series. The bank precharge signal BPRCHb is supplied to the gate of the PMOS transistor 352b. The redundancy bank activate signal RBACTb is supplied to the gate of the NMOS transistor 352c. The signal RSORb1 is supplied to the gate of the NMOS transistor 352j. The sense amplifier enable signal SEP is supplied to the gate of the NMOS transistor 352d.

The connection node of the PMOS transistor 352b and NMOS transistor 352c is connected to an input terminal of an inverter circuit 352e and an output terminal of the inverter circuit 352f. The output terminal of the inverter circuit 352e is connected to the input terminal of an inverter circuit 352f. The connection node of the PMOS transistor 352b and NMOS transistor 352c is connected to the gate of a PMOS transistor 352g. A voltage VBLH is supplied to the source of the PMOS transistor 352g. The drain of the PMOS transistor 352g outputs the redundancy sense amplifier activate signal RSAPb1. The inverter circuits 352e, 352f comprise a latch circuit 352h.

In the equalize circuit 353, the redundancy equalize signal REQLb1 is supplied to the gates of NMOS transistors 353a, 353b, 353c. The current path of the NMOS transistor 353a is connected between the drain of the NMOS transistor 351g and the drain of the PMOS transistor 352g. One end of the current path of the NMOS transistor 353b is connected to the drain of the NMOS transistor 351g. The voltage VBL is supplied to the other end of the current path of transistor 353b. One end of the current path of the NMOS transistor 353c is connected to the drain of the PMOS transistor 352g. The voltage VBL is supplied to the other end of the current path of transistor 353c.

In the redundancy sense amplifier drive circuit 350 constructed as described above, when the redundancy bank activate signal RBACTb, sense amplifier enable signals SEN, SEP, and signal RSORb1 go high, the output signals of the latch circuits 351h, 352h are inverted, turning on the NMOS transistor 351g and PMOS transistor 352g. As a result, the NMOS transistor 351g and PMOS transistor 352g output the redundancy sense amplifier activate signals /RSANb1, RASPb1. Before the redundancy sense amplifier activate signals /RSANb1, RASPb1 are outputted, the equalize circuit 353 has stopped equalization.

Figure 36:
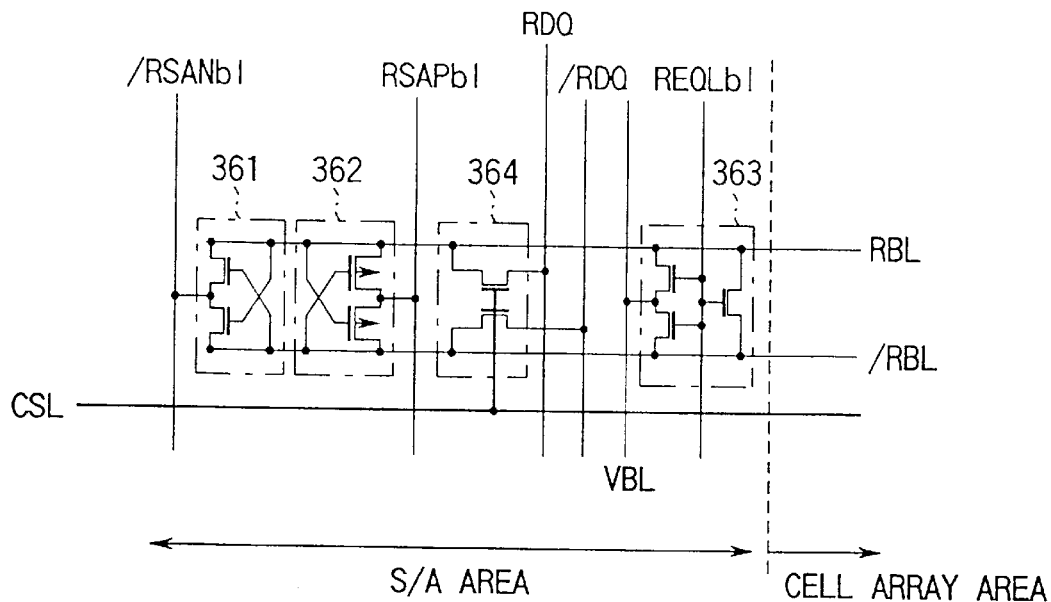
FIG. 36 is a circuit diagram of a redundancy cell array sense amplifier.

FIG. 36 shows a redundancy cell array sense amplifier. The sense amplifier has the same structure as that of an ordinary sense amplifier except that there is no isolation transistor for connecting and disconnecting the redundancy bit line pair to and from the sense amplifier. The redundancy sense amplifier activate signals /RSANb1, RASPb1 are supplied to a sense amplifier 361 including NMOS transistors and a sense amplifier 362 including PMOS transistors, respectively. The redundancy equalize signal REQLb1 is supplied to an equalize circuit 363 for equalizing a redundancy bit line pair RBL, /RBL. Numeral 364 indicates a pair of transistors for connecting the sense amplifier to redundancy data lines RDQ, /RDQ. The transistor 364 is driven by a column select signal CSL.

When the redundancy cell array is activated, the redundancy cell array sense amplifier senses and amplifies the data read onto the redundancy bit line pair RBL, /RBL and outputs the amplified signals to the redundancy data lines RDQ, /RDQ.

With the first embodiment, the row decoder, word line drive circuit decoder, sense amplifier decoder, and equalize signal decoder (including the timing signal φT), which were provided in each bank in the prior art, are concentrated in the decoder sections RDC0, RDC1 and these decoder sections are shared by the individual banks. This eliminates the need of providing decoders between the banks, reducing the area occupied by the decoders, which helps make the chip size smaller.

In the multibank DRAM, use of the shared sense amplifier system makes the chip size smaller.

Because the select signal MWLnk that is outputted from the decode section and supplied to each bank, the main word line drive pulse signal MWDRVnj, the sense amplifier enable pulse signals SENPn,n+1, SEPPn,n+1, and the equalize pulse signal EQLPn are pulse signals of the power supply voltage Vcc, it is possible to reduce the power consumption and achieve a high-speed operation.

Furthermore, because each bank has latch circuits for latching the above pulse signals and controls the operation of each circuit by using the output signals from the latch circuits, a reliable operation is achieved.

While the bank is being activated, the main word line drive pulse signal MWDRVnj is not constantly at a high level and is at a low level in the wait state. Therefore, an advantage is that even if wires are short-circuited in the cell array, current will not flow during standby.

Furthermore, the first- and third-layer metal wires may be provided at right angles with the second- and fourth-layer metal wires by, for example, using the first-layer metal wires made of tungsten as bit lines, the second-layer metal wires as word lines WL and data lines DQ, /DQ, the third-layer metal wires as column select lines CSL, main data lines MDQ, /MDQ, and wiring groups 26, 27, and the fourth-layer metal wires as main word lines MWLn and wiring group 22. This reduces parasitic capacitance between wires, which enables high-speed transfer of signals and the reduction of the chip size.

Moreover, providing a redundancy cell array R/D for each bank makes the ratio of row addresses to column addresses asymmetric. This helps achieve flexible redundancy efficiently.

The address comparison circuit 30 compares the defective address stored in the defective address storage section 29 with the inputted row address. When they coincide, the comparison circuit 30 selects the redundancy array R/D. In the prior art, at that time, the row decoder was inhibited from being selected. In the illustrative embodiment of the present invention, however, the coincidence sense signal /RSPblk of the address comparison circuit 30 makes the bank activate signal BACTb low, deactivating the bank, which inhibits the memory cell block MBLK from being selected. Consequently, even with the structure where the row decoder sections RDC0, RDC1 are provided apart from each bank, the defective row can be replaced with a redundancy row reliably without increasing the chip size.

Figure 37:
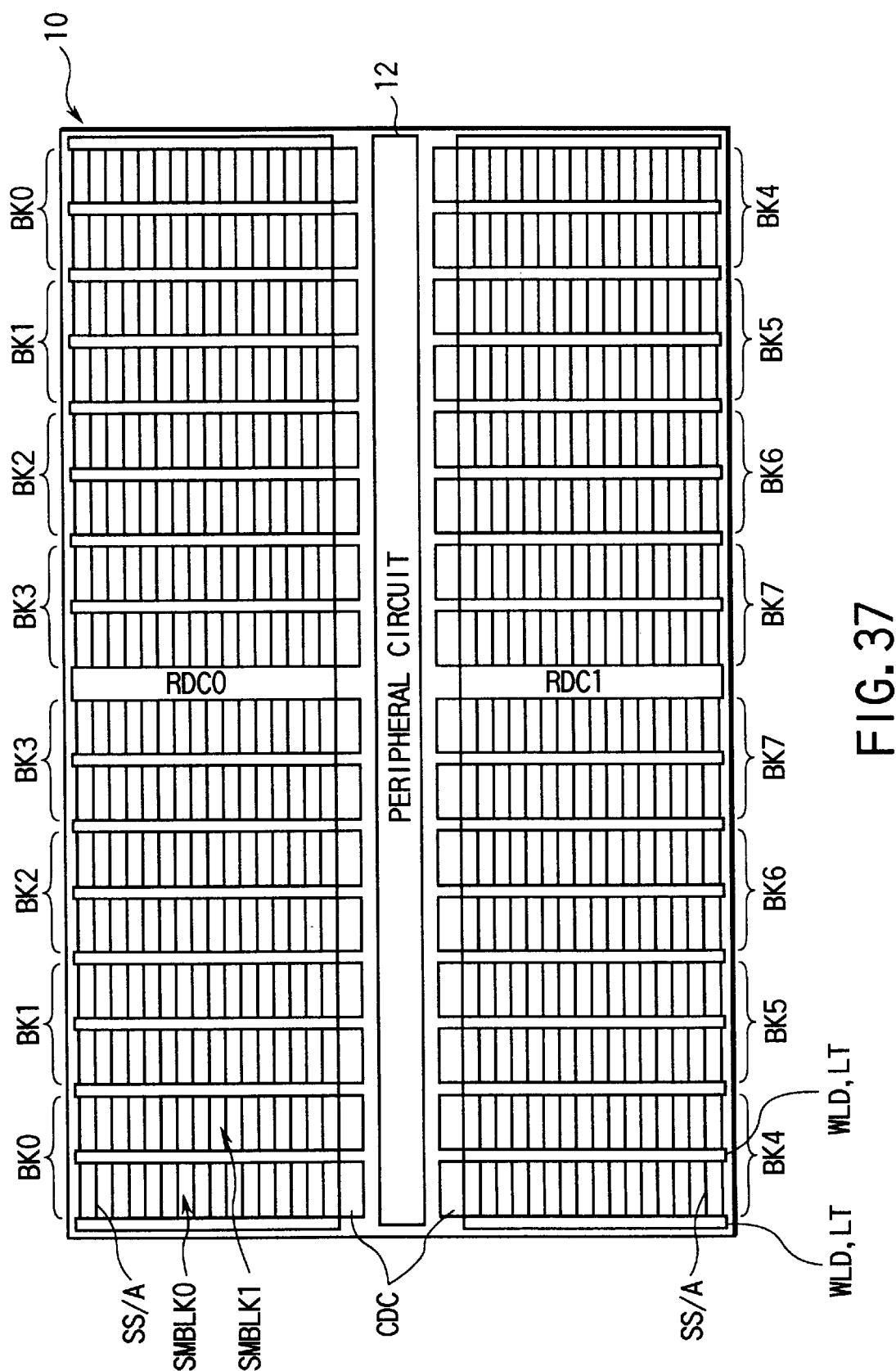
FIG. 37 is a plan view of a semiconductor chip according to a second embodiment of the present invention.

FIG. 37 shows a second embodiment of the present invention. In FIG. 37, the same parts as those in the first embodiment are indicated by the same reference symbols. Only the difference between the second embodiment and the first embodiment will be explained. In FIG. 37, each memory cell block and shared sense amplifier SS/A in the banks BK0 to BK7 are divided into two equal parts in the direction perpendicular to the word line, which forms two submemory cell blocks SMBLK0, SMBLK1. Between the submemory cell blocks SMBLK0, SMBLK1, a word line drive circuit WLD and a latch circuit LT are provided.

Figure 39:
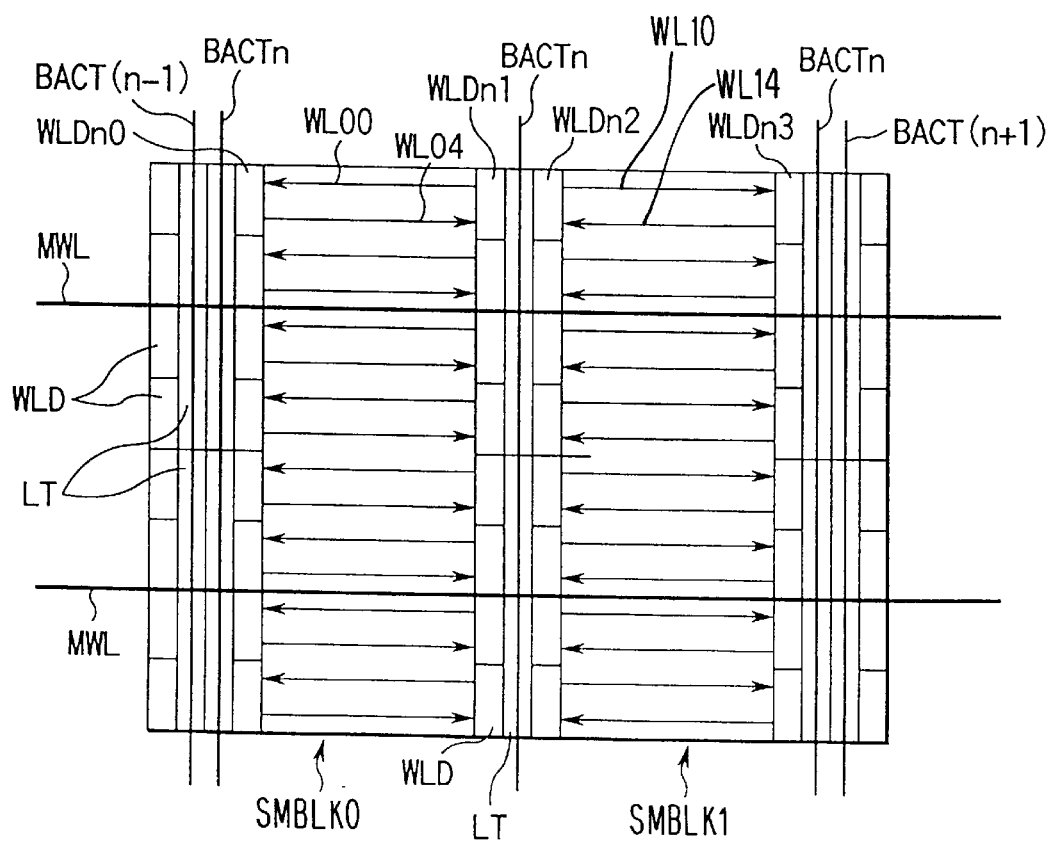
FIG. 39 shows the principal portion of FIG. 38 and the wiring layout.
Figure 38:
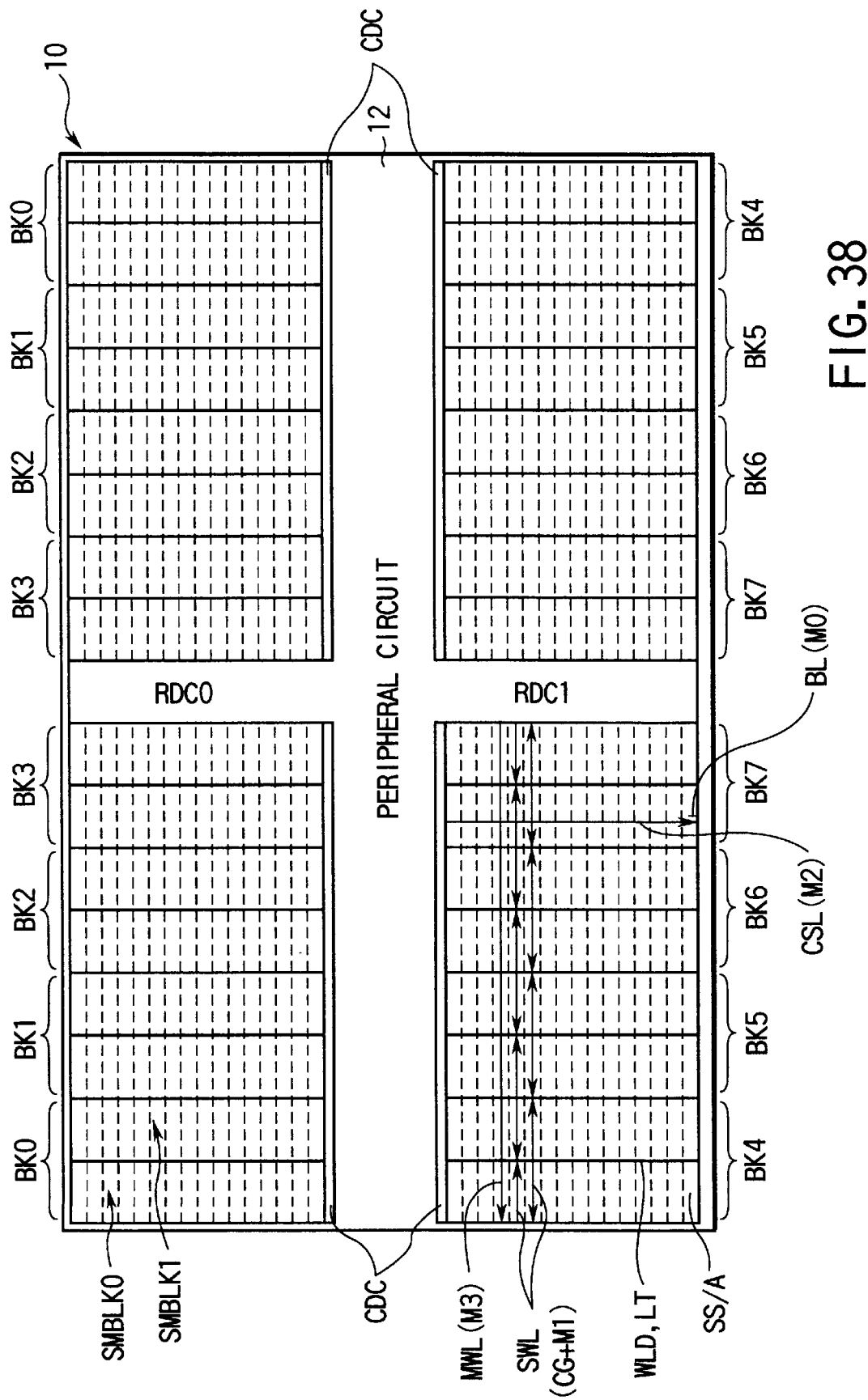
FIG. 38 is a schematic plan view of the wiring layout of FIG. 37.

FIGS. 38 and 39 schematically show the wiring layout of FIG. 37. Word lines WL provided in the submemory cell blocks SMBLK0, SMBLK1 are connected to the word line drive circuits WLDs on both sides of the blocks SMBLK0, SMBLK1 in such a manner that adjacent word lines WL are connected alternately to the blocks SMBLK0, SMBLK1. For example, as shown in FIG. 39, the word line WL00 for the sub memory cell block SMBLK0 is connected to the word line drive circuit WLDn1 and the word line WL04 is connected to the word line drive circuit WLDn0. Similarly, the word lines in the submemory cell block SMBLK0 are connected alternately to the word line drive circuits WLDn0, WLDn1. The word line WL10 for the sub memory cell block SMBLK1 is connected to the word line drive circuit WLDn2 and the word line WL14 is connected to the word line drive circuit WLDn3. Similarly, the word lines in the submemory cell block SMBLK1 are connected alternately to the word line drive circuits WLDn2, WLDn3.

In FIG. 38, too, for example, a four-layer metal wiring structure is used as in the first embodiment. Specifically, the bit lines BL include first-layer metal wires (M0), the word lines SWLs include polysilicon acting as control gates (CG) and second-layer metal wires (M1) shunted to the polysilicon, the column select lines CSLs and data lines (not shown) are composed of third-layer metal wires (M2), and the main word lines MWLs connected to the decoder sections RDC0, RDC1 and wires for transferring sense amplifier activate pulse signals and equalize pulse signals (not shown) include fourth-layer wires (M3). The wiring layout is not restricted to this. For instance, wires (M2, M3) may be replaced with each other.

Figure 40:
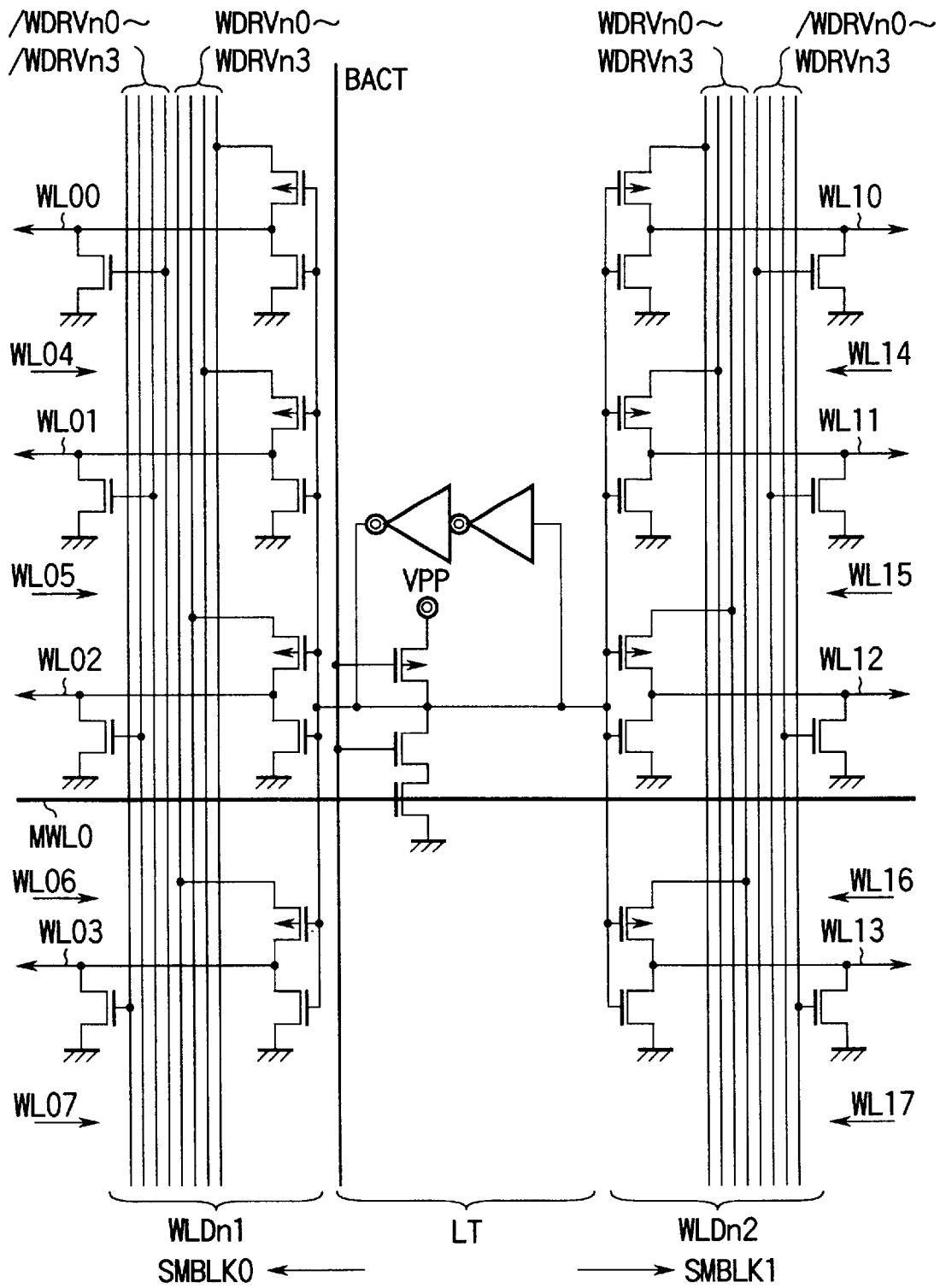
FIG. 40 is a circuit diagram of the word line drive circuit and a latch circuit in a bank.

FIG. 40 shows word line drive circuits WLDn1, WLDn2 and a latch circuit LT provided between the submemory cell blocks SMBLK0, SMBLK1 in a bank. In this case, a single latch circuit LT controls the operations of the word line drive circuits WLDn1, WLDn2. The operation of these circuits is almost the same as that of the circuit shown in FIG. 6.

Figure 41:
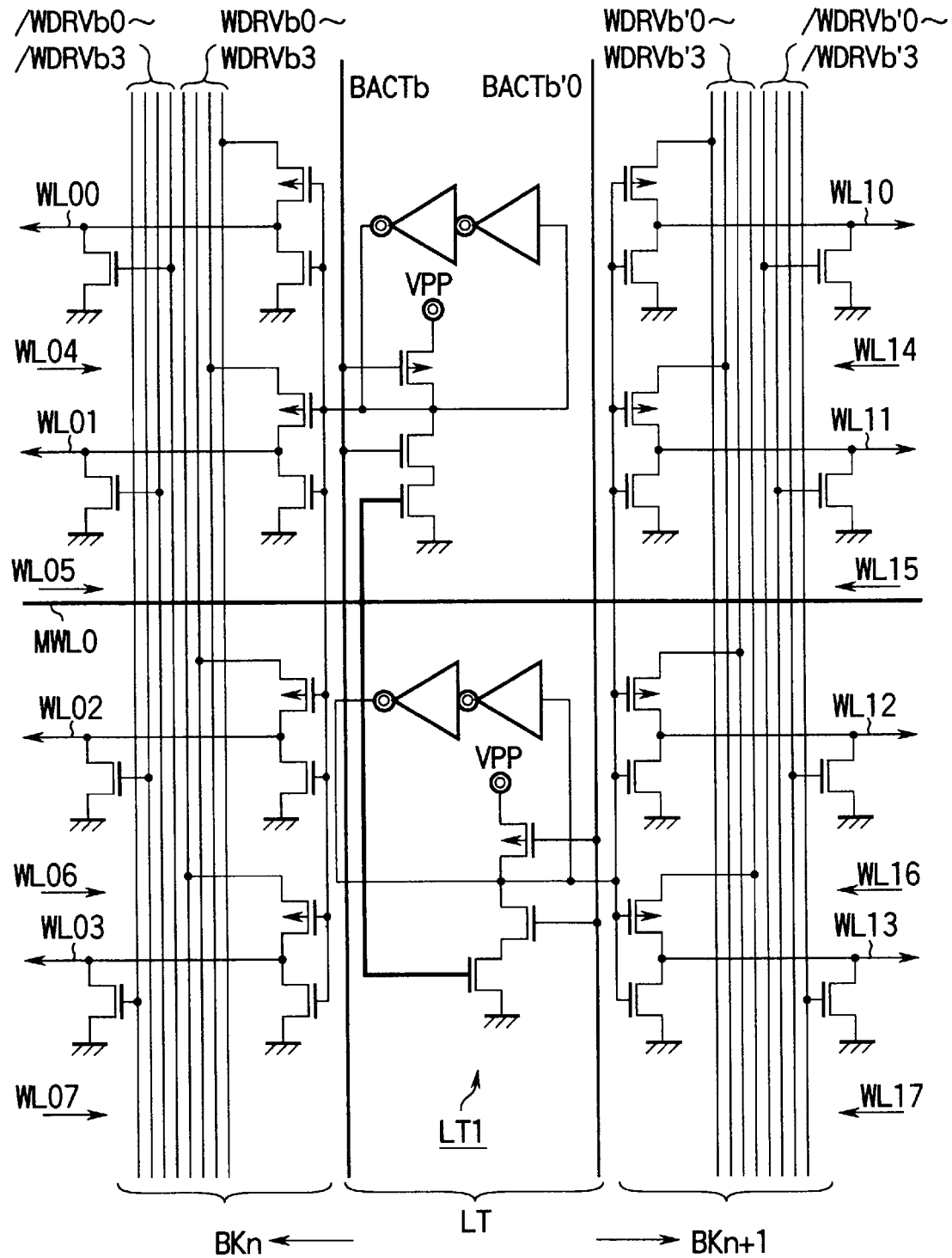
FIG. 41 is a circuit diagram of a word line drive circuit and a latch circuit between banks.
Figure 42:
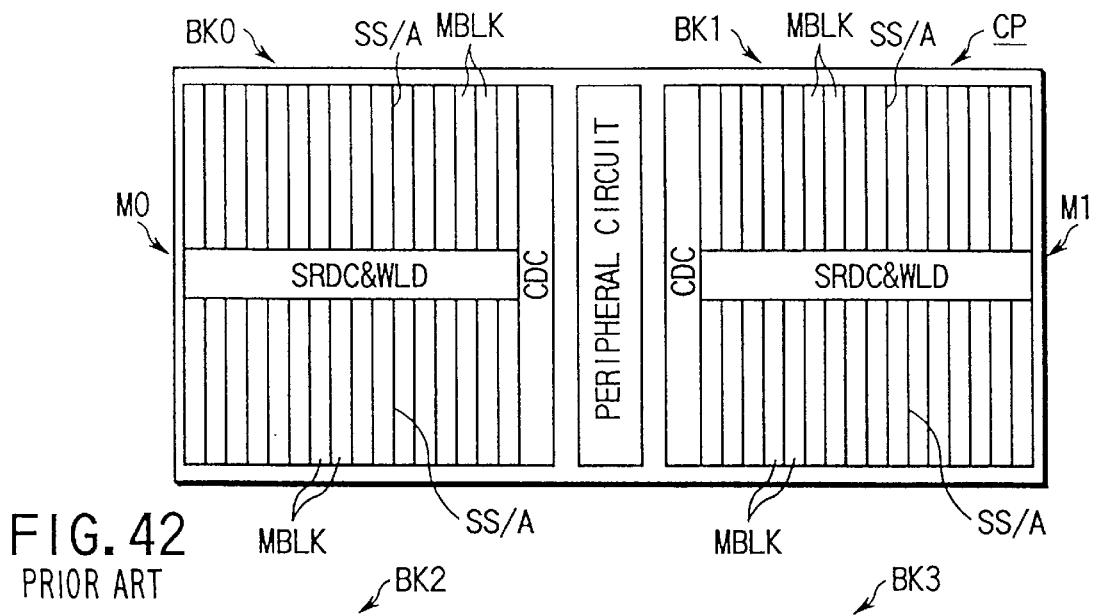
FIG. 42 is a schematic plan view of the bank structure of a conventional synchronous DRAM.
Figure 43:
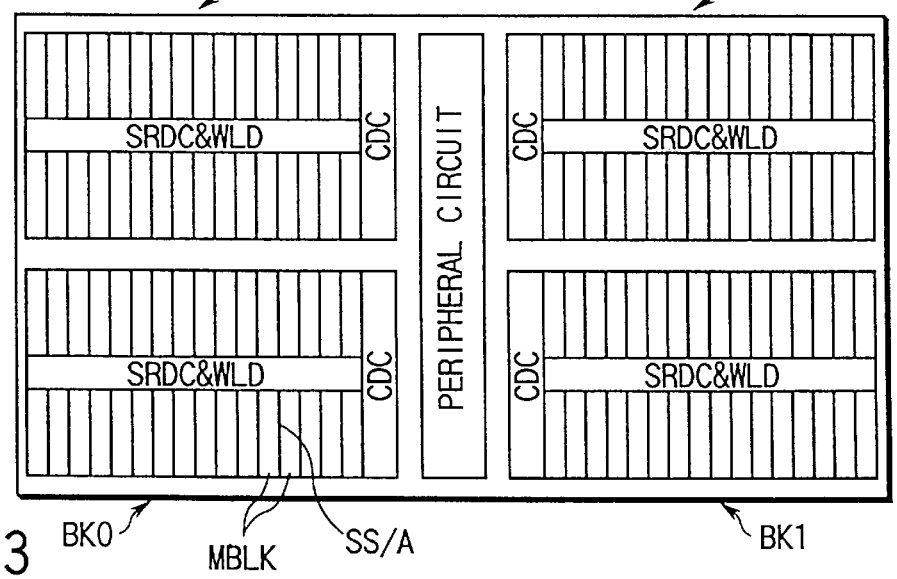
FIG. 43 is a schematic plan view of the bank structure of a synchronous DRAM related to the present invention.
Figure 45:
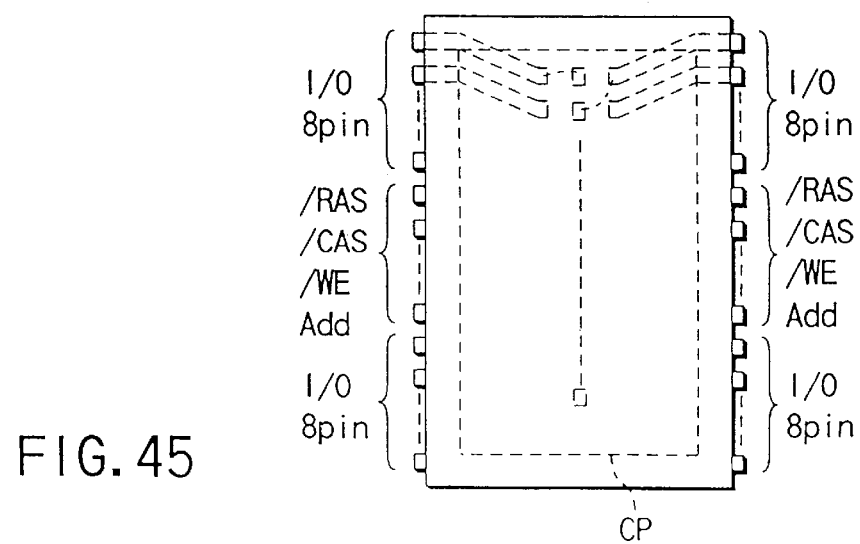
FIG. 45 is a plan view of a package applied to the synchronous DRAM of FIG. 44 with the layout of pins.

FIG. 41 shows a word line drive circuit WLD and a latch circuit LT provided between adjacent banks. Each of these circuits has the same as those of FIG. 6.

The second embodiment produces the same effect as that of the first embodiment.

Furthermore, with the second embodiment, a double end word line structure enables effective use of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A dynamic semiconductor memory device comprising:
   cell arrays, each cell array having banks, said cell arrays being arranged in a semiconductor chip in a direction in which said banks are arranged;
   decoder sections which are provided between said cell arrays, shared by said banks, and output pulse-like select signals for selecting a word line in each of said banks according to a row address;
   latch circuits which are provided between said banks and latch the select signals from said decoder sections according to a bank activate signal for activating each bank; and
   word line drive circuits which are provided between said banks and drive word lines in each bank according to the select signals latched in said latch circuits.

2. A dynamic semiconductor memory device according to claim 1, further comprising:
   main word lines which cross said banks in each of said cell arrays, transfer the select signals outputted from said decoder sections, and are connected to said latch circuits, respectively.

3. A dynamic semiconductor memory device according to claim 1, wherein each of said banks comprises:
   memory blocks arranged in a direction perpendicular to the direction in which said banks are arranged, each memory block including bit lines, word lines provided at right angles with the bit lines, and memory cells provided at the intersections of the bit lines and the word lines;
   sense amplifiers which are provided between adjacent memory blocks, shared by the adjacent memory blocks and sense signals read from said memory blocks;
   transistor pairs which connect bit line pairs of said memory blocks to said sense amplifiers;
   an equalize circuit for equalizing a potential of said bit line pairs; and
   a column decoder which is provided at one end of said banks and selects said bit lines.

4. A dynamic semiconductor memory device according to claim 3, further comprising:
   a bank activate signal generator circuit which is provided at one end of said banks in the direction in which said memory blocks are arranged and which generates the bank activate signal according to the row address; and
   a wire which is provided at right angles with a main word line carrying the select signal, transfers the bank activate signal, and crosses the individual memory blocks in each bank.

5. A dynamic semiconductor memory device according to claim 3, wherein said decoder section includes more than one row decoder for generating the select signal, each of said row decoders being provided for each memory block in each of said banks.

6. A dynamic semiconductor memory device according to claim 5, further comprising a decoder area provided adjacent to each of said row decoders in said decoder sections, said decoder area including:
   a word line drive signal generator circuit which generates a pulse-like word line drive signal for driving a word line according to a first address signal;
   a sense amplifier enable signal generator circuit generates a pulse-like sense amplifier enable signal for activating a sense amplifier according to a second address signal; and
   an equalize signal generator circuit which generates a pulse-like equalize signal for activating said equalize circuit according to a third address signal.

7. A dynamic semiconductor memory device according to claim 6, further comprising:
   a first wire which crosses banks in each of said cell arrays and transfers a word line drive signal generated by said word line drive signal generator circuit;
   a second wire which crosses banks in each of said cell arrays and transfers the sense enable signal generated by said sense amplifier enable signal generator circuit; and
   a third wire which crosses banks in each of said cell arrays and transfers the pulse-like equalize signal generated by said equalize signal generator circuit.

8. A dynamic semiconductor memory device according to claim 7, further comprising:

a signal generation area provided adjacent to each of said sense amplifiers;

a first latch circuit which is provided in said signal generation area and latches the word line drive signal transferred through said first wire;

a second latch circuit which is provided in said signal generation area and latches the sense enable signal transferred through said second wire;

a third latch circuit which is provided in said signal generation area and latches the pulse-like equalize signal transferred through said third wire;

a word line drive voltage generator circuit which is provided in said signal generation area and generates a drive voltage for said word line according to the word line drive signal latched in said first latch circuit;

a sense amplifier drive circuit which is provided in said signal generation area and drives said sense amplifier according to the sense amplifier enable signal latched in said second latch circuit; and a timing signal generator circuit which is provided in said signal generation area and generates an equalize signal for activating said equalize circuit and a timing signal for controlling a transistor pair according to the pulse-like equalize signal latched in said third latch circuit.

9. A dynamic semiconductor memory device comprising:

cell arrays, each cell array having banks, said cell arrays being arranged in a semiconductor chip in a direction in which said banks are arranged, and each bank having memory blocks in a direction perpendicular to the direction in which said banks are arranged;

decoder sections which are provided between said cell arrays and shared by said banks, said decoder sections having row decoders for outputting pulse-like select signals to select a word line in each of said banks according to a row address;

word line drive signal generator circuits which are provided in said decoder sections and generate pulse-like drive signals to drive said word lines;

first wires which cross individual banks in each of said cell arrays and transfer the select signals;

second wires which cross the individual banks in each of said cell arrays and transfer the drive signals;

word line drive circuits which are provided between said banks and drive the word lines in each of said memory blocks;

first latch circuits which are provided between said banks, latch the select signals transferred through said first wires according to bank activate signals to activate each bank, and activate said word line drive circuits according to the latched select signals;

second latch circuits which are provided between said banks and latch the drive signals transferred through said second wires according to the bank activate signals to activate each bank; and word line drive voltage generator circuits which are provided between said banks and connected to said word line drive circuits and generate a drive voltage to drive said word lines according to the drive signals latched in said second latch circuits and supply the drive voltage to said word line drive circuits.

10. A dynamic semiconductor memory device according to claim 9, wherein each of said banks comprises:

said memory blocks each including bit lines, word lines provided at right angles with the bit lines, and memory cells provided at the intersections of the bit lines and the word lines;

sense amplifiers which are provided between adjacent memory blocks, shared by the adjacent memory blocks and sense signals read from said memory blocks;

transistor pairs which connect bit line pairs of said memory blocks to said sense amplifiers;

an equalize circuit for equalizing a potential of said bit line pairs; and a column decoder which is provided at one end of said banks and selects said bit lines.

11. A dynamic semiconductor memory device according to claim 9, further comprising;

a bank activate signal generator circuit which is provided at one end of said banks in the direction in which said memory blocks are arranged and which generates the bank activate signal according to the row address; and a third wire which is provided at right angles with said first wire and transfers the bank activate signal.

12. A dynamic semiconductor memory device according to claim 10, further comprising a decoder area provided adjacent to each of said row decoders in said decoder sections, said decoder area including:

a sense amplifier enable signal generator circuit which generates a pulse-like sense amplifier enable signal for activating a sense amplifier according to a first address signal; and an equalize signal generator circuit which generates a pulse-like equalize signal for activating said equalize circuit according to a second address signal.

13. A dynamic semiconductor memory device according to claim 12, further comprising:

a third wire which crosses banks in each of said cell arrays and transfers the sense amplifier enable signal generated by said sense amplifier enable signal generator circuit; and a fourth wire which crosses banks in each of said cell arrays and transfers the pulse-like equalize signal generated by said equalize signal generator circuit.

14. A dynamic semiconductor memory device according to claim 13, further comprising:

a signal generation area provided adjacent to each of said sense amplifiers;

a third latch circuit which is provided in said signal generation area and latches the sense enable signal transferred through said third wire;

a fourth latch circuit which is provided in said signal generation area and latches and the pulse-like equalize signal transferred through said fourth wire;

a sense amplifier drive circuit which is provided in said signal generation area and drives said sense amplifier according to the sense amplifier enable signal latched in said third latch circuit; and a timing signal generator circuit which is provided in said signal generation area and generates an equalize signal for activating said equalize circuit and a timing signal for controlling a transistor pair according to the pulse-like equalize signal latched in said fourth latch circuit.

15. A dynamic semiconductor memory device comprising:

cell arrays, each cell array having banks, and arranged in a semiconductor chip in a direction in which said banks are arranged;

memory blocks which are provided in each of said banks and arranged in a direction perpendicular to the direction in which said banks are arranged;

sense amplifiers, which are provided between adjacent memory blocks in each of said banks and are shared by the adjacent memory blocks, that sense signals read from said memory blocks;

decoder sections, which are provided between said cell arrays and shared by said banks, that output pulse-like select signals for activating said sense amplifiers according to a row address;

latch circuits which are provided between said banks and latch the select signals outputted from said row decoders according to a bank activate signal for activating each bank; and activate circuits which are provided between said banks and activate each of said sense amplifiers according to the select signals latched in said latch circuits.

16. A dynamic semiconductor memory device according to claim 15, further comprising:

a wire which crosses banks in each of said cell arrays, transfers the select signals outputted from said decoder sections, and is connected to said latch circuits.

17. A dynamic semiconductor memory device according to claim 15, wherein said decoder section has sense amplifier decoders for generating the select signals, said sense amplifier decoders corresponding to individual memory blocks in each of said banks.

18. A dynamic semiconductor memory device according to claim 15, further comprising:

a redundancy array which is provided in each of said banks and remedies defective rows in each memory block;

a memory circuit for storing addresses for defective rows:

an address comparison circuit which compares the row address with an address of a defective row stored in said memory circuit and, when they coincide, outputs a coincidence signal; and a circuit which, when said address comparison circuit outputs the coincidence signal, enables said redundancy cell array to be selected and deactivates the bank activate signal to inhibit to inhibit a memory block with the defective row from being selected.

19. A dynamic semiconductor memory device according to claim 18, wherein each of said memory blocks in each of said banks is divided into a first and a second submemory block in the direction in which said banks are arranged and a latch circuit and word line drive circuits are provided between the first and second submemory blocks.

20. A dynamic semiconductor memory device according to claim 19, wherein said word line drive circuits are provided on both sides of each memory block in the direction in which said banks are arranged.

21. A dynamic semiconductor memory device comprising:

cell arrays, each cell array having banks, and arranged in a semiconductor chip in a direction in which said banks are arranged;

memory blocks which are provided in each of said banks and arranged in a direction perpendicular to the direction in which said banks are arranged;

sense amplifiers, which are provided between adjacent memory blocks and are shared by the adjacent memory blocks, that sense signals read from said memory blocks;

transistor pairs for connecting said sense amplifiers to bit line pairs of said memory blocks;

equalize circuits for equalizing a potential of said bit line pairs;

decoder sections, which are provided between said cell arrays and shared by said banks, that output pulse-like select signals for activating said transistor pairs and said equalize circuits according to a row address;

latch circuits which are provided between said banks and latch the select signals outputted from said row decoders according to a bank activate signal for activating each bank; and drive circuits which are provided between said banks and drive said transistor pairs and said equalize circuits according to the select signals latched in said latch circuits.

22. A dynamic semiconductor memory device according to claim 21, further comprising:

a bank activate signal generator circuit which is provided at one end of said banks in the direction in which said memory blocks are arranged and generates the bank activate signal according to the row address;

a first wire which crosses individual banks in each of said cell arrays and transfers the select signals; and a second wire which is provided a right angles with said first wire, transfers the bank activate signal, and crosses individual memory blocks in each bank.

23. A dynamic semiconductor memory device according to claim 21, further comprising:

a redundancy array which is provided in each of said banks and remedies defective rows in each memory block;

a memory circuit for storing addresses for defective rows;

an address comparison circuit which compares the row address with an address of a defective row stored in said memory circuit and, when they coincide, outputs a coincidence signal; and a circuit which, when said address comparison circuit outputs the coincidence signal, enables said redundancy cell array to be selected and deactivates the bank activate signal to inhibit a memory block with the defective row from being selected.

24. A dynamic semiconductor memory device according to claim 21, wherein a drive signal outputted from a drive circuit is supplied to an equalize circuit in a memory block and said transistor pairs of said memory blocks on both sides of said memory block.

25. A dynamic semiconductor memory device according to claim 21, wherein each of said memory blocks in each of said banks is divided into a first and a second submemory block in the direction in which said banks are arranged and a latch circuit and word line drive circuits are provided between the first and second submemory blocks.

26. A dynamic semiconductor memory device according to claim 25, wherein said word line drive circuits are provided on both sides of each memory block in the direction in which said banks are arranged.

* * * * *